US008742421B2

(12) United States Patent
Yamazaki et al.

(10) Patent No.: US 8,742,421 B2
(45) Date of Patent: Jun. 3, 2014

(54) DISPLAY DEVICE, METHOD FOR MANUFACTURING THE SAME, AND TELEVISION APPARATUS

(75) Inventors: Shunpei Yamazaki, Tokyo (JP); Hideaki Kuwabara, Kanagawa (JP); Shinji Maekawa, Shizuoka (JP); Gen Fujii, Kanagawa (JP); Toshiyuki Isa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 345 days.

(21) Appl. No.: 10/578,001

(22) PCT Filed: Nov. 29, 2004

(86) PCT No.: PCT/JP2004/018073
§ 371 (c)(1),
(2), (4) Date: May 3, 2006

(87) PCT Pub. No.: WO2005/055178
PCT Pub. Date: Jun. 16, 2005

(65) Prior Publication Data
US 2007/0085938 A1  Apr. 19, 2007

(30) Foreign Application Priority Data

Dec. 2, 2003  (JP) .................. 2003-403849
Dec. 2, 2003  (JP) .................. 2003-403850

(51) Int. Cl.
*H01L 27/14* (2006.01)
(52) U.S. Cl.
USPC ............ 257/72; 257/59; 257/347; 257/E27.1; 257/E29.137; 257/E29.202; 257/E29.273; 349/43
(58) Field of Classification Search
USPC ........... 257/347, E29.117, E27.117, E29.137, 257/E29.273, E29.202, E29.145, E29.147, 257/E31.095, E31.096, E33.061, 72, 59, 257/E27.1, E27.116; 438/149; 349/43
See application file for complete search history.

(56) References Cited

U.S. PATENT DOCUMENTS 4,389,481 A * 6/1983 Poleshuk et al. .............. 438/160
4,600,933 A * 7/1986 Richman ....................... 257/391
(Continued)

FOREIGN PATENT DOCUMENTS

EP  1 180 716 A2  2/2002
JP  03-085530  4/1991
(Continued)

OTHER PUBLICATIONS

International Search Report for PCT/JP2004/018073 dated Apr. 5, 2005.

(Continued)

*Primary Examiner* — Timor Karimy
(74) *Attorney, Agent, or Firm* — Nixon Peabody LLP; Jeffrey L. Costellia

(57) ABSTRACT

An object of the present invention is to provide a display device which can be manufactured with usability of a material improved and with a manufacturing step simplified and to provide a manufacturing technique thereof. One feature of a display device of the present invention is to comprise an insulating layer having an opening, a first conductive layer formed in the opening, and a second conductive layer formed over the insulating layer and the first conductive layer, wherein the first conductive layer is wider and thicker than the second conductive layer, and the second conductive layer is formed by spraying a droplet including a conductive material.

24 Claims, 55 Drawing Sheets

(56) References Cited

U.S. PATENT DOCUMENTS

| | | | |
|---|---|---|---|
| 5,142,343 A * | 8/1992 | Hosokawa et al. | 257/103 |
| 5,329,390 A * | 7/1994 | Fujiwara et al. | 349/27 |
| 6,046,547 A * | 4/2000 | Nishio et al. | 315/169.3 |
| 6,156,620 A * | 12/2000 | Puchner et al. | 438/400 |
| 6,211,067 B1 * | 4/2001 | Chen | 438/633 |
| 6,365,917 B1 * | 4/2002 | Yamazaki | 257/72 |
| 6,461,914 B1 * | 10/2002 | Roberts et al. | 438/253 |
| 6,587,165 B2 | 7/2003 | Hashimoto et al. | |
| 6,787,407 B2 | 9/2004 | Nakamura et al. | |
| 6,821,827 B2 | 11/2004 | Nakamura et al. | |
| 6,908,796 B2 | 6/2005 | Furusawa | |
| 7,176,069 B2 | 2/2007 | Yamazaki et al. | |
| 7,192,865 B1 | 3/2007 | Ohtani et al. | |
| 7,202,497 B2 | 4/2007 | Ohtani et al. | |
| 2001/0013913 A1 * | 8/2001 | Young | 349/113 |
| 2001/0014528 A1 * | 8/2001 | Tsai | 438/637 |
| 2001/0034088 A1 * | 10/2001 | Nakamura et al. | 438/166 |
| 2002/0030189 A1 * | 3/2002 | Ishikawa | 257/59 |
| 2002/0089616 A1 * | 7/2002 | Hashimoto et al. | 349/44 |
| 2002/0132396 A1 * | 9/2002 | Yamazaki et al. | 438/149 |
| 2003/0141565 A1 * | 7/2003 | Hirose et al. | 257/458 |
| 2003/0143794 A1 | 7/2003 | Nakamura et al. | |
| 2003/0219934 A1 | 11/2003 | Furusawa | |
| 2004/0126914 A1 | 7/2004 | Chang et al. | |
| 2005/0054181 A1 | 3/2005 | Nakamura et al. | |
| 2007/0040971 A1 | 2/2007 | Maekawa et al. | |
| 2007/0082443 A1 | 4/2007 | Yamazaki et al. | |
| 2007/0096096 A1 | 5/2007 | Kuwabara et al. | |
| 2007/0132377 A1 | 6/2007 | Yamazaki et al. | |

FOREIGN PATENT DOCUMENTS

| | | |
|---|---|---|
| JP | 04-319919 | 11/1992 |
| JP | 06-163584 | 6/1994 |
| JP | 07-333648 | 12/1995 |
| JP | 10-209463 | 8/1998 |
| JP | 11-251259 | 9/1999 |
| JP | 2001-250777 | 9/2001 |
| JP | 2002-57341 | 2/2002 |
| JP | 2003-318192 | 11/2003 |
| JP | 2003-318401 | 11/2003 |
| TW | 559896 | 11/2003 |
| WO | WO 01/48797 A1 | 7/2001 |

OTHER PUBLICATIONS

Written Opinion of the International Searching Authority for PCT/JP2004/018073.

Taiwanese Office Action (Application No. 93136905;TW07538/7539) Dated Jun. 16, 2011.

* cited by examiner

DISPLAY DEVICE, METHOD FOR MANUFACTURING THE SAME, AND TELEVISION APPARATUS

TECHNICAL FIELD

The present invention relates to a display device employing a droplet discharge method and to a manufacturing method thereof.

BACKGROUND ART

A thin film transistor (hereinafter, referred to as a "TFT") and an electronic circuit using the thin film transistor are manufactured by laminating various thin films of a semiconductor, an insulating material, a conductive material, and the like over a substrate and then appropriately forming a predetermined pattern with a photolithography technique. The photolithography technique means a technique of transferring a pattern of a circuit or the like formed over a surface of a transparent flat plane referred to as a photomask by using a material which does not transmit light onto a targeted substrate by utilizing light, and the technique has been widely used in a manufacturing step of a semiconductor integrated circuit or the like.

In a manufacturing step employing a conventional photolithography technique, it is necessary to perform a multiple steps including light exposure, developing, baking, peeling-off, and the like only for treating a mask pattern which is formed by using a photosensitive organic resin material referred to as a photoresist. Therefore, as the number of times of the photolithography steps is increased more, a manufacturing cost is inevitably increased more. In order to improve such problems as described above, it has been tried to manufacture the TFT by reducing the number of the photolithography steps (for example, Reference 1: Japanese Patent Laid-Open No. H11-251259).

However, in the technique disclosed in Reference 1, only some the photolithography steps which are carried out plural times in a TFT manufacturing step are replaced by a printing method and no contribution is made to a drastic reduction in the number of steps. Further, a light exposing apparatus to be used for transferring the mask pattern in the photolithography technique transfers a pattern of from several micrometers to 1 micrometer or less by equivalent projection light exposure or reduction projection light exposure. It is theoretically difficult for the light exposing apparatus to expose a large area substrate having a side of more than 1 meter to light all at once from a technical standpoint.

DISCLOSURE OF INVENTION

It is an object of the present invention to provide a technique in which, in a manufacturing step of a TFT, an electronic circuit using the TFT, or a display device formed by using the TFT, the manufacturing step is simplified by reducing the number of times of the photolithography step or by eliminating the photolithography step itself, and manufacturing can be executed on a large area substrate having a side of more than 1 meter with a higher yield at lower cost.

The following measures are taken in the present invention to solve the problems of the above-mentioned related art.

One feature of the present invention is that at least one or more of patterns required to manufacture a display panel, such as a wiring layer, a conductive layer for forming an electrode, and a mask layer for forming a predetermined pattern is/are formed by a method capable of selectively forming a pattern, and then, a display device is manufactured. A droplet discharge method (also referred to as an ink-jet method, depending on its mode) that can form a conductive layer, an insulating layer, or the like into a predetermined pattern by selectively discharging a droplet of a composition mixed for a particular purpose is employed as the method capable of selectively forming a pattern. In addition, a method capable of transferring or drawing a pattern, for example, a printing method (a method for forming a pattern, such as screen printing or offset printing) or the like can also be employed.

The present invention is a display device (light emitting display device, liquid crystal display device) in which a display element that is a light emitting element having, between electrodes, a medium including an organic material or a mixture of an organic material and an inorganic material that causes luminescence referred to as electroluminescence (hereinafter, also referred to as "EL") or that is a liquid crystal element having a liquid crystal material is connected to a TFT, and such a display device is manufactured by using a droplet discharge method.

According to the present invention, a means of improving adhesion (base pretreatment) is taken for a region to be provided with a pattern in forming the pattern by a droplet discharge method, thereby improving reliability of a display device.

Another feature of the present invention is that a display device, such as a wiring, a semiconductor film, an insulating film, or a mask is formed by utilizing a substance having an effect of improving adhesion. When a predetermined pattern is formed by discharging a droplet including a predetermined composition from a fine pore in this step, a substance made of a refractory metal is formed as base pretreatment to improve adhesion of the pattern. Specifically, a wiring material mixed into a solvent (including a wiring material (conductive material) dissolved or dispersed in a solvent) is formed over a conductive layer made of a refractory metal or at opposite ends thereof by an application method or the like, thereby forming a wiring. For example, a conductive material mixed into a solvent is discharged onto a conductive layer made of a refractory metal or a 3d transition metal by a droplet discharge method. The conductive material mixed into a solvent may be formed over the conductive layer made of a refractory metal by a spin coating method, a dipping method, another application method, or a printing method (a method for forming a pattern, such as screen printing or offset printing) in addition to a droplet discharge method.

Titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like can be used as a substance used for base pretreatment.

The substance can be formed by a dip coating method of a sol-gel method, a spin coating method, a droplet discharge method, an ion plating method, an ion beam method, a CVD method, a sputtering method, an RF magnetron sputtering method, a plasma spray method, or an anodic oxidation method. In addition, the substance does not need to have continuity as a film, depending on its formation method.

A material such as Ti (titanium), W (tungsten), Cr (chromium), Al (aluminum), Ta (tantalum), Ni (nickel), Zr (zirconium), Hf (hafnium), V (vanadium), Ir (iridium), Nb (niobium), Pd (lead), Pt (platinum), Mo (molybdenum), Co (cobalt), Rh (rhodium), Sc (scandium), Mn (manganese), Fe (iron), Cu (copper), or Zn (zinc), or oxide, nitride, or oxynitride thereof can be used as the refractory metal or the 3d transition element. The conductive layer is formed by a known method such as a sputtering method, a vapor deposition method, an ion implantation method, a CVD method, a dipping method, or a spin coating method, and preferably, it is formed by a sputtering method, a dipping method, or a spin coating method. In the case where the conductive layer is to be insulated later, it is simple and preferable to form the conductive layer to have a thickness of from 0.01 nm to 10 nm and to be insulated by natural oxidation.

Alternatively, a method for performing plasma treatment on a formation region (formation face) is employed as another method. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1\times10^{10}$ m$^{-3}$ to $1\times10^{14}$ m$^{-3}$, so-called corona discharge or glow discharge. Surface modification can be performed without material dependence by employing plasma treatment using air, oxygen, or nitrogen as a treatment gas. Accordingly, surface modification can be performed on any material.

As another alternative method, a substance of an organic material functioning as an adhesive may be formed to improve adhesion of a pattern to be formed by a droplet discharge method with a formation region thereof. A film made of one or a plurality of photosensitive or non-photosensitive organic materials (organic resin materials) (polyimide, acrylic, polyamide, polyimideamide, a resist, benzocyclobutene, and the like), Low k materials having a low dielectric constant, and the like, or a laminate thereof can be used as the material. In addition, a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used. A droplet discharge method or a printing method (a method for forming a pattern, such as screen printing or offset printing) can be employed as a manufacturing method. A TOF film, an SOG film, or the like obtained by an application method can be used.

The above step performed for improvement in adhesion or surface modification as base pretreatment on a region of the conductive material formed by using a droplet discharge method may be performed also in the case where a conductive material is further formed over the pattern formed by using a droplet discharge method. In addition, ultraviolet ray irradiation treatment may be performed as a base treatment after a first conductive layer is formed by a droplet discharge method; then, a second conductive layer may be formed over the irradiated region by a droplet discharge method. For example, a wide pattern may be formed using a discharge opening with a large diameter; thereafter, a narrow pattern may be formed using a discharge opening with a small diameter to partially overlap the wide pattern. Thus, a minute pattern can be formed.

As for the composition to be discharged from the discharging opening by a droplet discharge method to form a conductive material (conductive layer), a conductive material dissolved or dispersed in a solvent is used. The conductive material corresponds to a fine particle or a dispersant nanoparticle of a metal such as Ag, Au, Cu, Ni, Pt, Pd, Ir, Rh, W, or Al, sulfide of a metal such as Cd or Zn, oxide of Fe, Ti, Si, Ge, Zr, Ba, or the like, or silver halide. In addition, a mixture of the metal and a compound may be used as the conductive material. In addition, it corresponds to indium tin oxide (ITO), ITSO made of indium tin oxide and silicon oxide, organic indium, organic tin, zinc oxide, titanium nitride, or the like which is used as a transparent conductive film. However, as for the composition to be discharged from the discharging opening, it is preferable to use any material selected from gold, silver, and copper, which is dissolved or dispersed in a solvent, taking a specific resistance value into consideration. It is more preferable to use silver or copper having a low resistance value. When silver or copper is used, a barrier film may be additionally provided as a measure for an impurity. A silicon nitride film or nickel boron (NiB) can be used as the barrier film.

In addition, a particle in which a conductive material is coated with other conductive materials to be a plurality of layers may be used. For example, a three-layer structure particle in which copper is coated with nickel boron (NiB) and then coated with silver may be used. As for such solvents, esters such as butyl acetate and ethyl acetate; alcohols such as isopropyl alcohol and ethyl alcohol; organic solvents such as methyl ethyl ketone and acetone; or the like may be used. The viscosity of the composition is preferably 20 mPa·s (cps) or less. This is because the composition can be prevented from drying or the composition can be smoothly discharged from the discharging opening. The surface tension of the composition is preferably 40 mN/m or less. However, the viscosity of the composition and the like may be appropriately adjusted in accordance with a solvent to be used and intended use. For example, the viscosity of a composition in which ITO, organic indium, or organic tin is dissolved or dispersed in the solvent may be from 5 mPa·s to 20 mPa·s, the viscosity of a composition in which silver is dissolved or dispersed in the solvent may be from 5 mPa·s to 20 mPa·s, and the viscosity of a composition in which gold is dissolved or dispersed in the solvent may be from 5 mPa·s to 20 mPa·s.

In the present invention, a conductive layer formed to have a relatively broad line width (also referred to as a bus line), such as a gate line, a source line, or another lead wiring among conductive layers included in a display device is formed by a droplet discharge method to fill in an opening in an insulating layer. On the other hand, a conductive layer having a relatively narrow line width such as a gate electrode, a source-drain electrode, or another wiring in a pixel portion is formed by directly drawing with a droplet discharge method. According to the present invention, a line width of a gate wiring ranges from 10 μm to 40 μm, a line width of a gate electrode ranges from 5 μm to 20 μm, and a wiring in which the line width of the gate wiring is about twice that of the gate electrode can be formed. The present invention can satisfy both requirements for a wiring to have lower resistance to efficiently pass a large current at a high speed and for an electrode to have a minuter pattern without disconnection. The wide wiring formed to fill in an opening in the insulating layer and a minute conductive layer may be separately formed through different steps or may be simultaneously formed. The minute pattern may be formed earlier or may be formed later, depending on difference in a role required for each wiring and in a structure of a display device. There is no particular limitation on its order.

A thin film transistor of the present invention comprises an insulating layer having an opening, and a first conductive layer formed in the opening, a second conductive layer formed to be in contact with the insulating layer and the first conductive layer, wherein the first conductive layer is wider and thicker than the second conductive layer.

A thin film transistor of the present invention comprises an insulating layer having an opening, a first conductive layer formed in the opening, and a second conductive layer formed to be in contact with the insulating layer and the first conductive layer, wherein the first conductive layer is wider and thicker than the second conductive layer, and the second conductive layer is formed by spraying a droplet including a conductive material.

A display device of the present invention comprises an insulating layer having an opening, a first conductive layer formed in the opening, a second conductive layer formed to be in contact with the insulating layer and the first conductive layer, a semiconductor layer formed over the second conductive layer with a gate insulating film therebetween, a pair of third conductive layers formed over the semiconductor layer, a first electrode formed over either one of the third conductive layers, an electroluminescent layer formed over the first electrode, and a second electrode formed over the electroluminescent layer, wherein the first conductive layer is wider and thicker than the second conductive layer.

A display device of the present invention comprises an insulating layer having an opening, a first conductive layer formed in the opening, a second conductive layer formed to be in contact with the insulating layer and the first conductive layer, a semiconductor layer formed over the second conductive layer with a gate insulating film therebetween, a pair of third conductive layers formed over the semiconductor layer, a first electrode formed over either one of the third conductive layers, an electroluminescent layer formed over the first electrode, and a second electrode formed over the electroluminescent layer, wherein the first conductive layer is wider and thicker than the second conductive layer, and the second conductive layer is formed by spraying a droplet including a conductive material.

A display device of the present invention comprises an insulating layer having an opening, a first conductive layer formed in the opening, a second conductive layer formed to be in contact with the insulating layer and the first conductive layer, a semiconductor layer formed over the second conductive layer with a gate insulating film therebetween, a pair of third conductive layers formed over the semiconductor layer, a first electrode formed over either one of the third conductive layers, a second insulating layer having an opening formed over the other third conductive layer, a fourth conductive layer formed in the opening, an electroluminescent layer formed over the first electrode, and a second electrode formed over the electroluminescent layer, wherein the first conductive layer is wider and thicker than the second conductive layer, and the fourth conductive layer is wider and thicker than the third conductive layer.

A display device of the present invention comprises an insulating layer having an opening, a first conductive layer formed in the opening, a second conductive layer formed to be in contact with the insulating layer and the first conductive layer, a semiconductor layer formed over the second conductive layer with a gate insulating film therebetween, a pair of third conductive layers formed over the semiconductor layer, a first electrode formed over either one of the third conductive layers, a second insulating layer having an opening formed over the other third conductive layer, a fourth conductive layer formed in the opening, an electroluminescent layer formed over the first electrode, and a second electrode formed over the electroluminescent layer, wherein the first conductive layer is wider and thicker than the second conductive layer, the fourth conductive layer is wider and thicker than the third conductive layer, and the second conductive layer and the third conductive layer are formed by spraying a droplet including a conductive material.

According to the present invention, a first conductive layer, a second conductive layer, a gate electrode, a source electrode, a drain electrode, a first electrode, and a second electrode can be formed by a droplet discharge method with a material for forming the above-described conductive material.

A display device of the present invention comprises an insulating layer having an opening, a first conductive layer formed in the opening, and a second conductive layer formed over the insulating layer and the first conductive layer, wherein the first conductive layer is wider and thicker than the second conductive layer.

A display device of the present invention comprises an insulating layer having an opening, a first conductive layer formed in the opening, and a second conductive layer formed over the insulating layer and the first conductive layer, wherein the first conductive layer is wider and thicker than the second conductive layer, and the second conductive layer is formed by spraying a droplet including a conductive material.

A display device of the present invention comprises an insulating layer having an opening, a first conductive layer formed in the opening, a second conductive layer formed to be in contact with the insulating layer and the first conductive layer, a semiconductor layer formed over the second conductive layer with a gate insulating film therebetween, a third conductive layer formed over the semiconductor layer, a second insulating layer having an opening formed over the third conductive layer, and a fourth conductive layer formed in the opening, wherein the first conductive layer is wider and thicker than the second conductive layer, and the fourth conductive layer is wider and thicker than the third conductive layer.

A display device of the present invention comprises an insulating layer having an opening, a first conductive layer formed in the opening, a second conductive layer formed to be in contact with the insulating layer and the first conductive layer, a semiconductor layer formed over the second conductive layer with a gate insulating film therebetween, a third conductive layer formed over the semiconductor layer, a second insulating layer having an opening formed over the third conductive layer, and a fourth conductive layer formed in the opening, wherein the first conductive layer is wider and thicker than the second conductive layer, the fourth conductive layer is wider and thicker than the third conductive layer, and the second conductive layer and the third conductive layer are formed by spraying a droplet including a conductive material.

In the above-described structure, a line width of the first conductive layer, the second conductive layer, a gate electrode, a source electrode, or a drain electrode is preferably from 5 µm to 100 µm. A pattern can be formed by discharging fluid of from 0.1 pl to 40 pl with a droplet discharging method.

In the above-described structure, the semiconductor layer may be a semi-amorphous semiconductor containing a hydrogen element and a halogen element and having a crystalline structure. It may be a non-single-crystal semiconductor containing a hydrogen element and a halogen element or a polycrystalline semiconductor containing a hydrogen element and a halogen element. A channel length of the semiconductor layer is preferably from 5 µm to 100 µm. A television apparatus including a display screen which is formed by using the display device having the above-described structure can be manufactured.

A method for manufacturing a display device of the present invention comprises the steps of forming an insulating layer having an opening, forming a first conductive layer in the opening, forming a second conductive layer to be in contact with the insulating layer and the first conductive layer by spraying a droplet including a conductive material, forming a semiconductor layer over the second conductive layer with a gate insulating film therebetween, forming a third conductive layer over the semiconductor layer by spraying a droplet including a conductive material, forming a first electrode over the third conductive layer, forming an electroluminescent layer over the first electrode, and forming a second electrode over the electroluminescent layer, wherein the first conductive layer is formed to be wider and thicker than the second conductive layer.

A method for manufacturing a display device of the present invention comprises the steps of forming an insulating layer having an opening, forming a first conductive layer in the opening, forming a second conductive layer to be in contact with the insulating layer and the first conductive layer by spraying a droplet including a conductive material, forming a semiconductor layer over the second conductive layer with a gate insulating film therebetween, forming a pair of third conductive layers over the semiconductor layer by spraying a droplet including a conductive material, forming a first electrode over either one of the third conductive layers, forming a second insulating layer and a fourth conductive layer over the other third conductive layer, forming an electroluminescent layer over the first electrode, and forming a second electrode over the electroluminescent layer, wherein the first conductive layer is formed to be wider and thicker than the second conductive layer.

A method for manufacturing a display device of the present invention comprises the steps of forming an insulating layer having an opening, forming a first conductive layer in the opening, forming a second conductive layer to be in contact with the insulating layer and the first conductive layer by spraying a droplet including a conductive material, forming a semiconductor layer over the second conductive layer with a gate insulating film therebetween, forming a third conductive layer over the semiconductor layer by spraying a droplet including a conductive material, forming a first electrode over the third conductive layer, forming an electroluminescent layer over the first electrode, and forming a second electrode over the electroluminescent layer, wherein the first conductive layer is formed to be wider and thicker than the second conductive layer.

A method for manufacturing a display device of the present invention comprises the steps of forming an insulating layer having an opening, forming a first conductive layer in the opening, forming a second conductive layer to be in contact with the insulating layer and the first conductive layer by spraying a droplet including a conductive material, forming a semiconductor layer over the second conductive layer with a gate insulating film therebetween, forming a pair of third conductive layers over the semiconductor layer by spraying a droplet including a conductive material, forming a first electrode over either one of the third conductive layers, forming a second insulating layer and a fourth conductive layer over the other conductive layer, forming an electroluminescent layer over the first electrode, and forming a second electrode over the electroluminescent layer, wherein the first conductive layer is formed to be wider and thicker than the second conductive layer.

The gate insulating film can prevent the gate electrode from oxidizing and can have a favorable interface with a semiconductor layer to be formed on an upper layer side of the gate insulating layer, when it is formed by sequentially laminating a first silicon nitride film, a silicon oxide film, and a second silicon nitride film.

According to the present invention, the gate electrode layer, the wiring layer, and the mask used in patterning are formed by a droplet discharge method as described above. However, its object is achieved by forming at least one or more of patterns required for manufacturing a display device with a method capable of selectively forming a pattern and then manufacturing a display device.

In addition, the first insulating layer and the second insulating layer may be made of an organic material, an inorganic material, or a material in which a skeletal structure is configured by a bond of silicon and oxygen. Since the organic material is superior in the planarity, the film thickness does not become extremely thin and disconnection does not occur in an uneven portion even when the conductive material is formed later; therefore, it is preferable. In addition, the organic material has a low dielectric constant. Accordingly, when the organic material is used as an interlayer insulating material of a plurality of wirings, wiring capacity is reduced. Then, a multilayer wiring can be formed, and higher performance and higher functionality can be obtained.

On the other hand, a siloxane polymer can be given as a typical example of the material in which a skeletal structure is configured by a bond of silicon and oxygen. Specifically, it is a material in which a skeletal structure is configured by a bond of silicon and oxygen and which contains at least hydrogen as a substituent or which contains at least one of fluorine, an alkyl group, and aromatic hydrocarbon as a substituent. The material is also superior in planarity and has transparency and heat resistance. An insulating material made of a siloxane polymer can be heat-treated at a temperature of approximately from 300° C. to 600° C. after formation.

According to the present invention, a pattern of a conductive layer can be separately formed depending on its line width. Therefore, among wirings included in a display device, both a wide wiring with low resistance and a minute wiring used for a pixel portion or the like can be formed to meet a function required depending on its role.

According to the present invention, patterning of a wiring layer and a mask can be directly performed by a droplet discharge method. Therefore, it is possible to obtain a TFT in which usability of a material is improved and a manufacturing step is simplified and a highly reliable display device therewith.

BEST MODE FOR CARRYING OUT THE INVENTION

Figure 1:
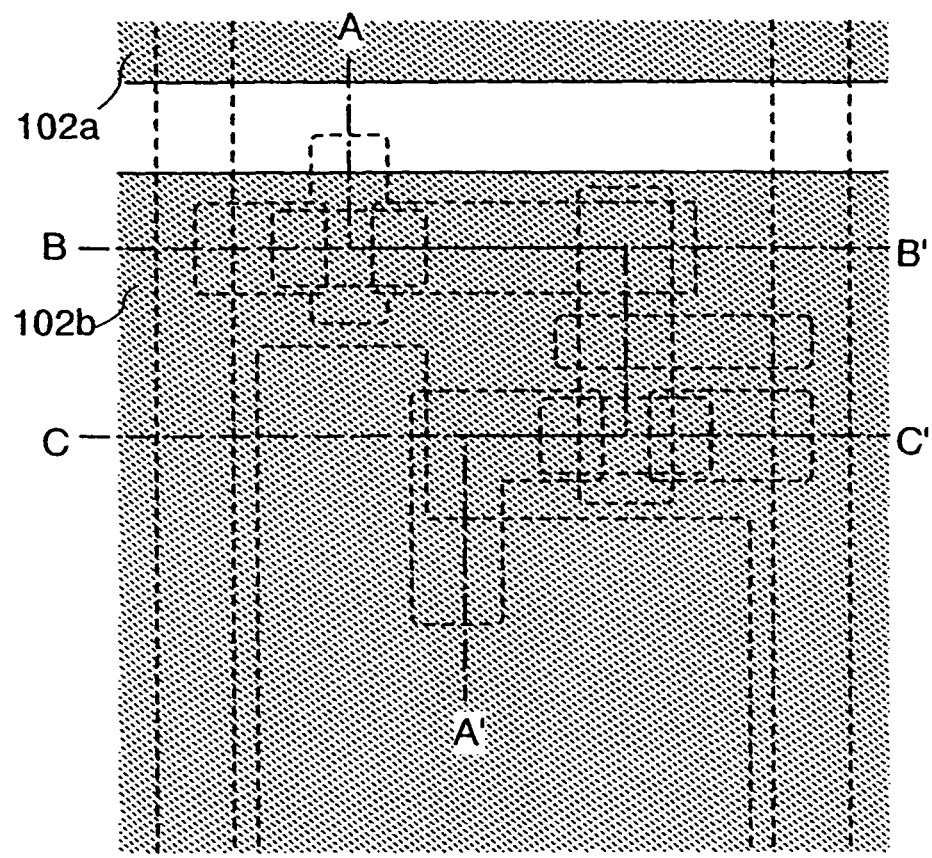
FIG. 1 shows a method for manufacturing a display device of the present invention.

Embodiment modes of the present invention are described in detail with reference to drawings. However, the present invention is not limited to the following description. As is easily known to a person skilled in the art, the mode and the detail of the invention can be variously changed without departing from the purpose and the scope of the present invention. Thus, the present invention is not interpreted while limiting to the following description of the embodiment mode. Note that the same reference numeral is given to the same portion or a portion having a similar function among different diagrams in a structure of the present invention to be described hereinafter, and repetitive description is omitted.

Figure 38:
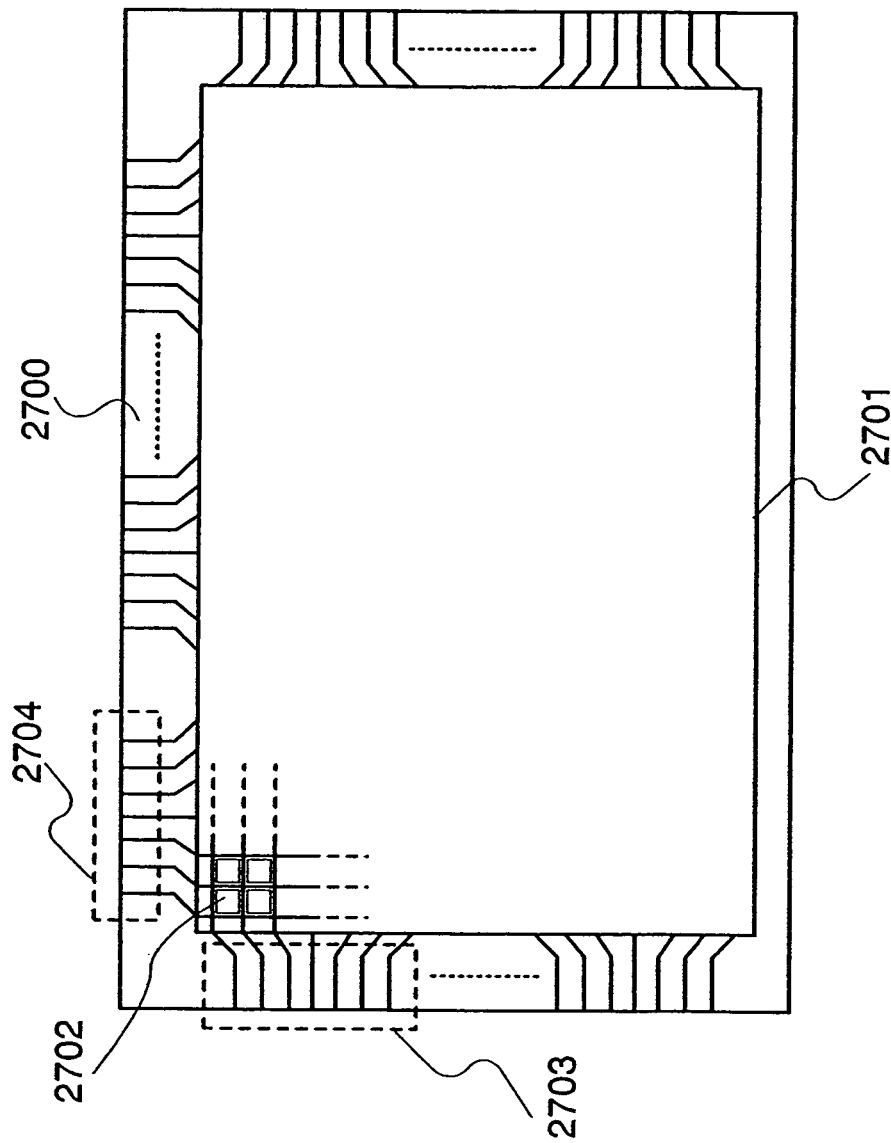
FIG. 38 is a top view of a display device of the present invention.

FIG. 38 is a top view showing a structure of a display panel according to the present invention. A pixel portion 2701 in which pixels 2702 are arranged in a matrix, a scanning line side input terminal 2703, and a signal line side input terminal 2704 are formed over a substrate 2700 having an insulating surface. The number of pixels may be determined in accordance with various standards. The number of pixels of XGA may be 1024×768×3 (RGB), that of UXGA may be 1600× 1200×3 (RGB), and that of a full-spec high vision may be 1920×1080×3 (RGB).

The pixels 2702 are arranged in a matrix by intersecting a scanning line extended from the scanning line side input terminal 2703 with a signal line extended from the signal line side input terminal 2704. Each pixel 2702 is provided with a switching element and a pixel electrode connected thereto. A typical example of the switching element is a TFT. A gate electrode side of a TFT is connected to the scanning line, and a source or drain side thereof is connected to the signal line; accordingly, each pixel can be controlled independently by a signal input from outside.

The TFT includes a semiconductor layer, a gate insulating layer, and a gate electrode layer as its main components. A wiring layer connected to a source-drain region formed in the semiconductor layer is also included. A top gate type in which a semiconductor layer, a gate insulating layer, and a gate electrode layer are arranged from the substrate side, a bottom gate type in which a gate electrode layer, a gate-insulating layer, and a semiconductor layer are arranged from the substrate side, and the like are known as a typical structure of a TFT. However, any one of the structures may be employed in the present invention.

An amorphous semiconductor (hereinafter also refereed to as an "AS") manufactured by a vapor phase growth method or a sputtering method using a semiconductor material gas typified by silane or germane; a polycrystalline semiconductor that is formed by crystallizing the amorphous semiconductor by utilizing light energy or thermal energy; a semi-amorphous (also referred to as microcrystal) semiconductor (hereinafter also referred to as a "SAS"); or the like can be used as a material for forming the semiconductor layer.

The SAS means a semiconductor having an intermediate structure between an amorphous structure and a crystalline structure (including a single crystal and a polycrystal) and having a third state which is stable in terms of free energy, and includes a crystalline region having short-range order and lattice distortion. A crystalline region of from 0.5 nm to 20 nm can be observed in at least a part of a region in the film. When silicon is contained as the main component, a Raman spectrum is shifted to a lower frequency side than 520 $cm^{-1}$. A diffraction peak of (111) or (220) to be caused by a crystal lattice of silicon is observed in X-ray diffraction. Hydrogen or halogen of at least 1 atomic % or more is contained as a neutralizer of a dangling bond. The SAS is formed by performing glow discharge decomposition (plasma CVD) on a silicide gas. $SiH_4$ is given as a typical silicide gas. In addition, $Si_2H_6$, $SiH_2Cl_2$, $SiHCl_3$, $SiCl_4$, $SiF_4$, or the like can also be used as the silicide gas. Further, $GeF_4$ may be mixed. This silicide gas may be diluted with $H_2$ or $H_2$ and one or more rare gas elements of He, Ar, Kr, and Ne. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature may be 300° C. or less. It is desirable that an atmospheric constituent impurity such as oxygen, nitrogen, or carbon is $1 \times 10^{20}$ atoms/$cm^3$ or less as an impurity element in the film; specifically, an oxygen concentration is $5 \times 10^{19}$ atoms/$cm^3$ or less, preferably $1 \times 10^{19}$ atoms/$cm^3$ or less.

Figure 27:
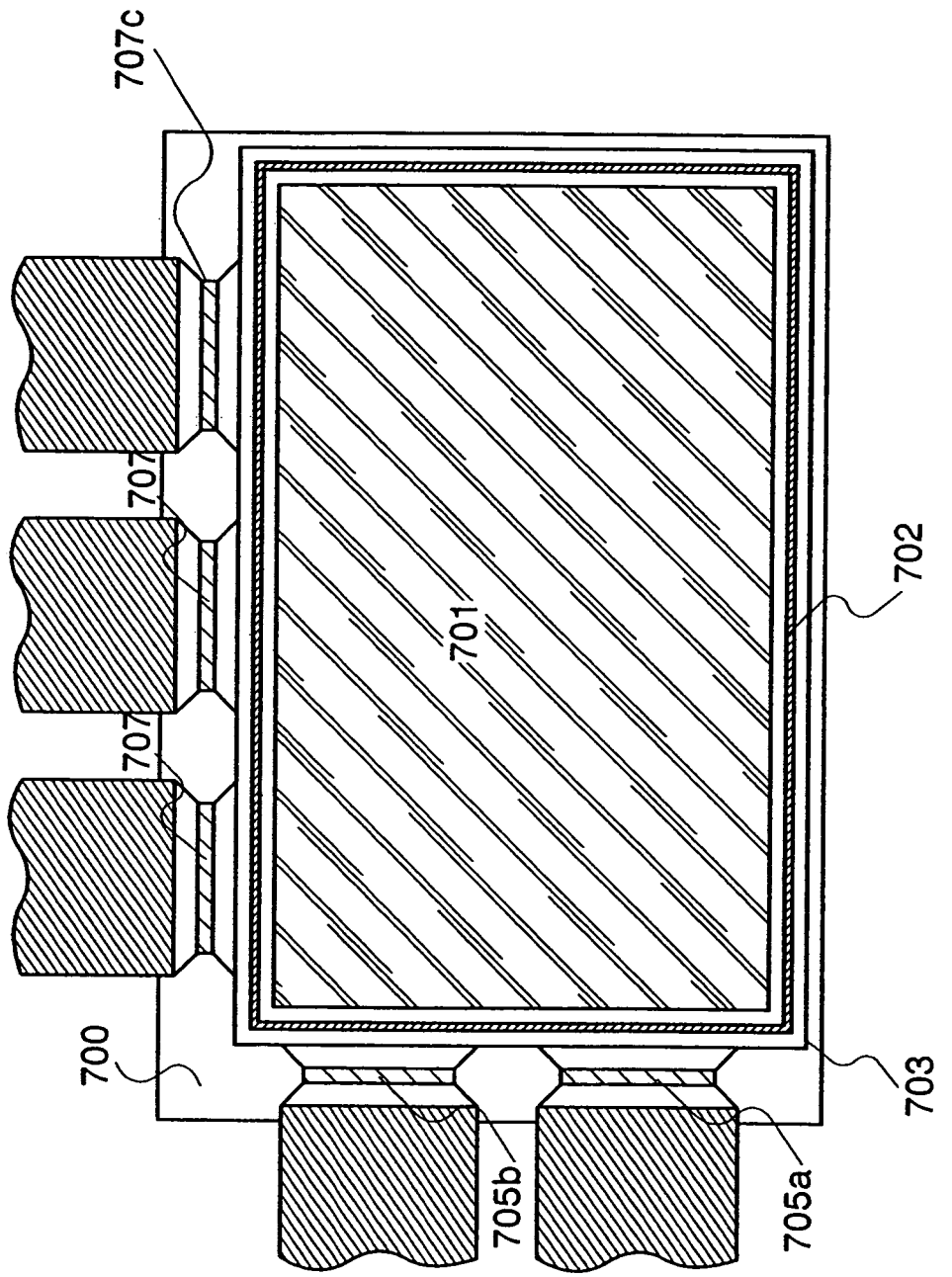
FIG. 27 is a top view of a display device of the present invention.

FIG. 38 shows a structure of a display panel that controls a signal to be input to a scanning line and a signal line by an external driver circuit. Furthermore, a driver IC 705a, 705b and 707a-707c may be mounted on a substrate 700 by COG (Chip on Glass) as shown in FIG. 27. The driver IC 705a, 705b and 707a-707c may be formed over a single crystal semiconductor substrate or being a circuit formed with a TFT over a glass substrate.

Figure 11:
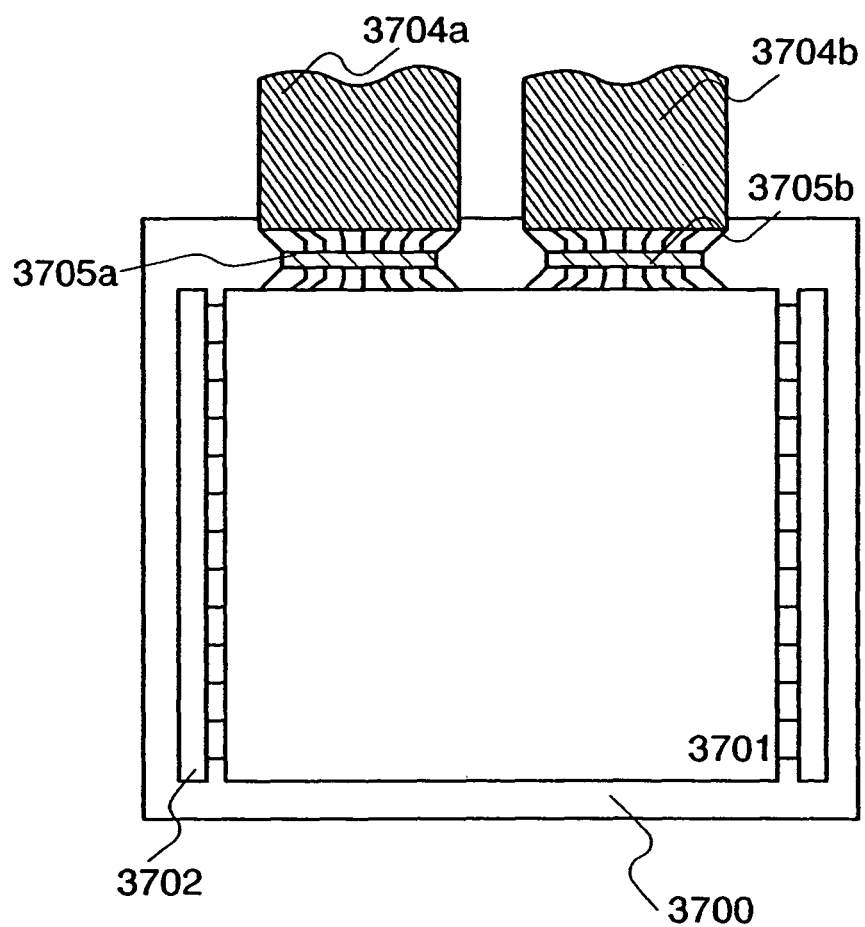
FIG. 11 is a top view of a display device of the present invention.

When a TFT provided in a pixel is formed using a SAS, a scanning line side driver circuit 3702 can be integrally formed over a substrate 3700 as shown in FIG. 11. In FIG. 11, reference numeral 3701 denotes a pixel portion, and driver ICs 3705a and 3705b are mounted on a signal line side driver circuit, which is connected to FPCs 3704a and 3704b.

EMBODIMENT MODE 1

An embodiment mode of the present invention is described with reference to FIGS. 1 to 7 and FIGS. 16A to 23C. Specifically, a method for manufacturing a display device to which the present invention is applied is described. First, a method for manufacturing a display device having a channel etch thin film transistor to which the present invention is applied is described. FIGS. 1 to 7 correspond to FIGS. 16 to 22, respectively. FIGS. 1 to 7 are top views of a pixel portion of a display device. FIGS. 16A, 17A, 18A, 19A, 20A, 21A, and 22A are cross-sectional views taken along lines A-A' in FIGS. 1 to 7, and FIGS. 16B, 17B, 18B, 19B, 20B, 21B, and 22B are cross sectional views taken along lines B-B', and then, FIGS. 16C, 17C, 18C, 19C, 20C, 21C, and 22C are cross-sectional views taken along lines C-C'.

A base film 101 for improving adhesion is formed over a substrate 100 as base pretreatment. Then, insulating layers 102a and 102b are selectively formed as shown in FIG. 1 and FIGS. 16A, 16B, and 16C. A glass substrate made of barium borosilicate glass, alumino borosilicate glass, or the like, a quartz substrate, a silicon substrate, a metal substrate, a stainless steel substrate, or a heat-resistant plastic substrate which can withstand a processing temperature in this manufacturing step can be used as the substrate 100. In addition, a surface of the substrate 100 may be polished by a CMP method or the like so that it is planarized. Note that an insulating layer may be formed over the substrate 100. The insulating layer is formed by using an oxide or nitride material containing silicon by a known method such as a CVD method, a plasma CVD method, a sputtering method, or a spin coating method to be a single layer or a laminated layer. The insulating layer may not be formed, but it is effective in blocking a contaminant from the substrate 100 and the like. In the case of forming the insulating layer to prevent contamination from a glass substrate, the base film 101 is formed as base pretreatment for a gate wiring layer 103 to be formed thereover by a droplet discharge method.

Figure 37:
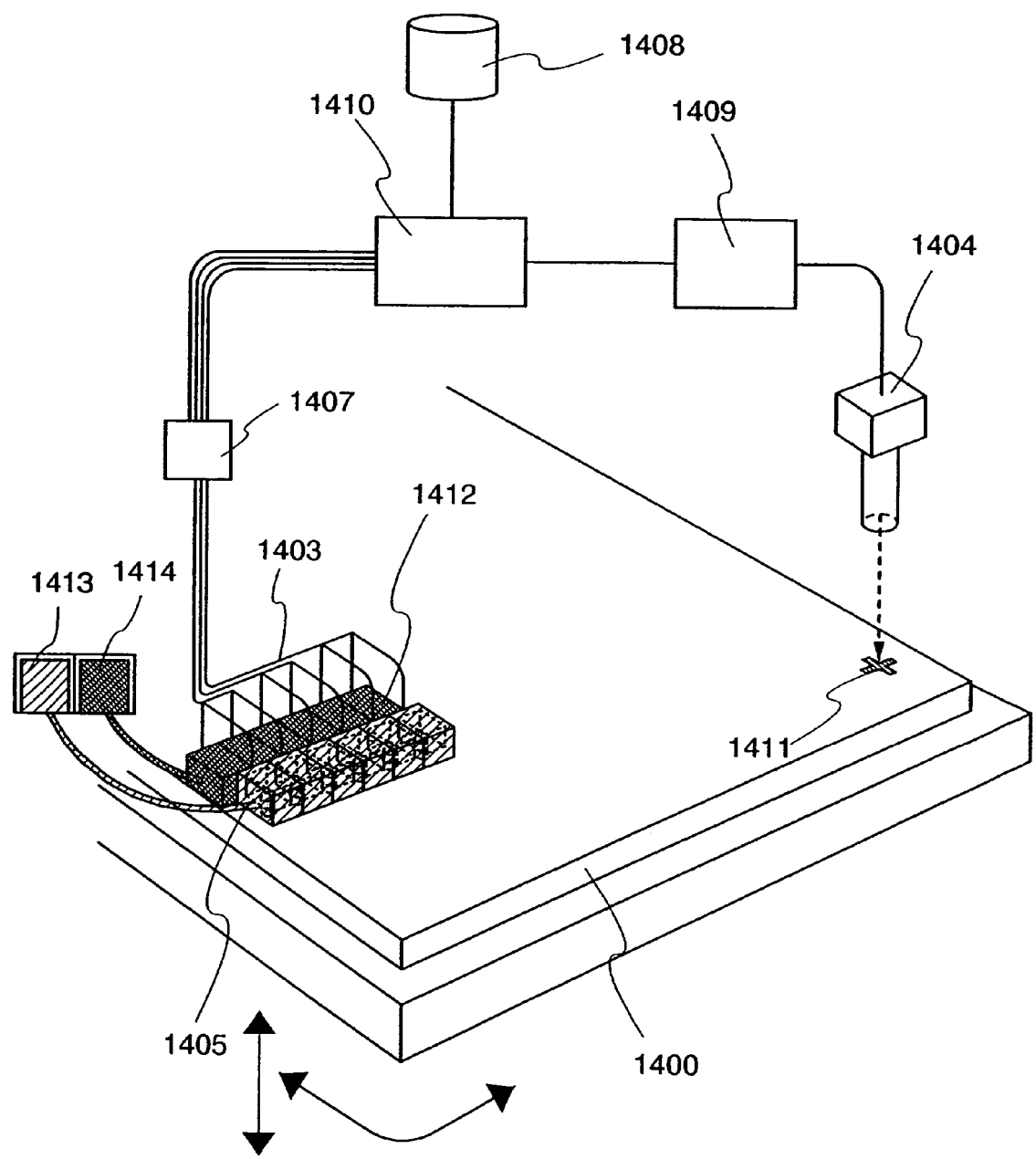
FIG. 37 shows a structure of a droplet discharge apparatus applicable to the present invention.

FIG. 37 shows one mode of a droplet discharge apparatus used for forming a pattern. Each head 1405 of a droplet discharge means 1403 is connected to a control means 1407, and that is controlled by a computer 1410, so that a preprogrammed pattern can be drawn. A position of drawing may be determined based on, for example, a marker 1411 formed over the substrate 1400. Alternatively, a reference point can be fixed based on an edge of the substrate 1400. The reference point is detected by an imaging means 1404 such as a CCD, and converted into a digital signal by an image processing means 1409. Then, the digital signal is recognized by the computer 1410, and a control signal is generated and is transmitted to the control means 1407. Naturally, information on a pattern to be formed over the substrate 1400 is stored in a storage medium 1408, and the control signal is transmitted to the control means 1407 based on the information, so that heads 1405 and 1412 of the droplet discharge means 1403 can be independently controlled. A material to be discharged is supplied from a material supply source 1413 and a material supply source 1414 to the head 1405 and the head 1412 through a pipe, respectively.

Nozzles of the heads 1405 and 1412 have different size, and different materials can be simultaneously drawn in different width. A pattern can be drawn using one head by discharging each of a conductive material, an organic or inorganic material, and the like. When a pattern is drawn over a wide area, for example, an interlayer film, one material is simultaneously discharged from a plurality of nozzles to improve a throughput, and thus, drawing can be performed. When a large-size substrate is used, the head 1405 can freely move over the substrate in an arrow direction and a region to be drawn can be set freely. Thus, a plurality of the same patterns can be drawn over one substrate.

The base film 101 formed as base pretreatment in this embodiment mode can be formed by a dip coating method of a sol-gel method, a spin coating method, a droplet discharge method, an ion plating method, an ion beam method, a CVD method, a sputtering method, an RF magnetron sputtering method, a plasma spray method, or an anodic oxidation method. In addition, a substance for forming the base film does not need to have continuity as a film depending on its formation method. A solvent may be baked or dried when it is necessary to be removed in the case of forming the substance by an application method such as a dip coating method or a spin coating method.

This embodiment mode describes the case of forming $TiO_x$ (typically, $TiO_2$) crystal having a predetermined crystal structure by a sputtering method as the base film 101. Sputtering is performed using a metal titanium tube as a target and using an argon gas and an oxygen gas. Further, a helium (He) gas may be introduced. $TiO_x$ may be formed while heating a film formation chamber or a substrate provided with an object to be treated.

The formed $TiO_x$ may be a very thin film.

Further, the base film 101 made of a metal material such as Ti (titanium), W (tungsten), Cr (chromium), Ta (tantalum), Ni (nickel), or Mo (molybdenum), or oxide thereof may be formed by a sputtering method, a vapor deposition method, or the like.

The base film 101 may be formed to be from 0.01 nm to 10 nm in thickness. It may be formed to be very thin and need not necessarily have a layer structure. When a refractory metal material or a 3d transition element is used as the base film and the base film is conductive, it is preferable to perform either of the following two methods on the base film except a conductive layer formation region.

As a first method, a part of the base film 101 which is not overlapped with the gate wiring layer 103 is insulated to form an insulating layer. In other words, the part of the base film 101 which is not overlapped with the gate wiring layer 103 is oxidized and insulated. When the part of base film 101 is oxidized and insulated in this way, it is preferable to form the base film 101 to be from 0.01 nm to 10 nm in thickness; thus, the base film can be easily oxidized. Note that oxidization may be performed by exposing to an oxygen atmosphere or by heat-treating.

As a second method, the base film 101 is selectively formed in a formation region of the gate wiring layer 103 (a discharge region of a composition including a conductive material). The base film 101 may be selectively formed over the substrate by employing a droplet discharge method or by using the insulating layers 102a and 102b as a mask or may be selectively etched and removed after being formed entirely. When this step is employed, there is no limitation on a thickness of the base film 101.

Alternatively, a method of performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1 \times 10^{10}$ m$^{-3}$ to $1 \times 10^{14}$ m$^{-3}$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion of a pattern to be formed by a droplet discharge method with a formation region thereof. An organic material (organic resin material) (polyimide or acrylic) or a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

The insulating layers 102a and 102b are formed. The insulating layers 102a and 102b are formed by patterning as shown in FIG. 1 and FIGS. 16A, 16B, and 16C through an etching process after the insulating layer is entirely formed by a spin coating method or a dipping method. Dry etching such as a dry etching such as a plasma etching method may be employed or a wet etching may be used as the etching. The etching process is not necessarily required when the insulating layers 102a and 102b are formed by a droplet discharge method. When the insulating layer or the like is formed over wide area by a droplet discharge method, it is formed by using a discharge opening with a large diameter of a nozzle in a droplet discharge apparatus or by discharging a composition from a plurality of discharging openings of nozzles and drawing so that a plurality of lines is overlapped with each other. Consequently, a throughput is improved.

The insulating layers 102a and 102b can be formed by using an inorganic insulating material such as silicon oxide, silicon nitride, silicon oxynitride, aluminum oxide, aluminum nitride, or aluminum oxynitride; acrylic acid; methacrylic acid; a derivative of acrylic acid or methacrylic acid; a heat-resistant high molecular weight material such as polyimide, aromatic polyamide, or polybenzimidazole; or inorganic siloxane or an organosiloxane-based insulating material in which hydrogen bonded with silicon is substituted by an organic group such as metyl or phenyl, including a Si—O—Si bond among compounds that contain silicon, oxygen, and hydrogen and that are formed by using a siloxane material as a starting material. They may be formed by using a photosensitive or non-photosensitive material such as acrylic or polyimide. When a photosensitive material is used, patterning can be performed without using a mask of a resist. In this embodiment mode, a photosensitive organic resin material is used.

After the insulating layers 102a and 102b are formed, the gate wiring layer 103 is formed by a droplet discharge method to fill in an opening between the insulating layers 102a and 102b (ref. FIG. 2 and FIGS. 17A, 17B, and 17C). The gate wiring layer 103 may be formed after the previously formed insulating layers 102a and 102b are baked. Temporary baking is performed on the insulating layers, and the gate wiring layer 103 is formed, and then, they may be completely baked together. The present invention makes it possible to separately form a gate wiring layer or a capacitor wiring layer which straddles pixels and which is formed to have a relatively broad line width and an electrode layer such as a gate electrode layer which is formed in each pixel to have a relatively narrow line width. A highly reliable and low resistant gate wiring layer or capacitor wiring layer without disconnection or the like can be formed by forming a conductive layer having a broad line width, such as a gate wiring layer or a capacitor wiring layer, earlier to fill in an opening between the insulating layers.

Figure 2:
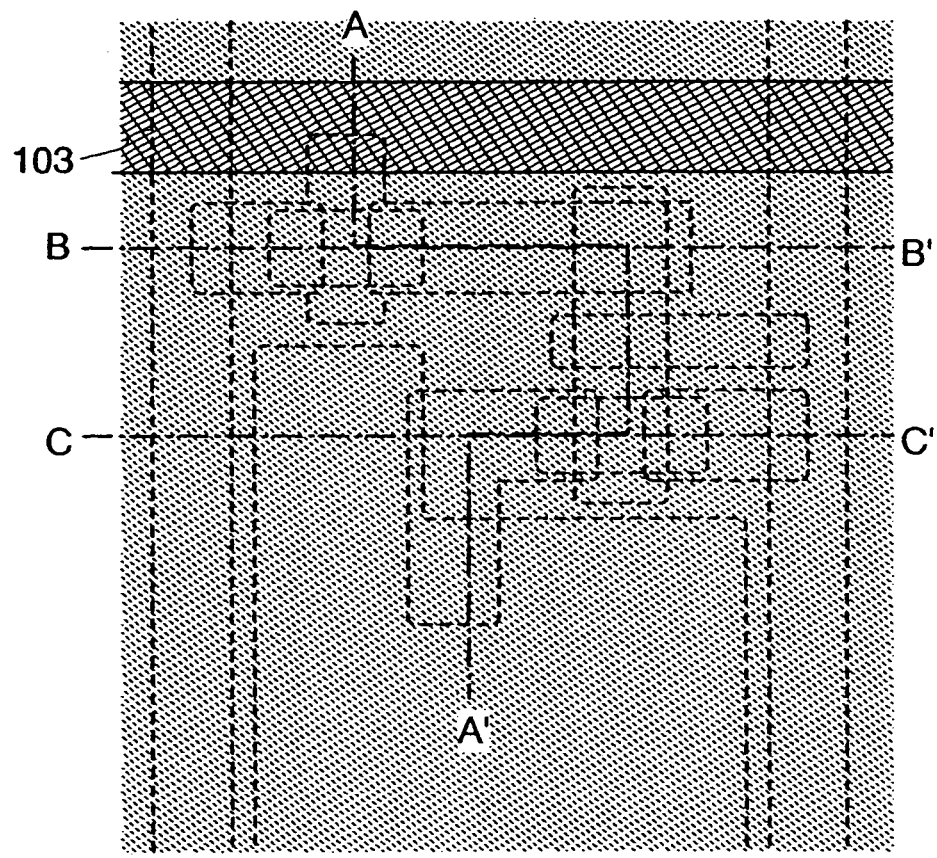
FIG. 2 shows a method for manufacturing a display device of the present invention.
Figure 3:
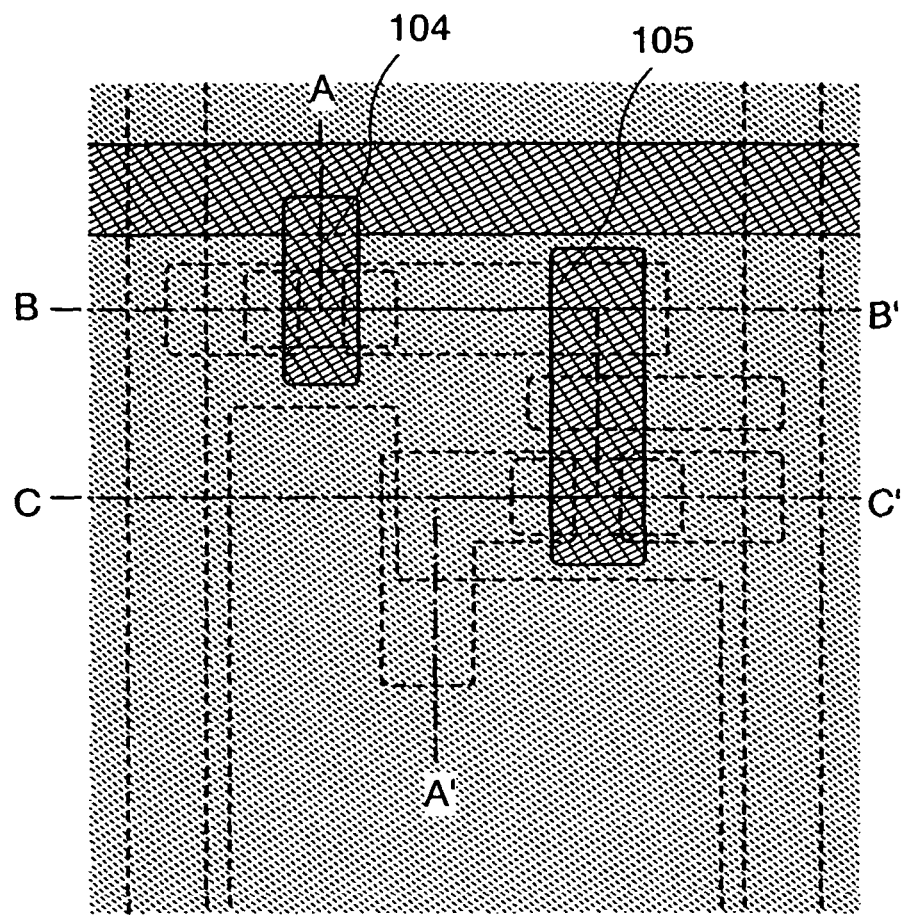
FIG. 3 shows a method for manufacturing a display device of the present invention.
Figure 4:
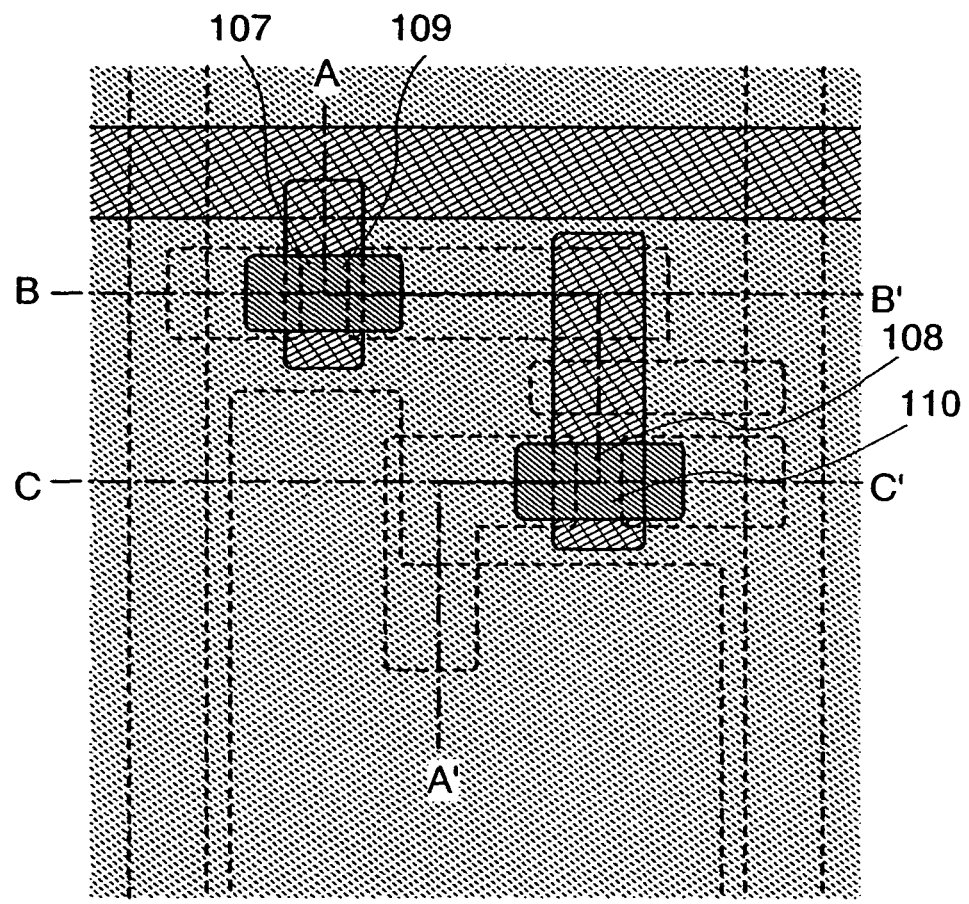
FIG. 4 shows a method for manufacturing a display device of the present invention.
Figure 5:
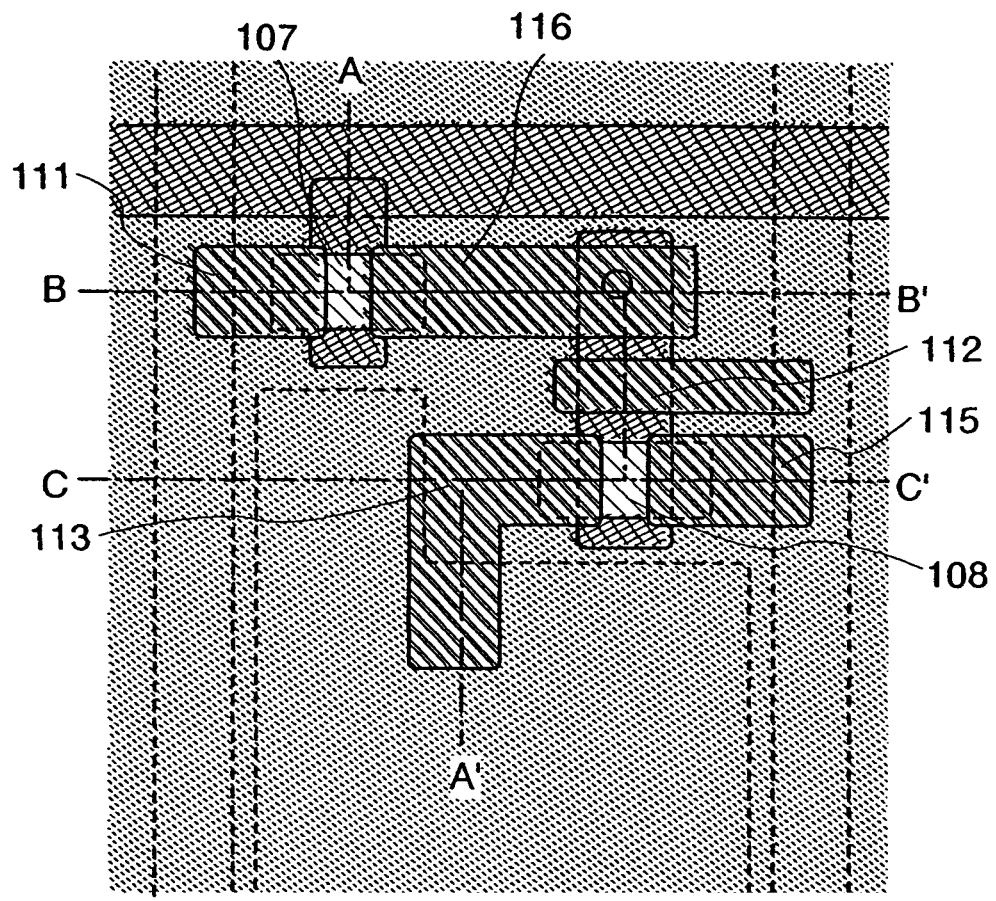
FIG. 5 shows a method for manufacturing a display device of the present invention.
Figure 6:
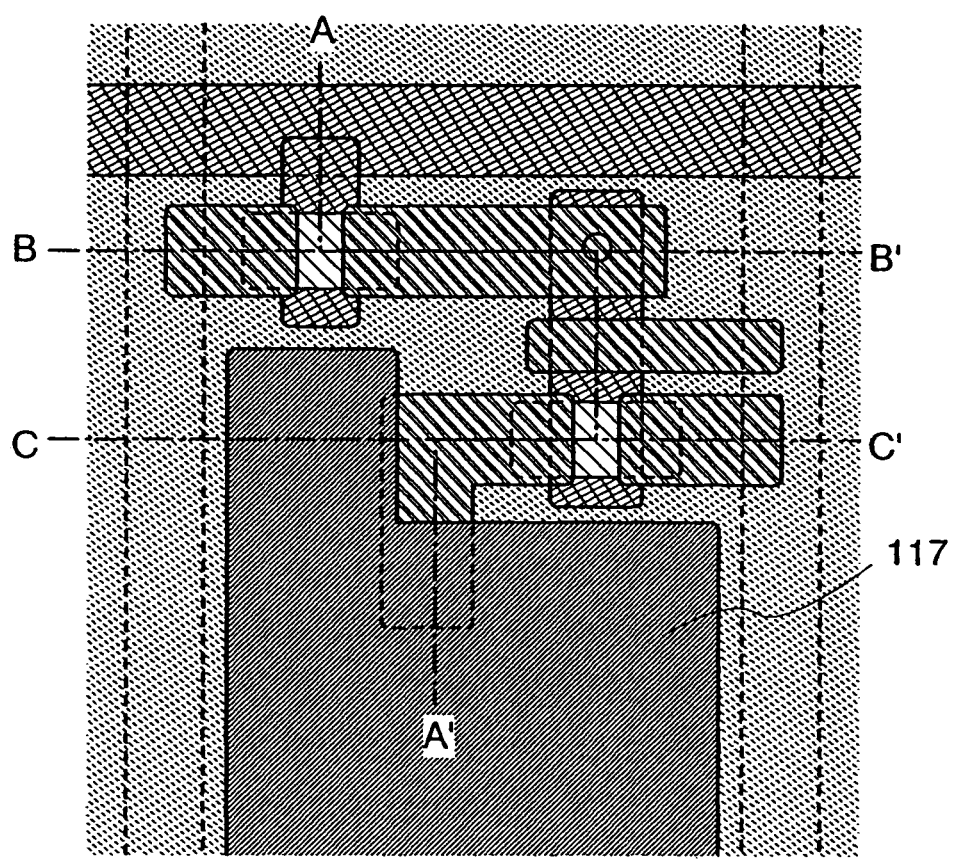
FIG. 6 shows a method for manufacturing a display device of the present invention.
Figure 7:
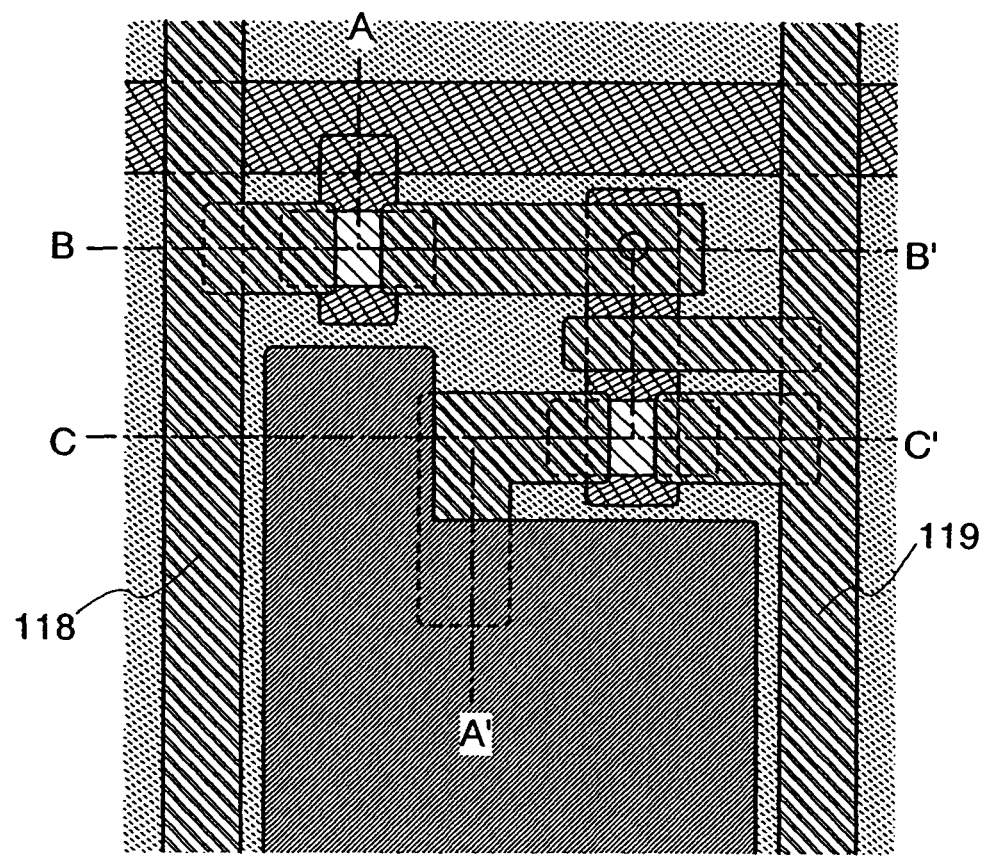
FIG. 7 shows a method for manufacturing a display device of the present invention.
Figure 12A:
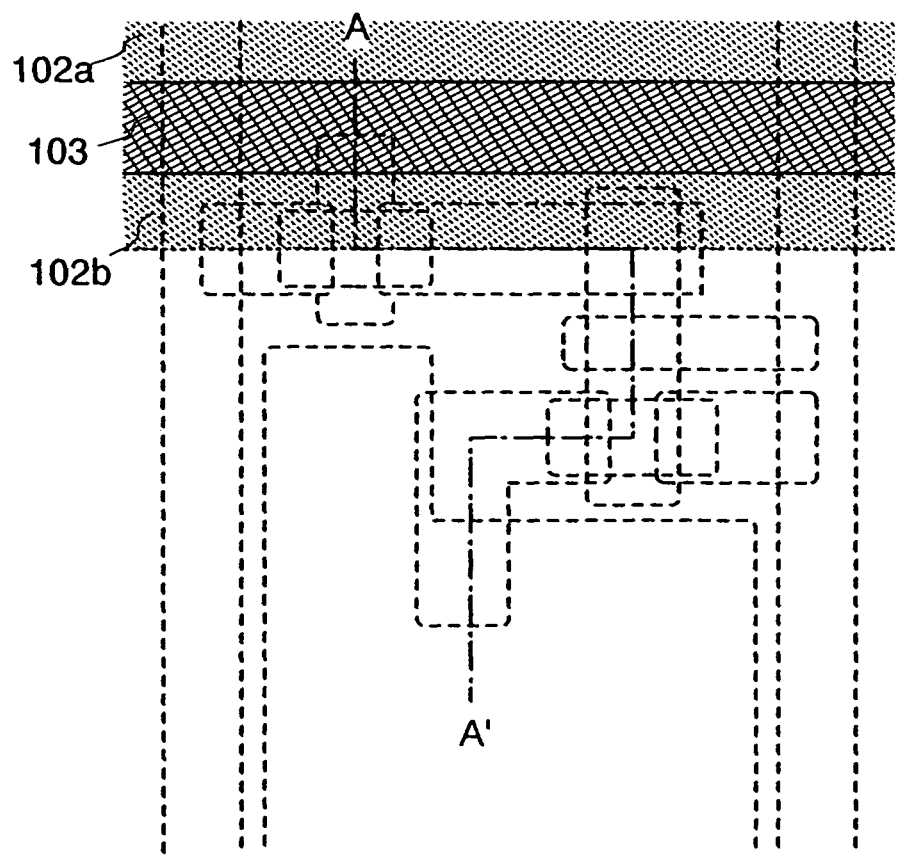
FIGS. 12A and 12B show a method for manufacturing a display device of the present invention.
Figure 12B:
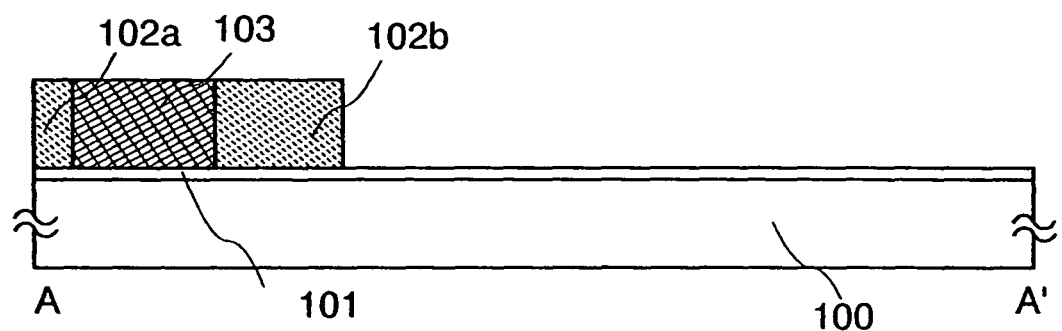
Figure 13A:
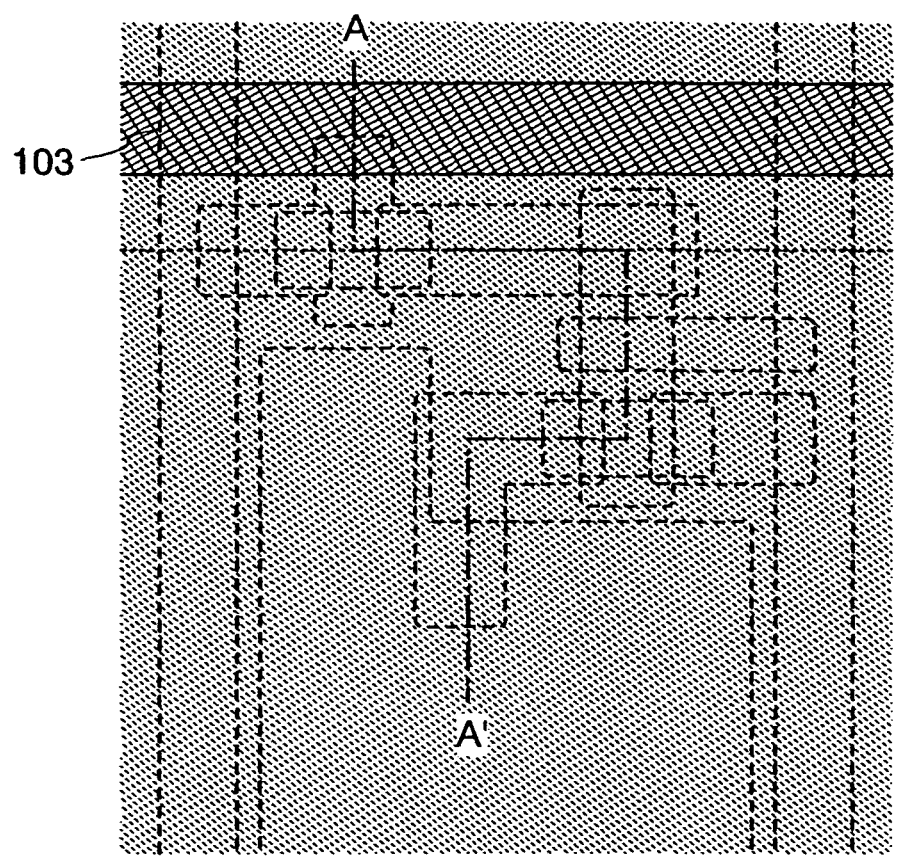
FIGS. 13A and 13B show a method for manufacturing a display device of the present invention.
Figure 13B:
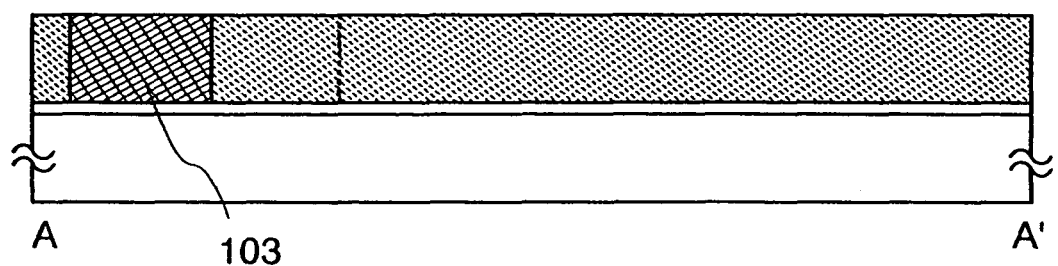

As shown in FIGS. 1 and 2, insulating layers may be selectively formed earlier and a conductive layer may be formed therebetween. In the case of employing a droplet discharge method, a composition having an insulating material for forming the insulating layer and a composition including a conductive material for forming the conductive layer may be simultaneously discharged. Since compositions function as partition walls for each other by simultaneously discharging them, a pattern can be formed with good controllability without spreading laterally. In that case, each discharge opening may be selected depending on its formation region. For example, when the insulating layer is formed in a broader region than that of the conductive layer as shown in FIG. 2, it is preferable to use a larger discharge opening of a nozzle for discharging the insulating layer than a discharge opening of a nozzle for discharging the conductive layer. When a formation region of the insulating layer is relatively broad, the insulating layers are drawn in the periphery of the conductive layer to rim it; thereafter, the insulating layer can be formed by being discharged to the rest of the region as shown in FIGS. 12A and 12B. In FIGS. 12A and 12B, the insulating layer 102a and a part of the insulating layer 102b are simultaneously formed to rim the gate wiring layer 103. Subsequently, the rest of the insulating layer 102b is formed by a droplet discharge method as shown in FIGS. 13A and 13B. The rest of the insulating layer in FIGS. 13A and 13B is relatively broader than a pattern of the conductive layer. Therefore, throughput can be improved by using a discharge opening of a nozzle with a large diameter. Thus, throughput can be improved by determining a size of a discharge opening or the number of times of drawing depending on a pattern structure of a predetermined substance.

The gate wiring layer 103 is formed by using a droplet discharge means. The droplet discharge means is a general term for the one having a means of discharging a droplet, such as a nozzle having a discharging opening of a composition or a head equipped with one nozzle or plural nozzles. A diameter of the nozzle included in the droplet discharge means is set in the range of from 0.02 μm to 100 μm (favorably, 30 μm or less) and a volume of the composition to be discharged from the nozzle is set in the range of from 0.001 pl to 100 pl (favorably, from 10 pl to 40 pl; more preferably, 10 pl or less). The volume of the composition to be discharged increases in proportion to a size of the diameter of the nozzle. Further, it is preferable that a distance between an object to be treated and the discharging opening of the nozzle is as short as possible in order to drop the droplet on a desired portion. The distance is favorably set in the range of about from 0.1 mm to 3 mm (more favorably, 1 mm or less).

As for the composition to be discharged from the discharging opening, a conductive material dissolved or dispersed in a solvent is used. The conductive material corresponds to a fine particle or a dispersant nanoparticle of a metal such as Ag, Au, Cu, Ni, Pt, Pd, Ir, Rh, W, or Al, sulfide of a metal such as Cd or Zn, oxide of Fe, Ti, Si, Ge, Zr, Ba, or the like, or silver halide. In addition, it corresponds to indium tin oxide (ITO), ITSO made of indium tin oxide and silicon oxide, organic indium, organic tin, zinc oxide, titanium nitride, or the like which is used as a transparent conductive film. However, as for compositions to be discharged from the discharging opening, it is preferable to use any material selected from gold, silver, and copper, which is dissolved or dispersed in a solvent, taking a specific resistance value into consideration. It is more preferable to use silver or copper having a low resistance value. When silver or copper is used, a barrier film may be additionally provided as a measure for an impurity. A silicon nitride film or nickel boron (NiB) can be used as the barrier film.

In addition, a particle in which a conductive material is coated with other conductive materials to be a plurality of layers may be used. For example, a three-layer structure particle in which copper is coated with nickel boron (NiB) and then coated with silver may be used. As for such solvents, esters such as butyl acetate and ethyl acetate; alcohols such as isopropyl alcohol and ethyl alcohol; organic solvents such as methyl ethyl ketone and acetone; or the like may be used. The viscosity of the composition is preferably 20 mPa·s or less. This is because the composition can be prevented from drying or the composition can be smoothly discharged from the discharging opening. The surface tension of the composition is preferably 40 mN/m or less. However, the viscosity of the composition and the like may be appropriately adjusted in accordance with a solvent to be used and intended use. For example, the viscosity of a composition in which ITO, organic indium, or organic tin is dissolved or dispersed in the solvent may be from 5 mPa·s to 20 mPa·s, the viscosity of a composition in which silver is dissolved or dispersed in the solvent may be from 5 mPa·s to 20 mPa·s, and the viscosity of a composition in which gold is dissolved or dispersed in the solvent may be from 5 mPa·s to 20 mPa·s.

The conductive layer may be formed by laminating a plurality of conductive materials. In addition, the conductive layer may be formed by a droplet discharge method using silver as a conductive material; thereafter, it may be plated with copper or the like. Plating may be performed by electroplating or a chemical (electroless) plating method. Plating may be performed by soaking a substrate surface into a container filled with a solution having a plating material. A solution having a plating material may be applied so that the solution flows over the substrate surface with the substrate placed obliquely (or vertically). When the plating is performed by applying a solution with the substrate placed vertically, there is an advantage of miniaturizing a process apparatus.

The diameter of a particle of the conductive material is preferably as small as possible for the purpose of preventing clogged nozzles and manufacturing a high-definition pattern, although it depends on the diameter of each nozzle, a desired shape of a pattern, and the like. Preferably, the diameter of the particle of the conductive material is 0.1 μm or less. The composition is formed by a known method such as an electrolyzing method, an atomizing method, a wet reducing method, or the like, and the particle size thereof is typically about from 0.01 μm to 10 μm. However, when a gas evaporation method is employed, a nanomolecule protected with a dispersant is minute, about 7 nm. When each surface of nanoparticles is covered with a coating, the nanoparticles do not cohere in the solvent and are uniformly dispersed in the solvent at a room temperature, and show a property similar to that of liquid. Accordingly, it is preferable to use a coating.

When the step of discharging a composition is performed under reduced pressure, the solvent of the composition is evaporated during a period from discharging the composition until the composition lands on an object to be treated, and thus, later steps of drying and baking the composition can both be omitted. It is preferable to perform the step under reduced pressure, since an oxide film or the like is not formed on the surface of the conductive material. After discharging the composition, either or both steps of drying and baking is/are performed. Each step of drying and baking is a step of heat treatment. For example, drying is performed for three minutes at 100° C. and baking is performed for from 15 minutes to 30 minutes at a temperature of from 200° C. to 350° C., each of which has a different purpose, temperature, and period. The steps of drying and baking are performed at normal pressure or under reduced pressure by laser light irradiation, rapid thermal annealing, a heating furnace, or the like. Note that the timing of the heat treatment is not particularly limited. The substrate may be heated to favorably perform the steps of drying and baking. The temperature of the substrate at the time depends on a material of the substrate or the like, but it is typically from 100° C. to 800° C. (preferably, from 200° C. to 350° C.). According to the steps, nanoparticles are made in contact with one another and fusion and welding are accelerated by hardening and shrinking a peripheral resin as well as evaporating the solvent in the composition or chemically removing the dispersant.

A continuous wave or pulsed wave gas laser or solid laser may be used for laser light irradiation. An excimer laser, a YAG laser, and the like can be given as a gas laser, and a laser using a crystal of YAG, $YVO_4$, or the like which is doped with Cr, Nd, or the like can be given as a solid laser. Note that it is preferable to use a continuous wave laser in relation to the absorptance of laser light. Moreover, a so-called hybrid laser irradiation method which combines a pulsed wave and a continuous wave may be used. However, it is preferable that the heat treatment by laser light irradiation is instantaneously performed within several microseconds to several tens of seconds so that the substrate 100 is not damaged, depending on heat resistance of the substrate 100. Rapid thermal annealing (RTA) is carried out by raising the temperature rapidly and heating for several microseconds to several minutes using an infrared lamp or a halogen lamp emitting light of from ultraviolet to infrared in an inert gas atmosphere. Since the treatment is performed instantaneously, only a thin film on a top surface can be substantially heated and a lower layer film is not affected. In other words, even a substrate having low heat resistance such as a plastic substrate is not affected.

The above-described step of forming the base film 101 is carried out as base pretreatment for a conductive layer to be formed by using a droplet discharge method; however, this treatment step may be carried out after forming the gate wiring layer 103.

After the insulating layers 102a and 102b and the gate wiring layer 103 are formed by discharging a composition with a droplet discharge method, a surface thereof may be pressed with pressure to be planarized in order to improve its planarity. As a method for pressing, unevenness may be reduced to smooth the surface by sweeping the surface with a roller, or the surface may be perpendicularly pressed with a flat plate. In pressing, a heating step may be carried out. Alternatively, the surface may be softened or melted with a solvent or the like and an uneven portion on the surface may be removed with an air knife. Further, it may be polished by using a CMP method. The steps can be applied in planarizing the surface when unevenness is generated due to a droplet discharge method.

Subsequently, a gate electrode layer 104 and a gate electrode layer 105 are formed. The gate electrode layer 104 is formed to be in contact with the gate wiring layer 103 (ref. FIG. 3 and FIGS. 18A to 18C). After the gate wiring layer 103 is formed, the gate electrode layer 104 can be formed minutely using a nozzle having a discharge opening with a small diameter by a droplet discharge method. Similar treatment to that performed in forming the base film 101 may be performed as a base pretreatment on a region on the gate wiring layer 103 to be in contact with the gate electrode layer 104. Of course, the above-described base pretreatment may be performed on a region where the gate electrode layer 105 is to be formed. In this embodiment mode, ultraviolet ray irradiation treatment is carried out as treatment to improve adhesion. After the ultraviolet ray irradiation treatment, the gate electrode layer 104 is formed. According to the present invention, a line width of the gate wiring layer 103 is from 10 μm to 40 μm, a line width of gate electrode layers 104 and 105 is from 5 μm to 20 μm, and a wiring in which the line width of the gate wiring layer 103 is about twice that of the gate electrode layers 104 and 105 can be formed.

In addition, the gate wiring layer 103 and the gate electrode layers 104 and 105 may be simultaneously formed. In that case, heads of a droplet discharge apparatus are provided with nozzles having different diameter sizes, and the gate wiring layer 103 and the gate electrode layers 104 and 105 are simultaneously formed by moving once. For example, a head provided with a nozzle having a discharge opening with a relatively large diameter is moved over the region where the gate wiring layer 103 is to be formed, and a head provided with a nozzle having a discharge opening with a relatively small diameter is moved over the region where the gate electrode layers 104 and 105 are to be formed. A discharge opening for forming the gate wiring layer 103 continuously discharges a conductive material, and a discharge opening for forming the gate electrode layers 104 and 105 discharges a conductive material when the head is moved over a formation region thereof. In this way, patterns having different line width can be formed, and throughput can be improved.

Subsequently, a gate insulating layer 106 is formed over the gate electrode layers 104 and 105 (ref. FIG. 3 and FIGS. 18A, 18B, and 18C). The gate insulating layer 106 may be made of a known material such as an oxide or nitride material of silicon, and may be a laminated layer or a single layer. In this embodiment mode, a laminated layer of three layers of a silicon nitride film, a silicon oxide film, and a silicon nitride film is used. Alternatively, a single layer of them or of a silicon oxynitride film, or a laminated layer of two layers may be used. A silicon nitride film having minute film quality may be preferably used. In the case of using silver, copper, or the like for the conductive layer formed by a droplet discharge method, and then, forming a silicon nitride film or a NiB film thereover as a barrier film, the silicon nitride film or the NiB film is effective in preventing an impurity from diffusing and in planarizing the surface. Note that a rare gas element such as argon is preferably included in a reactive gas and is preferably mixed in the insulating film to be formed in order to form a minute insulating film with few gate leak current at a low film-formation temperature.

Next, a semiconductor layer is entirely formed. A semiconductor layer having one conductivity may be formed if necessary. In this embodiment mode, semiconductor layers 107 and 108 and N type semiconductor layers 109 and 110 as semiconductor layers having one conductivity are laminated (ref. FIG. 4 and FIGS. 19A, 19B, and 19C). In addition, an NMOS structure of an N-channel TFT in which the N type semiconductor layer is formed, a PMOS structure of a P-channel TFT in which a P type semiconductor layer is formed, or a CMOS structure of an N-channel TFT and a P-channel TFT can be manufactured. In addition, the N-channel TFT and the P-channel TFT can be manufactured by adding an element which imparts conductivity with doping to impart conductivity and by forming an impurity region in the semiconductor layer.

The semiconductor layer may be formed by a known method (a sputtering method, an LPCVD method, a plasma CVD method, or the like). There is no particular limitation on materials of the semiconductor layer, but the semiconductor layer is preferably made of silicon, a silicon germanium (SiGe) alloy, or the like.

The semiconductor layer uses an amorphous semiconductor (typically, hydrogenated amorphous silicon) or a crystalline semiconductor (typically, polysilicon) as a material. Polysilicon includes so-called high-temperature polysilicon which uses, as a main material, polycrystalline silicon to be formed through a process temperature of 800° C. or more, so-called low-temperature polysilicon which uses, as a main material, polycrystalline silicon to be formed at a process temperature of 600° C. or less, crystalline silicon which is crystallized by adding, for example, an element for promoting crystallization, and the like.

Further, as another substance, a semi-amorphous semiconductor or a semiconductor containing a crystal phase in a part of a semiconductor layer can also be used. The semi-amorphous semiconductor means a semiconductor having an intermediate structure between an amorphous structure and a crystalline structure (including a single crystal and a polycrystal) and having a third state which is stable in terms of free energy, and a crystalline semiconductor having short-range order and lattice distortion. Typically, it is a semiconductor layer containing silicon as a main component with lattice distortion, in which the Raman spectrum is shifted to a lower frequency side than 520 cm$^{-1}$. Further, hydrogen or halogen of at least 1 atomic % or more is contained as a neutralizer of a dangling bond. Here, such a semiconductor as described above is referred to as a semi-amorphous semiconductor (hereinafter, referred to as a "SAS" in short). The SAS is also referred to as a so-called microcrystal semiconductor (typically, microcrystalline silicon).

The SAS can be obtained by performing glow discharge decomposition (plasma CVD) on a silicide gas. SiH$_4$ is given as a typical silicide gas. Si$_2$H$_6$, SiH$_2$Cl$_2$, SiHCl$_3$, SiCl$_4$, SiF$_4$, or the like as well as SiH$_4$ can be used. Further, GeF$_4$ or F$_2$ may be mixed. Formation of the SAS can be facilitated by using the silicide gas diluted with hydrogen or a mixture of hydrogen and one or more of rare gases selected from helium, argon, krypton, and neon. A dilution ratio of hydrogen to the silicide gas is, for example, preferably in the range of from 2 times to 1000 times in terms of a flow ratio. Although formation of the SAS by glow discharge decomposition is preferably performed under reduced pressure, the formation can also be performed by utilizing an electric discharge under atmospheric pressure. Typically, the formation may be performed in the pressure range of from 0.1 Pa to 133 Pa. A power supply frequency for generating the glow discharge is in the range of from 1 MHz to 120 MHz, preferably, in the range of from 13 MHz to 60 MHz. A high-frequency power supply may be appropriately set. A temperature for heating the substrate is preferably 300° C. or less and the temperature in the range of from 100° C. to 200° C. is also permissible. As for impurity elements to be contained mainly at the time of forming a film, an impurity derived from an atmospheric constituent such as oxygen, nitrogen, or carbon is preferably in a concentration of 1×10$^{20}$ atoms/cm$^3$ or less, and particularly, a concentration of oxygen is 5×10$^{19}$ atoms/cm$^3$ or less, preferably, 1×10$^{19}$ atoms/cm$^3$ or less. Further, stability of the SAS can be enhanced by promoting the lattice distortion by allowing a rare gas element such as helium, argon, krypton, or neon to be contained, thereby obtaining a favorable SAS. In addition, a SAS layer formed from a hydrogen-based gas may be laminated over a SAS layer formed from a fluorine-based gas as the semiconductor layer.

When a crystalline semiconductor layer is used as the semiconductor layer, a known method (a laser crystallization method, a heat crystallization method, a heat crystallization method using an element promoting crystallization such as nickel, or the like) may be employed as a method for manufacturing the crystalline semiconductor layer. In the case of not introducing an element promoting crystallization, hydrogen is released until hydrogen concentration contained in an amorphous silicon film becomes 1×10$^{20}$ atoms/cm$^3$ or less by heating the amorphous silicon film for one hour at a temperature of 500° C. in nitrogen atmosphere before irradiating the amorphous silicon film with laser light. This is because a film is damaged when the amorphous silicon film containing much hydrogen is irradiated with laser light.

There is no particular limitation on a method for introducing a metal element into the amorphous semiconductor layer as long as it is a method capable of making the metal element exist on the surface of or inside the amorphous semiconductor layer. For example, a sputtering method, a CVD method, a plasma treating method (including a plasma CVD method), an adsorption method, or a method for applying a metal salt solution can be employed. Among them, the method using a solution is simple and easy and is useful in terms of easy concentration adjustment of the metal element. It is preferable that an oxide film is formed by UV light irradiation in oxygen atmosphere, a thermal oxidation method, treatment with ozone water or hydrogen peroxide including a hydroxyl radical, or the like in order to improve wettability on the surface of the amorphous semiconductor layer and to spread an aqueous solution over an entire surface of the amorphous semiconductor layer.

Heat treatment and laser light irradiation may be combined to crystallize the amorphous semiconductor layer. The heat treatment and/or the laser light irradiation may be independently performed plural times.

In addition, a crystalline semiconductor layer may be formed directly over the substrate by a plasma method. Alternatively, the crystalline semiconductor layer may be selectively formed over the substrate by employing a plasma method.

An organic semiconductor using an organic material may be used as a semiconductor. A low molecular weight material, a high molecular weight material, or the like is used for the organic semiconductor, and in addition, a material such as an organic pigment, a conductive high molecular weight material can be used.

In this embodiment mode, an amorphous semiconductor is used as the semiconductor. The semiconductor layer is formed; thereafter, the N type semiconductor layer is formed as a semiconductor layer having one conductivity by a plasma CVD method or the like.

Subsequently, the semiconductor layer and the N type semiconductor layer are simultaneously patterned using a mask made of an insulating material such as a resist or polyimide to form the semiconductor layers 107 and 108 and the N type semiconductor layers 109 and 110 (ref. FIG. 4 and FIGS. 19A, 19B, and 19C). The mask can be formed by selectively discharging a composition. A resin material such as an epoxy resin, an acrylic resin, a phenol resin, a novolac resin, a melamine resin, or a urethane resin is used for the mask. In addition, the mask is formed by a droplet discharge method using an organic material such as benzocyclobutene, parylene, flare, or light-transmitting polyimide; a compound material formed by polymerization of a siloxane-based polymer or the like; a composition material containing a water-soluble homopolymer and a water-soluble copolymer; or the like. Alternatively, a commercial resist material including a photosensitizer may be used. For example, a typical positive type resist such as a novolac resin and naphthoquinonediazide compound that is a photosensitizer, a negative type resist such as a base resin, diphenylsilane diol, and an acid generating agent, or the like may be used. In using any one of the materials, surface tension and viscosity are appropriately adjusted by adjusting concentration of a solvent or adding a surfactant or the like.

A mask made of an insulating material such as a resist or polyimide is formed again by using a droplet discharge method. A through-hole 145 is formed in a part of the gate insulating layer 106 by an etching process using the mask, and a part of the gate electrode layer 105 disposed on a lower layer side thereof is exposed. Either plasma etching (dry etching) or wet etching may be adopted as the etching process. However, plasma etching is suitable to treat a large-sized substrate. A fluorine-based or chlorine-based gas such as $CF_4$, $NF_3$, $Cl_2$, or $BCl_3$ is used as an etching gas, and an inert gas such as He or Ar may be appropriately added. In addition, a local discharge process can be performed when an atmospheric pressure discharge etching process is applied, and a mask layer need not be entirely formed over the substrate.

Source-drain electrode layers 111, 113, 115, and 116 and a conductive layer 112 are formed by discharging a composition including a conductive material after the mask is removed. Then, the N type semiconductor layer is patterned using the source-drain electrode layers 111, 113, 115, and 116 as a mask (ref. FIG. 5 and FIGS. 20A, 20B, and 20C). Note that the above-described base pretreatment of selectively forming a $TiO_x$ film or the like in a portion where the source-drain electrode layers 111, 113, 115, and 116 and the conductive layer 112 are to be formed may be performed before forming the source-drain electrode layers 111, 113, 115, and 116 and the conductive layer 112, although not shown. Accordingly, the conductive layer can be formed with favorable adhesion.

The above-described step of forming the base film may be performed as base pretreatment for the conductive layer to be formed by using a droplet discharge method. In addition, the treatment step may be performed after the conductive layer is formed. Reliability of a display device can be improved since adhesion between the layers is improved according to the step.

The source-drain electrode layer 116 and the gate electrode layer 105 are electrically connected to each other in the through-hole 145 formed in the gate insulating layer 106. The conductive layer 112 constitutes a capacitor element. A composition including a particle of a metal such as Ag (silver), Au (gold), Cu (copper), W (tungsten), or Al (aluminum) as its main component can be used as a conductive material for forming the source-drain electrode layers 111, 113, 115, and 116 and the conductive layer 112. In addition, light-transmitting indium tin oxide (ITO), ITSO made of indium tin oxide and silicon oxide, organic indium, organic tin, zinc oxide, titanium nitride, and the like may be combined.

The step of forming the through-hole 145 in a part of the gate insulating layer 106 may be performed after forming the source-drain electrode layers 111, 113, 115, and 116 and the conductive layer 112, using the source-drain electrode layers 111, 113, 115, and 116 and the conductive layer 112 as a mask to form the through-hole 145. Then, a conductive layer is formed in the through-hole 145, and the source-drain electrode layer 116 and the gate electrode layer 105 are electrically connected to each other. In this case, there is an advantage of simplifying the steps.

Subsequently, a first electrode layer 117 is formed by selectively discharging a composition including a conductive material onto the gate insulating layer 106 (ref. FIG. 6 and FIGS. 21A, 21B, and 21C). The first electrode layer 117 may be formed by forming a predetermined pattern of a composition including indium tin oxide (ITO), indium tin oxide containing silicon oxide (ITSO), zinc oxide (ZnO), tin oxide ($SnO_2$), or the like and by baking it when light is to be emitted from the substrate 100 side or when a dual emission type EL display panel is to be manufactured.

Preferably, the first electrode layer 117 is made of indium tin oxide (ITO), indium tin oxide containing silicon oxide (ITSO), zinc oxide (ZnO), or the like by a sputtering method. It is more preferable to use indium tin oxide containing silicon oxide formed by a sputtering method using a target in which ITO contains silicon oxide of from 2% to 10% by weight. In addition, an oxide conductive material which contains silicon oxide and in which indium oxide is mixed with zinc oxide (ZnO) of from 2% to 20% by weight may be used. A mask layer may be formed by a droplet discharge method and be etched to have a desired pattern after forming the first electrode layer 117 by a sputtering method. In this embodiment mode, the first electrode layer 117 is made of a light-transmitting conductive material by a droplet discharge method. Specifically, it is formed by using indium tin oxide or ITSO made of ITO and silicon oxide. Although not shown, a $TiO_x$ film may be formed in a region where the first electrode layer 117 is to be formed and base pretreatment may be performed, similarly to the case of forming the gate wiring layer 103. The base pretreatment can improve adhesion and the first electrode layer 117 can be formed into a desired pattern.

In this embodiment mode, above described is an example of the gate insulating layer made up of three layers of a silicon nitride film/a silicon oxynitride film (silicon oxide film)/a silicon nitride film which are made of silicon nitride. The first electrode layer 117 made of indium tin oxide containing silicon oxide is preferably formed close in contact with the gate insulating layer 106 made of silicon nitride. Accordingly, an effect of increasing a rate at which light generated in an electroluminescent layer is emitted outside can be caused. The gate insulating layer may be interposed between the gate wiring layer or the gate electrode layer and the first electrode layer and may function as a capacitor element.

In addition, a composition including a particle of a metal such as Ag (silver), Au (gold), Cu (copper), W (tungsten), or Al (aluminum) as its main component can be used when generated light is emitted to an opposite side of the substrate 100 or when a top emission type EL display panel is manufactured. As another method, the first electrode layer 117 may be formed by forming a transparent conductive film or a light-reflective conductive film by a sputtering method, forming a mask pattern by a droplet discharge method, and additionally performing an etching process.

The first electrode layer 117 may be polished by a CMP method or by cleaning with a porous body of polyvinyl alcohol so that the surface thereof is planarized. Furthermore, the surface of the first electrode layer 117 may be irradiated with an ultraviolet ray or may be treated with oxygen plasma after polishing by the CMP method.

Subsequently, an insulating layer 120 to be a second insulating layer is selectively formed, and a source wiring layer 118 and a power supply line 119 are formed by a droplet discharge method to fill in an opening in the insulating layer 120 (ref. FIG. 7 and FIGS. 22A, 22B, and 22C). The insulating layer 120 may be formed to have an opening over the first electrode layer 117 as well as formation regions of the source wiring layer 118 and the power supply line 119. In this embodiment mode, the insulating layer 120 is entirely formed and is etched and patterned using a mask of a resist or the like. The insulating layer 120, the source wiring layer 118, and the power supply line 119 can be formed with a similar step to that in forming the above-described insulating layers 102a and 102b and the gate wiring layer 103. Accordingly, the insulating layer 120 can be selectively formed earlier and the source wiring layer 118 and the power supply line 119 can be formed later, or they can be formed simultaneously. The source wiring layer 118 and the power supply line 119 are formed to be in contact with the source-drain electrode layers 111 and 115, respectively. The base pretreatment may be performed on formation regions thereof as described above.

A composition including a particle of a metal such as Ag (silver), Au (gold), Cu (copper), W (tungsten), or Al (aluminum) as its main component can be used as a conductive material for forming the source wiring layer 118 and the power supply line 119. In addition, light-transmitting indium tin oxide (ITO), ITSO made of indium tin oxide and silicon oxide, organic indium, organic tin, zinc oxide, titanium nitride, and the like may be used in combination.

The insulating layer 120 can be formed by using an inorganic insulating material such as silicon oxide, silicon nitride, silicon oxynitride, aluminum oxide, aluminum nitride, or aluminum oxynitride; acrylic acid; methacrylic acid; a derivative of acrylic acid or methacrylic acid; a heat-resistant high molecular weight material such as polyimide, aromatic polyamide, or polybenzimidazole; or inorganic siloxane or an organosiloxane-based insulating material in which hydrogen bonded with silicon is substituted by an organic group such as metyl or phenyl, including a Si—O—Si bond among compounds that contain silicon, oxygen, and hydrogen and that are formed by using a siloxane material as a starting material. It may be formed by using a photosensitive or non-photosensitive material such as acrylic or polyimide.

After the insulating layer 120, the source wiring layer 118, and the power source line 119 are formed by discharging a composition with a droplet discharge method, a surface thereof may be pressed with pressure to be planarized in order to improve its planarity. As a method for pressing, unevenness may be reduced to smooth the surface by sweeping the surface with a roller, or the surface may be perpendicularly pressed with a flat plate. Alternatively, the surface may be softened or melted with a solvent or the like and an uneven portion on the surface may be removed with an air knife. Further, it may be polished by using a CMP method. The steps can be applied in planarizing the surface when unevenness is generated due to a droplet discharge method. When planarity is improved according to this step, a display panel can be prevented from uneven display and high definition image can be displayed.

According to the above-described steps, a substrate having a bottom gate type (also referred to as an inversely staggered type) TFT is completed. In addition, the TFT in this embodiment mode is a channel etch type.

Figure 23A:
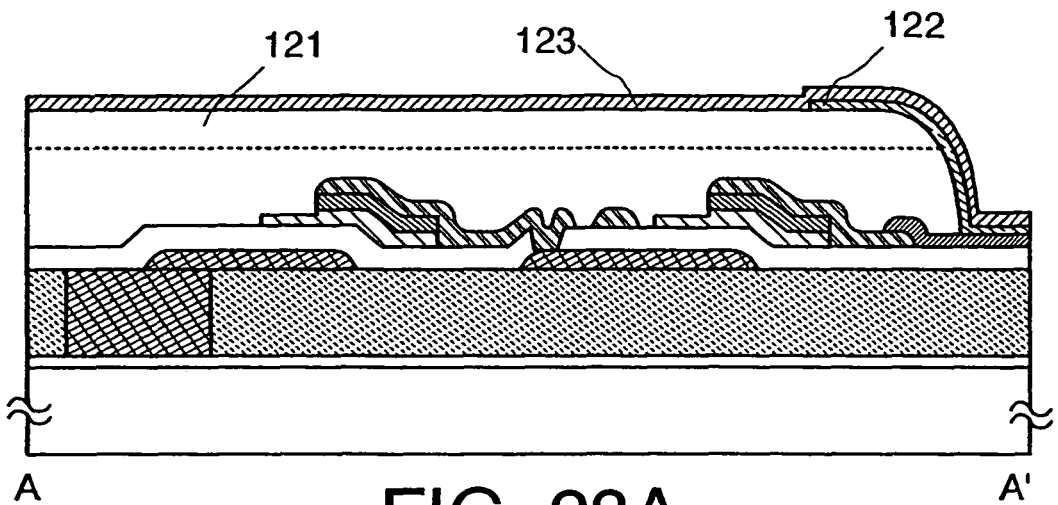
FIGS. 23A to 23C show a method for manufacturing a display device of the present invention.
Figure 23B:
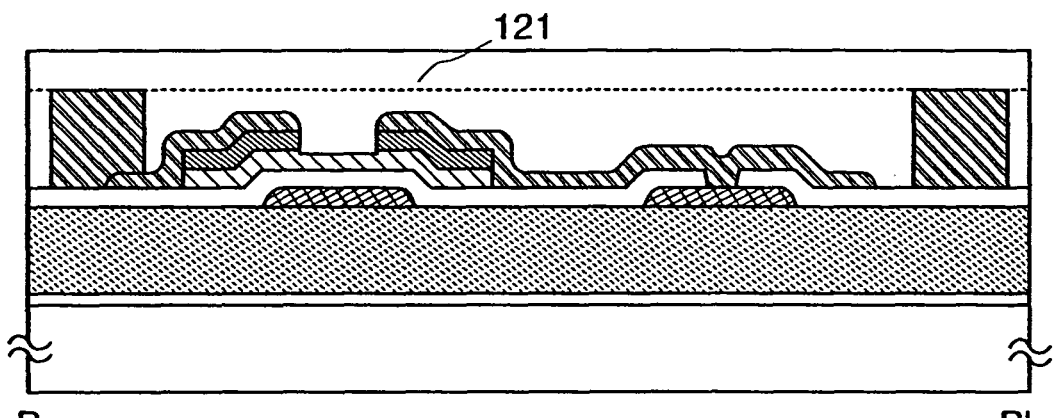
Figure 23C:
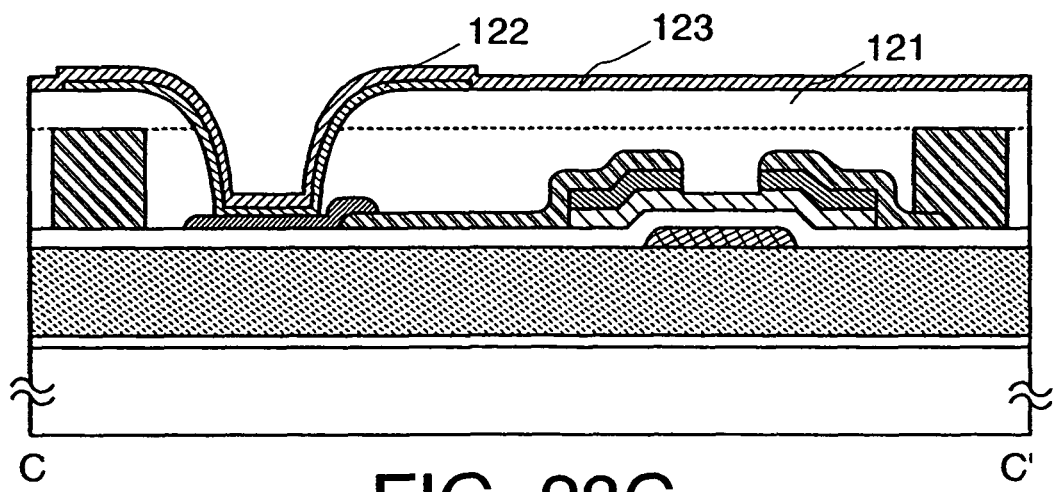

A light emitting element is formed over the substrate 100 having a TFT for a display panel (ref. FIGS. 23A, 23B, and 23C). After the source wiring layer 118 and the power supply line 119 are formed, the insulating layer 121 is formed. The insulating layer 121 can be formed with a similar material to the insulating layer 120. The insulating layer 121 as well as the insulating layer 120 becomes a partition wall (also referred to as a bank).

Moisture adsorbed inside the insulating layers 120 and 121 or to a surface thereof is removed by performing heat treatment at 200° C. under atmospheric pressure before forming an electroluminescent layer 122. In addition, heat treatment is performed at a temperature of from 200° C. to 400° C., preferably, from 250° C. to 350° C. under reduced pressure, and the electroluminescent layer 122 is preferably formed by a vacuum vapor deposition method or a droplet discharge method under reduced pressure without being exposed to atmospheric air.

Materials showing luminescence of red (R), green (G), and blue (B) are selectively formed as the electroluminescent layer 122 by a vapor deposition method or the like using respective vapor-deposition mask. The materials showing luminescence of red (R), green (G), and blue (B) (a low molecular weight or high molecular weight material, or the like) can be formed by a droplet discharge method similarly to a color filter. This case is preferable since it can be separately colored with RGB without using a mask. A second electrode layer 123 is laminated over the electroluminescent layer 122, and then, a display device (light emitting display device) having a display function using a light emitting element is completed (ref. FIGS. 23A, 23B, and 23C).

It is effective to provide a passivation film to cover the second electrode layer 123, although not shown. The passivation film is made of an insulating film including silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide having larger nitrogen content than oxygen content (AlNO), aluminum oxide, diamond like carbon (DLC), or a nitrogen-containing carbon film ($CN_x$), and a single layer or a combined laminated layer of the insulating film can be used. For example, a laminated layer of a nitrogen-containing carbon film ($CN_x$)\silicon nitride (SiN), or an organic material can be used, and a laminated layer of a high molecular weight material such as a styrene polymer may be used. In addition, a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

In this case, a film having favorable coverage is preferably used as the passivation film, and it is effective to use a carbon film, specifically, a DLC film. Since the DLC film can be formed at a temperature of from room temperature to 100° C., it can be easily formed over the electroluminescent layer having low heat resistance. The DLC film can be formed by a plasma CVD method (typically, an RF plasma CVD method, a microwave CVD method, an electron cyclotron resonance (ECR) CVD method, a hot filament CVD method, or the like), a combustion flame method, a sputtering method, an ion beam vapor deposition method, a laser vapor deposition method, or the like. As a reactive gas to be used for film formation, a hydrogen gas and a hydrocarbon gas (for example, $CH_4$, $C_2H_2$, $C_6H_6$, or the like) are used. The gases are ionized by glow discharge, and ions are accelerated to collide against a cathode, to which a negative self-bias is applied, to form a film. In addition, a nitrogen-containing carbon film ($CN_x$ film) may be formed using a $C_2H_4$ gas and an $N_2$ gas as a reactive gas. The DLC film has a high blocking effect against oxygen and can suppress oxidation of the electroluminescent layer. Therefore, a problem of oxidizing the electroluminescent layer can be prevented during the following sealing step.

Subsequently, a sealant is formed and sealing is performed using a sealing substrate. Thereafter, the gate wiring layer 103 may be connected to a flexible wiring board and be electrically connected to the exterior. The same applies to the source wiring layer 118.

Note that this embodiment mode shows the case where a light emitting element is sealed with the glass substrate. Sealing treatment is treatment for protecting the light emitting element from moisture. Any one of a method for sealing with a cover material, a method for sealing with a thermosetting resin or a UV curing resin, and a method for sealing with a thin film having high barrier capability such as metal oxide or nitride is employed. Glass, ceramics, plastic, or metal can be used as the cover material; however, the cover material is required to be light-transmitting when light is emitted to the cover material side. The cover material and the substrate over which the light emitting element is formed are attached to each other using a sealant such as a thermosetting resin or an ultraviolet curing resin. A sealed space is formed by curing the resin with heat treatment or ultraviolet light irradiation treatment. It is also effective to provide a hygroscopic material typified by barium oxide inside the sealed space. The hygroscopic material may be provided over the sealant to be in contact therewith, or may be provided over the partition wall or in a peripheral portion which does not block light from the light emitting element. Furthermore, a space between the cover material and the substrate over which the light emitting element is formed can be filled with a thermosetting resin or an ultraviolet curing resin. In this case, it is effective to add a hygroscopic material typified by barium oxide to the thermosetting resin or the ultraviolet curing resin.

Figure 14A:
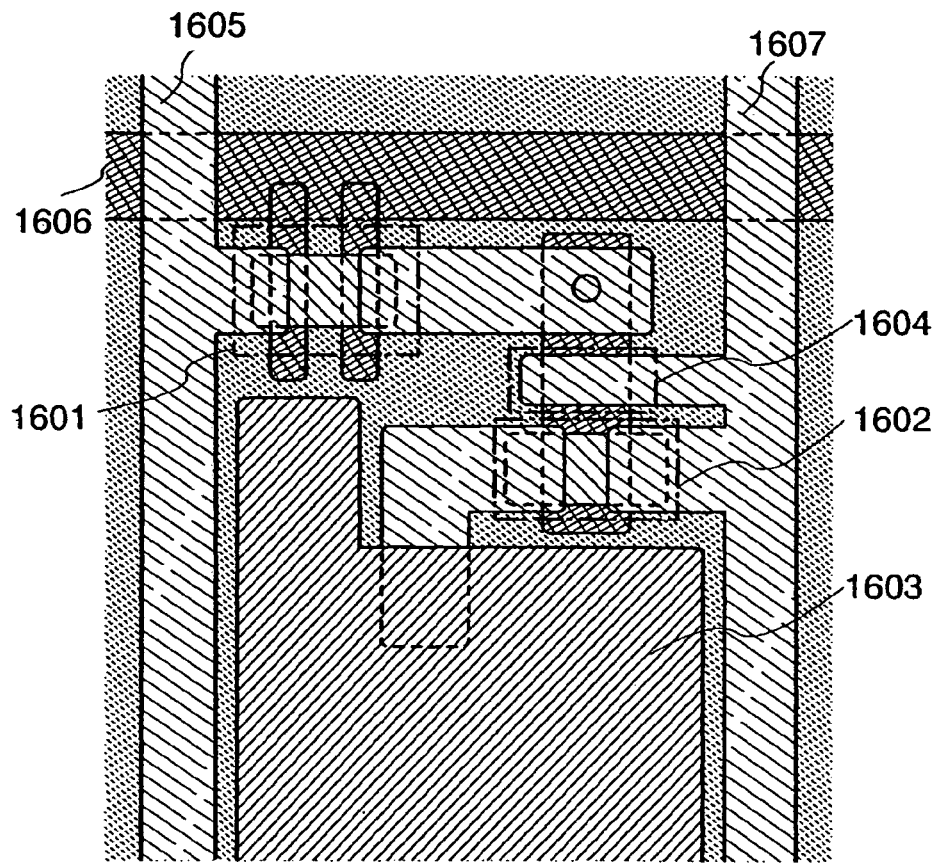
FIGS. 14A and 14B show a method for manufacturing a display device of the present invention.
Figure 14B:
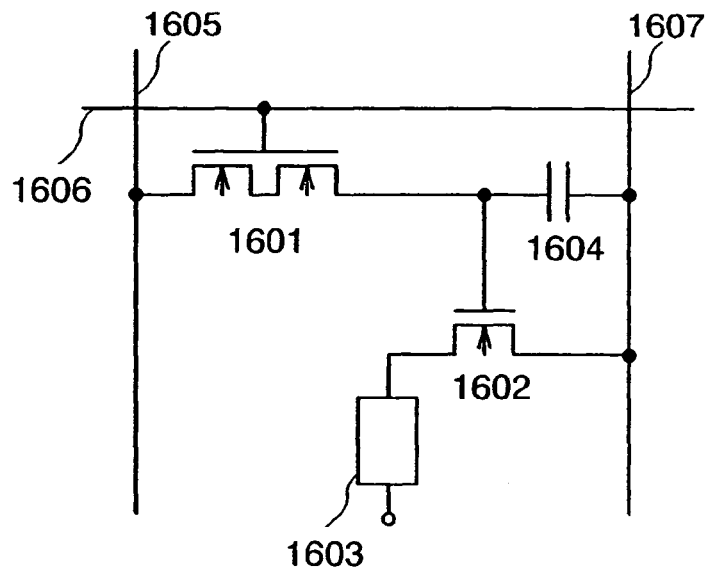

In this embodiment mode, a switching TFT having a single gate structure is described; however, a multi gate structure such as a double gate structure may be employed. FIG. 14A is a top view of a pixel portion in a display device having a TFT 1601 as a double gate structure switching TFT and FIG. 14B is a circuit diagram thereof. Reference numerals 1601 and 1602 denote TFTs; 1603, a light emitting element; 1604, a capacitor; 1605, a source wiring layer; 1606, a gate wiring layer; and 1607, a power supply line. The TFT 1601 is a transistor which controls a connection state with the signal line (hereinafter also referred to as a "switching transistor" or a "switching TFT"). The TFT 1602 is a transistor which controls a current flowing to the light emitting element (hereinafter also referred to as a "driving transistor" or a "driving TFT"), and the driving TFT is connected in series with the light emitting element. The capacitor 1604 holds source-gate voltage of the TFT 1602.

As described above, the steps can be omitted in this embodiment mode by not applying a light exposure step utilizing a photomask. In addition, an EL display panel can be easily manufactured by directly forming various patterns over a substrate with a droplet discharge method even when a glass substrate of the fifth or the following generation having a side of more than 1000 mm is used.

In addition, a highly reliable EL display panel in which adhesion is improved can be manufactured.

EMBODIMENT MODE 2

An embodiment mode of the present invention is described with reference to FIG. 8. This embodiment mode describes the case of using a channel protective thin film transistor as a thin film transistor in Embodiment Mode 1. Therefore, repetitive description of the same portion or a portion having a similar function is omitted. Note that FIG. 8 corresponds to a cross-sectional view of a channel etch thin film transistor in FIG. 23C.

An insulating layer 102b is formed over a substrate 100, and a gate wiring layer is formed by discharging a composition including a conductive material with a droplet discharge method. A gate electrode layer 105 is formed by a droplet discharge method to be in contact with the gate wiring layer. Subsequently, a gate insulating layer 106 is formed by using a plasma CVD method or a sputtering method to be a single layer or to have a laminated structure. A specifically preferable mode of the gate insulating layer corresponds to a lamination body of three layers of an insulating layer made of silicon nitride, an insulating layer made of silicon oxide, and an insulating layer made of silicon nitride. Furthermore, up to a semiconductor layer 108 functioning as an active layer is formed. The above-described steps are similar to those in Embodiment Mode 1.

The semiconductor layer 108 is formed, and an insulating film is formed by a plasma CVD method or the like and is patterned to have a desired shape in a desired region in order to form a channel protective film 140. At this time, the channel protective film 140 can be formed by exposing a back of the substrate to light using the gate electrode as a mask. In addition, polyimide, polyvinyl alcohol, or the like may be dropped by a droplet discharge method as the channel protective film 140. Consequently, the light-exposure step can be omitted.

A film made of one or a plurality of inorganic materials (silicon oxide, silicon nitride, silicon oxynitride, silicon nitride oxide, and the like), photosensitive or non-photosensitive organic materials (organic resin materials) (polyimide, acrylic, polyamide, polyimide amide, a resist, benzocyclobutene, and the like), a Low k material having a low dielectric constant, and the like, or a laminated layer of them can be used as the channel protective film 104. In addition, a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used. A vapor phase growth method such as a plasma CVD method or a thermal CVD method or a sputtering method can be employed as a manufacturing method. In addition, a droplet discharge method or a printing method (a method for forming a pattern, such as screen printing or offset printing) can be employed. A TOF film, an SOG film, or the like obtained by an application method can be used.

An N type semiconductor layer 110 is formed over the semiconductor layer 108 and the channel protective film 140. Next, a mask is formed over the semiconductor layer 108 and the N type semiconductor layer 110 by selectively discharging a composition. Subsequently, the semiconductor layer 108 and the N type semiconductor layer 110 are simultaneously etched utilizing the mask to form a semiconductor layer and an N type semiconductor layer. Thereafter, a composition including a conductive material is discharged onto the semiconductor layer 108 to form source-drain electrode layers 113 and 115.

Next, the N type semiconductor layer 110 is etched using the source-drain electrode layers 113 and 115 as a mask. Then, a first electrode layer 117 is formed to be in contact with the source-drain electrode layer 113 by discharging a composition including a conductive material. Subsequently, an insulating layer 120 is selectively formed, and a source wiring layer 118 and a power supply line 119 are formed by a droplet discharge method to fill in an opening in the insulating layer 120. Similarly to Embodiment Mode 1, the insulating layer 120, the source wiring layer 118, and the power supply line 119 may be simultaneously formed, and the above-described base pretreatment may be performed before and after the formation. Thereafter, a press step may be carried out to planarize the surface.

Figure 8:
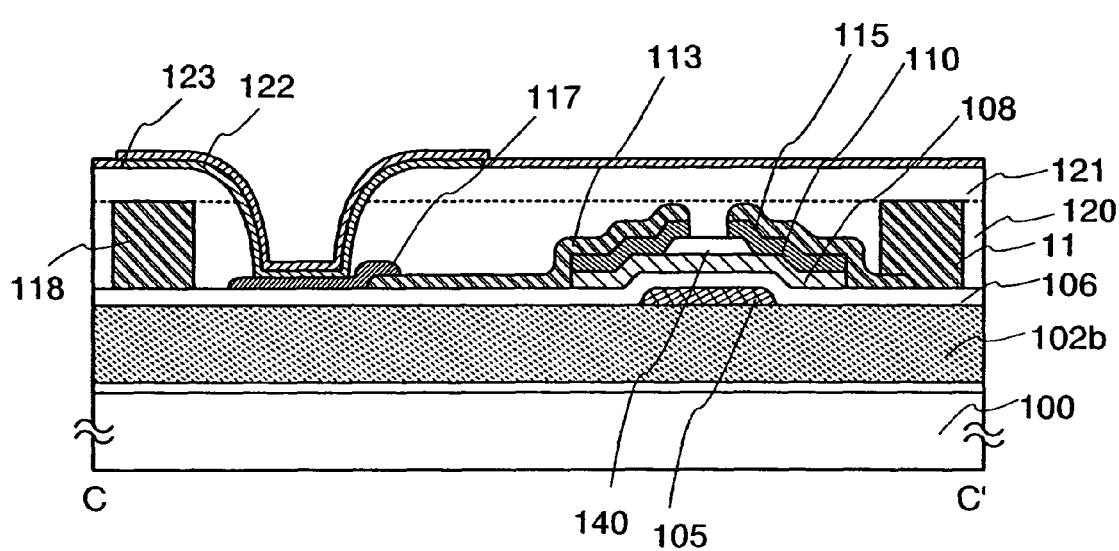
FIG. 8 shows a method for manufacturing a display device of the present invention.
Figure 9:
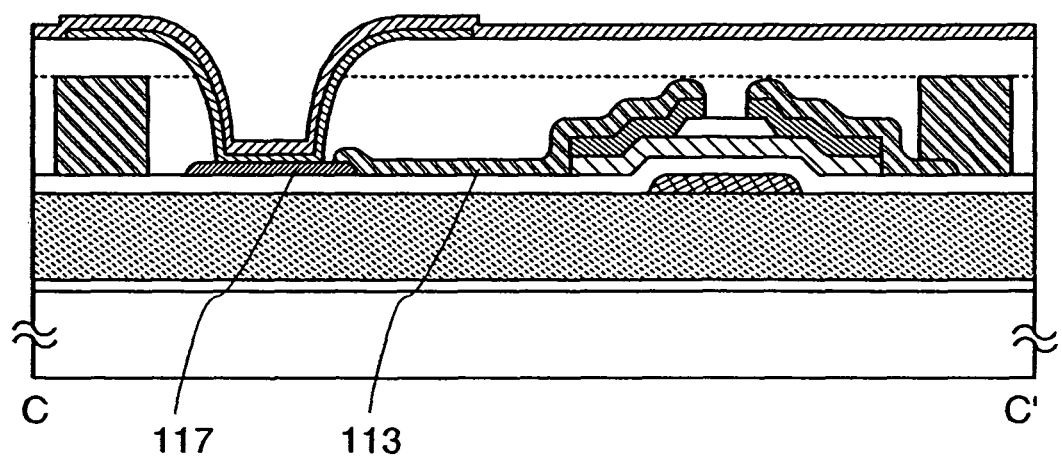
FIG. 9 shows a method for manufacturing a display device of the present invention.

FIG. 9 shows an example of a different structure in connection between the first electrode layer 117 and the source-drain electrode layer 113 from that of an EL display panel in FIG. 8. In FIG. 9, the first electrode layer 117 is formed earlier than the source-drain electrode layer 113, and the source-drain electrode layer 113 is formed to be in contact with the first electrode layer 117.

Subsequently, an insulating layer 121 is formed and an opening is formed over the first electrode layer, and then, an electroluminescent layer 122 and a second electrode layer 123 are formed. Further, a sealant is formed and sealing is performed using a sealing substrate. Thereafter, the gate wiring layer 103 may be connected to a flexible wiring board. According to the above-described steps, an EL display panel having a display function can be manufactured.

Hereinbefore, an example of an inversely staggered thin film transistor is described in Embodiment Modes 1 and 2. However, the present invention can be applied to a staggered thin film transistor. In the case of a staggered thin film transistor, a source wiring layer is formed first to fill in an opening in an insulating layer, and then, a minute source-drain electrode layer in a pixel portion is formed by a droplet discharge method to be in contact with the source wiring layer. Accordingly, both a lower resistant source wiring layer and a minuter electrode layer can be realized similarly to the case of an inversely staggered thin film transistor.

EMBODIMENT MODE 3

Figure 15:
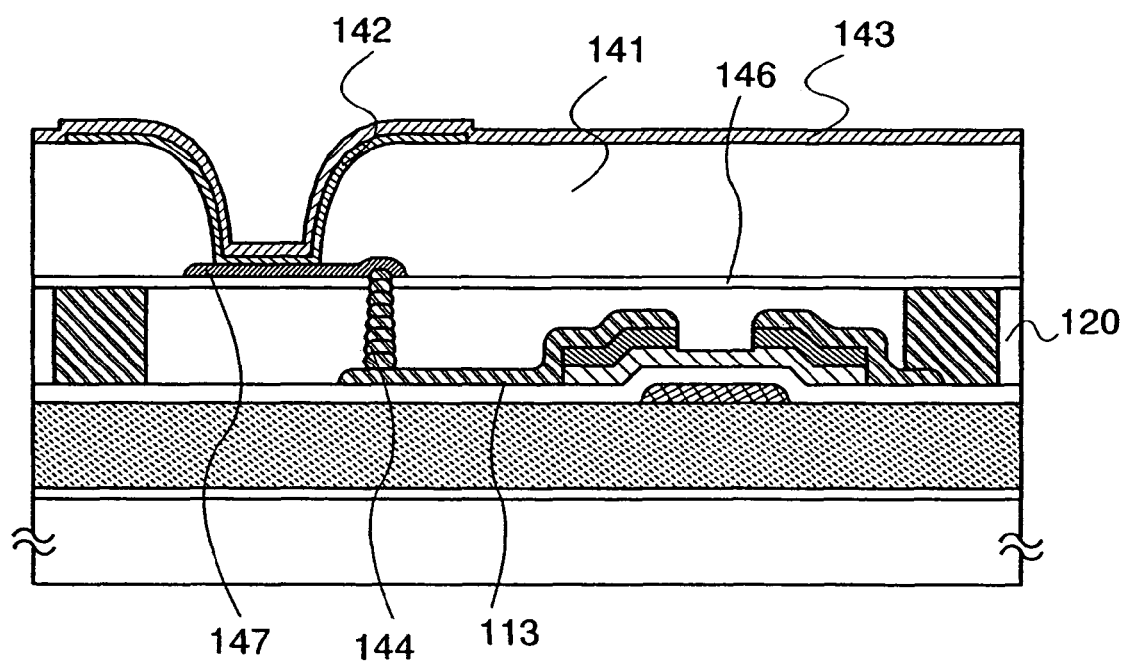
FIG. 15 shows a cross-sectional view of a display device of the present invention.
Figure 16A:
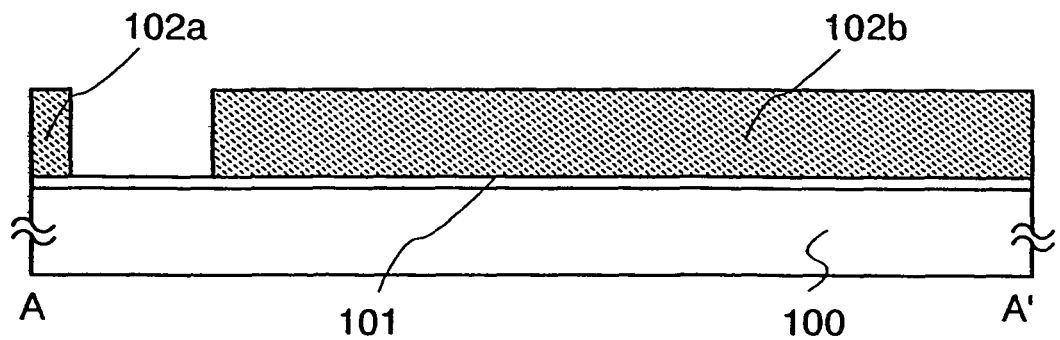
FIGS. 16A to 16C show a method for manufacturing a display device of the present invention.
Figure 16B:
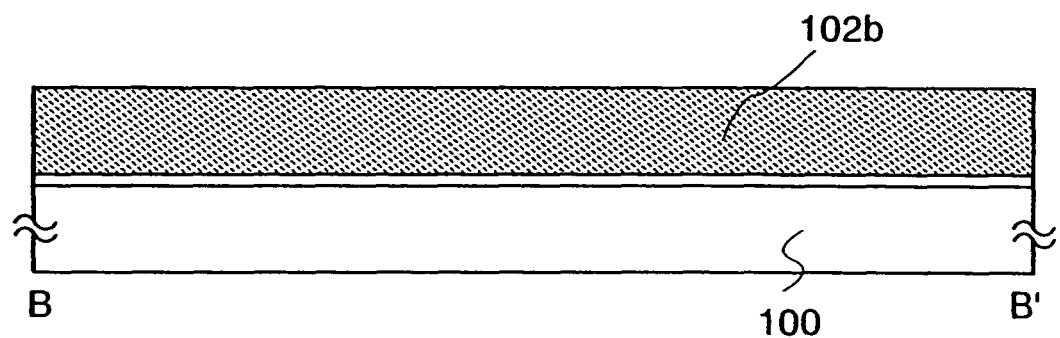
Figure 16C:
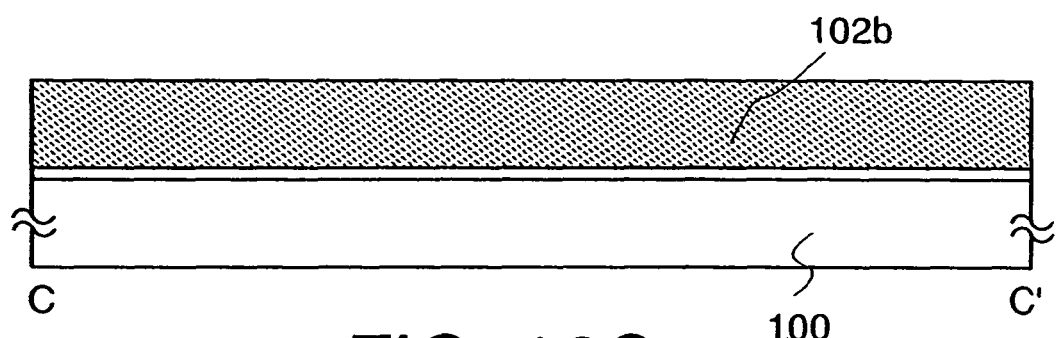
Figure 17A:
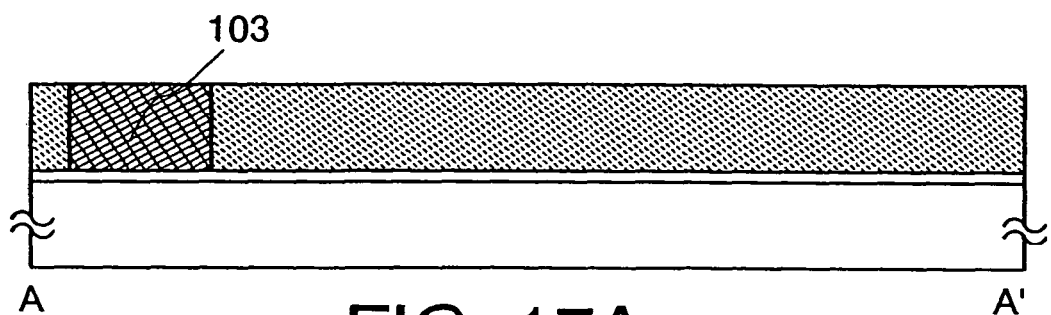
FIGS. 17A to 17C show a method for manufacturing a display device of the present invention.
Figure 17B:
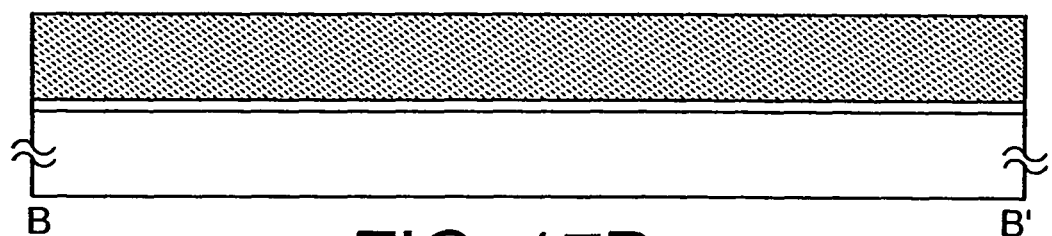
Figure 17C:
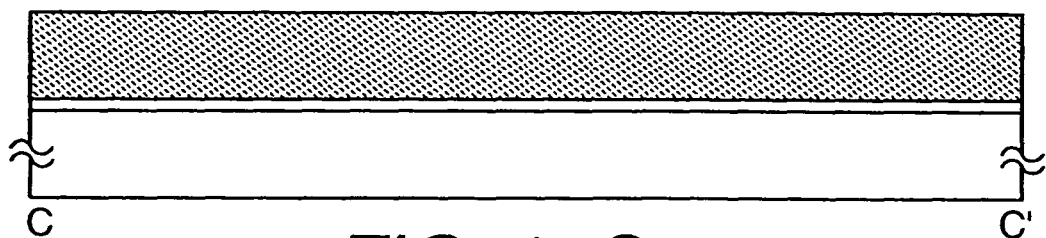
Figure 18A:
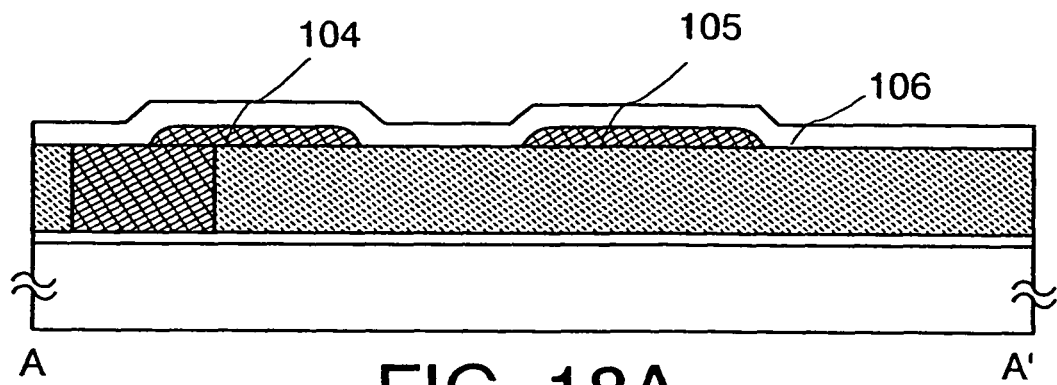
FIGS. 18A to 18C show a method for manufacturing a display device of the present invention.
Figure 18B:
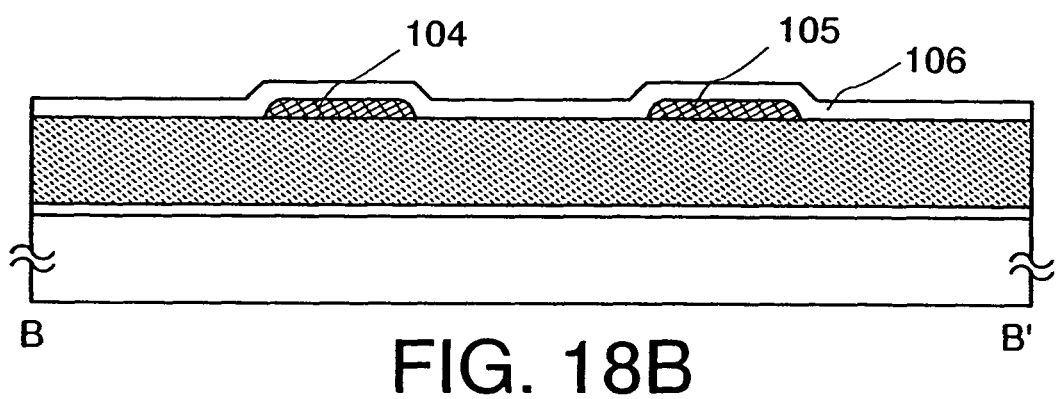
Figure 18C:
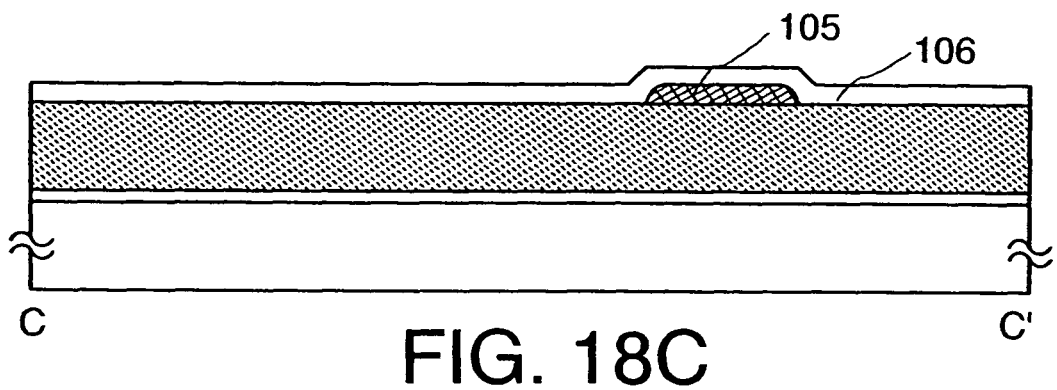
Figure 19A:
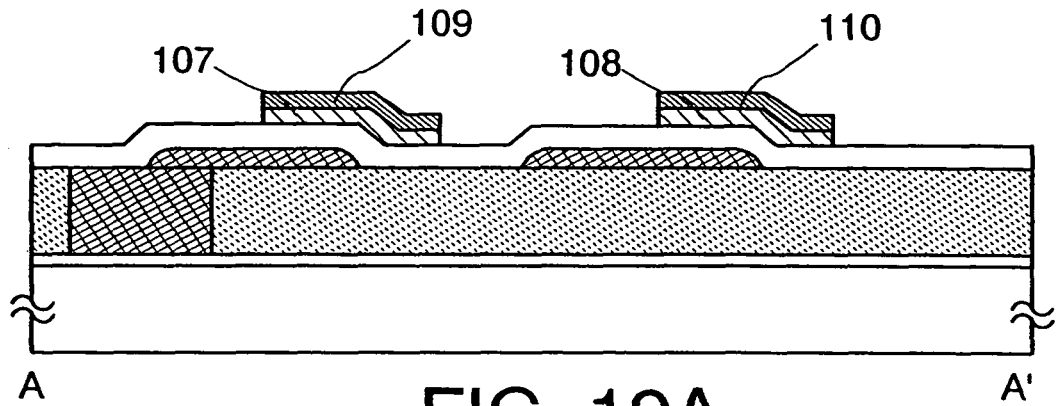
FIGS. 19A to 19C show a method for manufacturing a display device of the present invention.
Figure 19B:
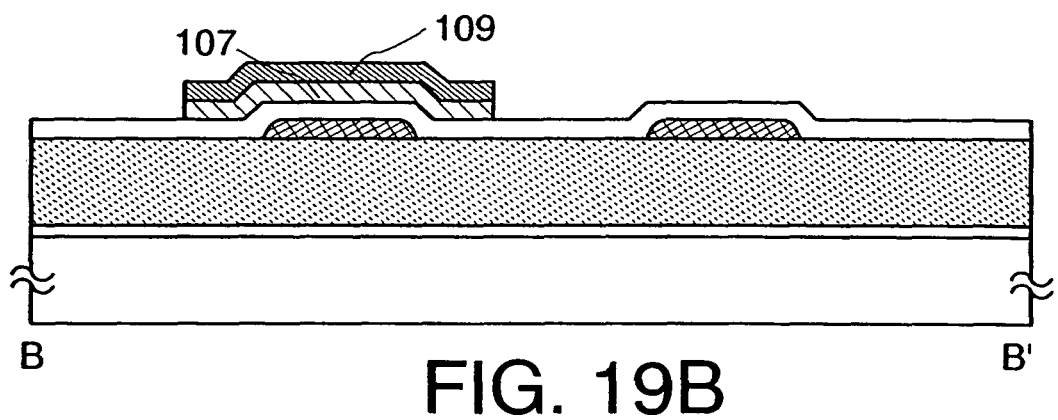
Figure 19C:
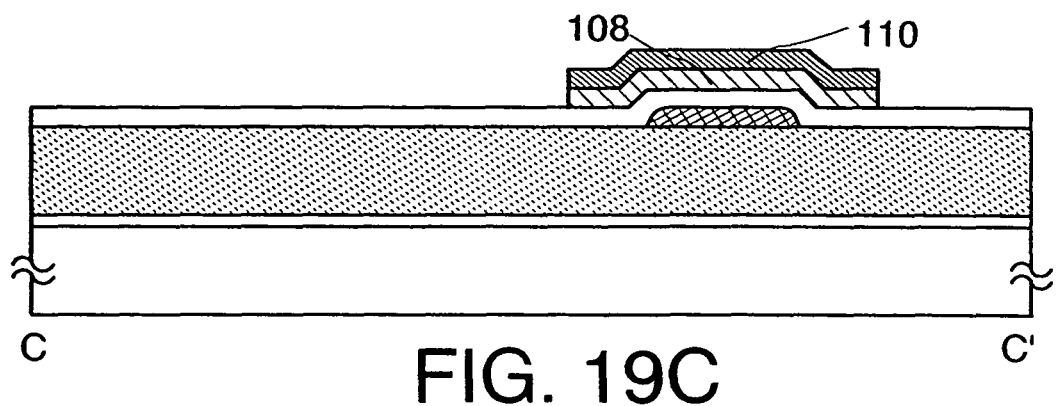
Figure 20A:
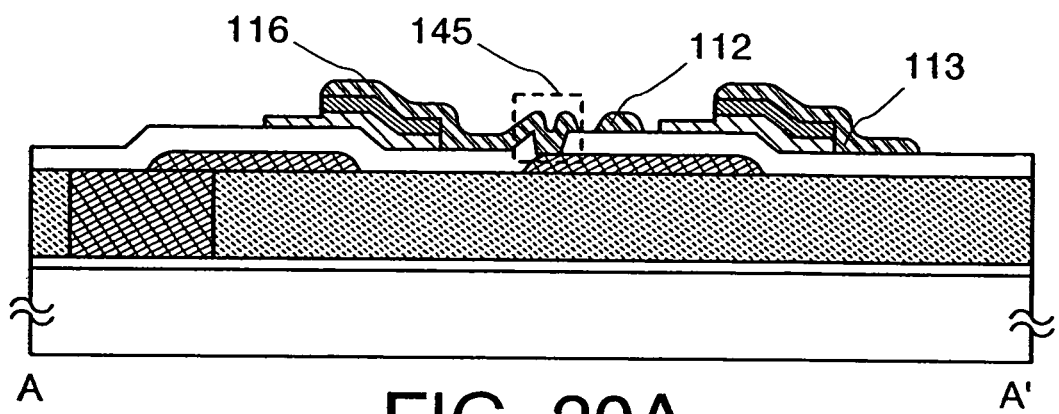
FIGS. 20A to 20C show a method for manufacturing a display device of the present invention.
Figure 20B:
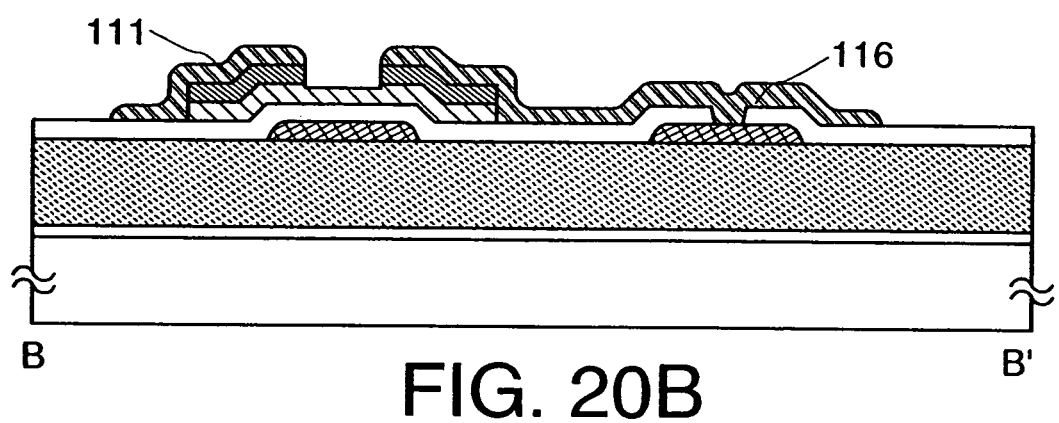
Figure 20C:
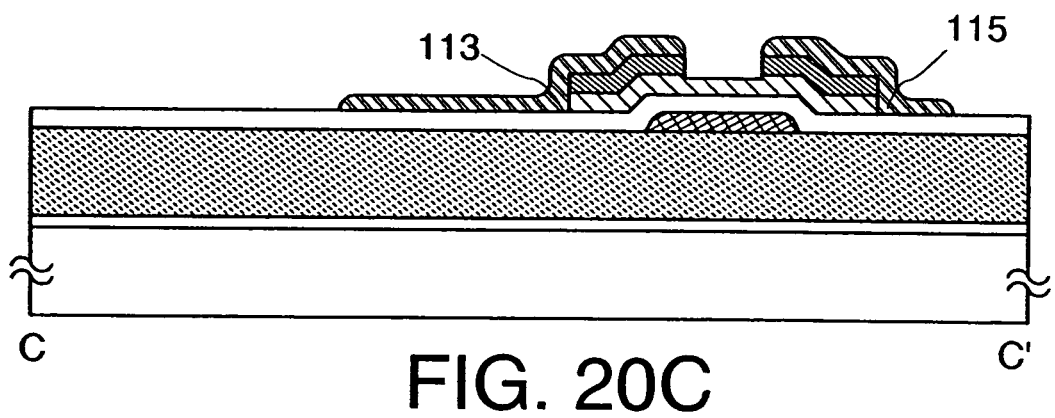
Figure 21A:
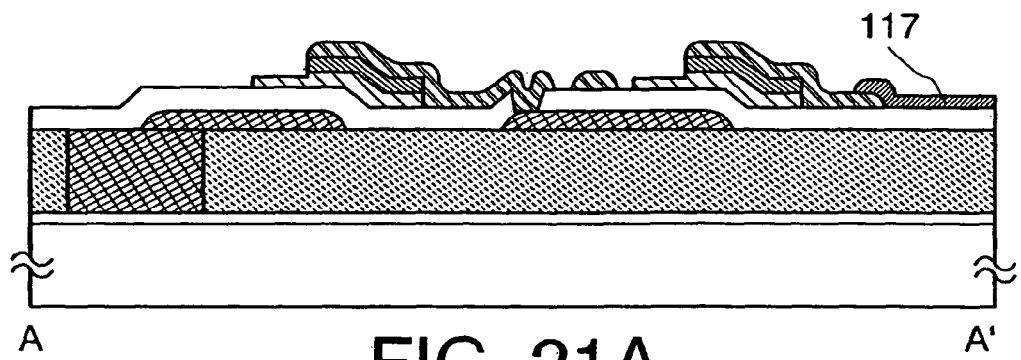
FIGS. 21A to 21C show a method for manufacturing a display device of the present invention.
Figure 21B:
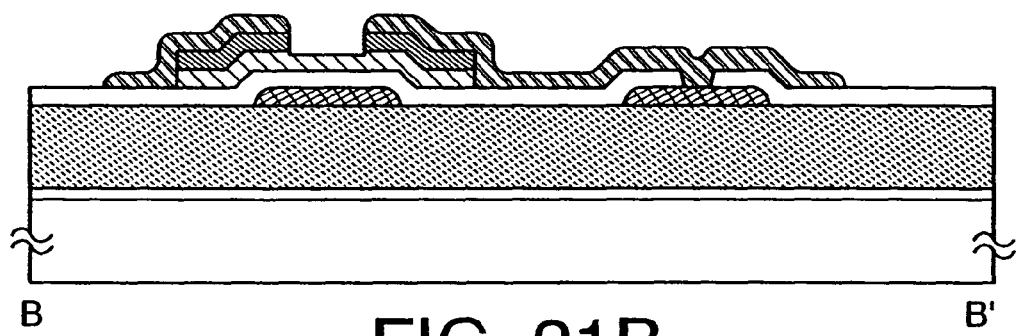
Figure 21C:
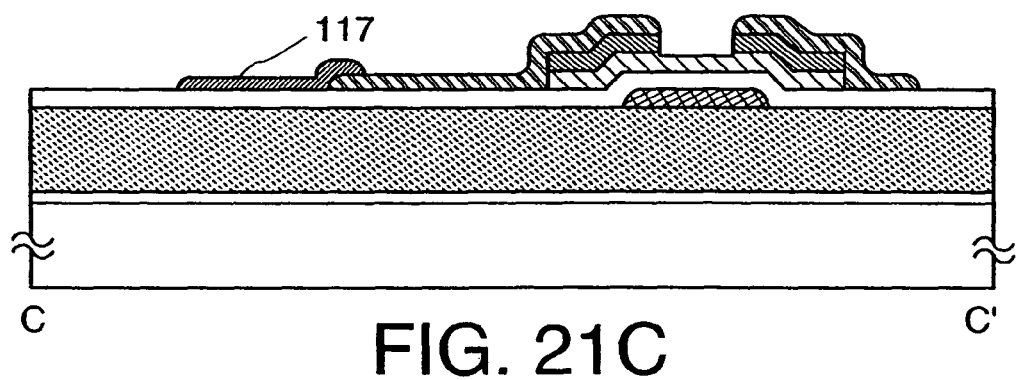
Figure 22A:
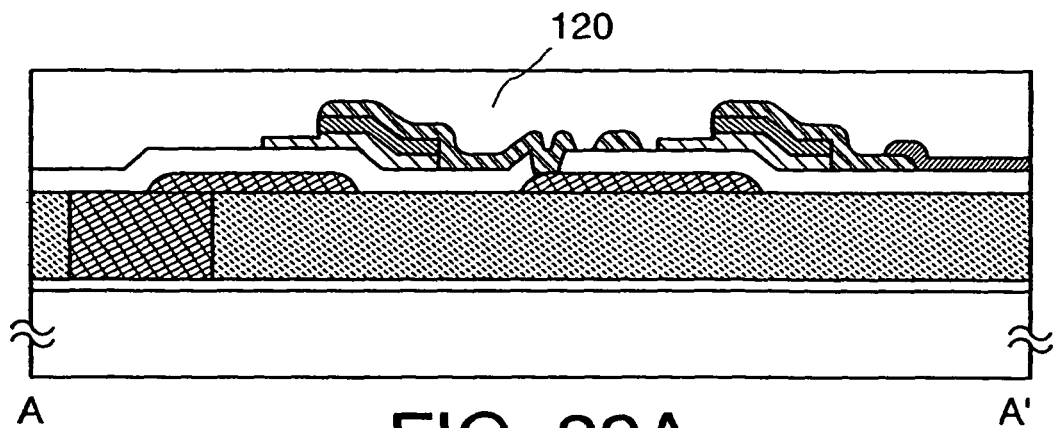
FIGS. 22A to 22C show a method for manufacturing a display device of the present invention.
Figure 22B:
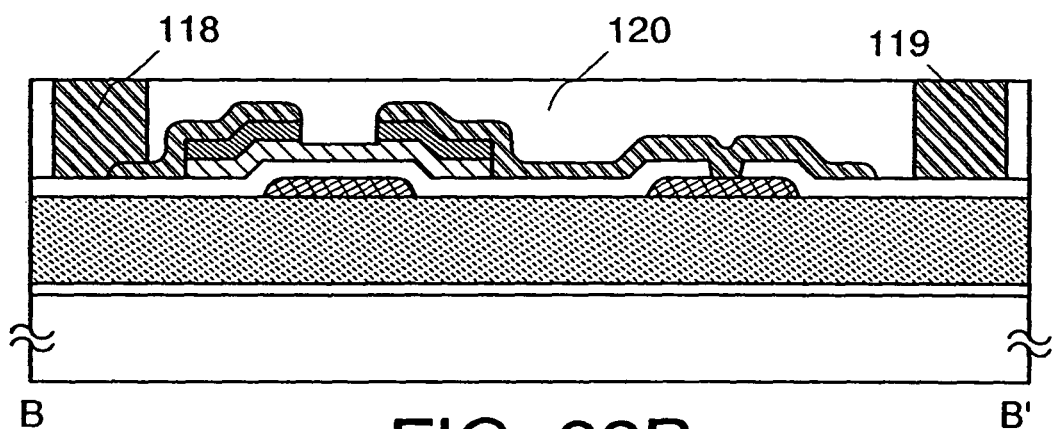
Figure 22C:
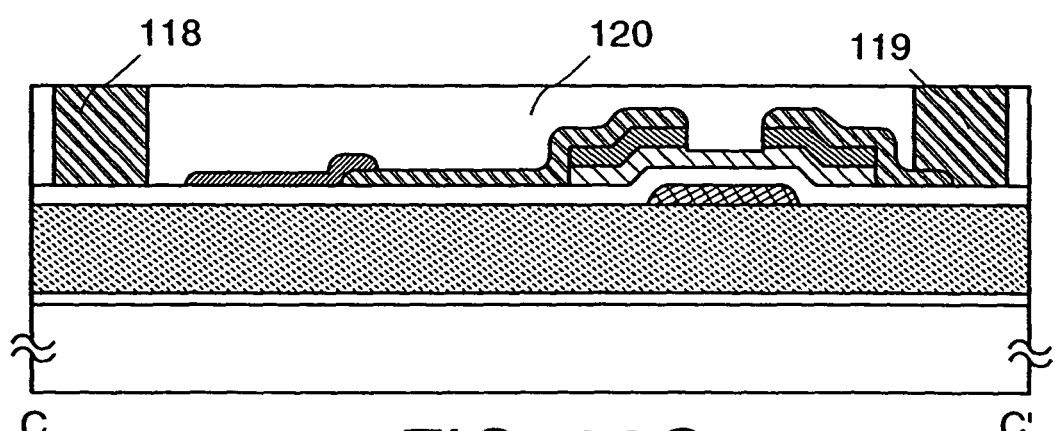

This embodiment mode is different from the channel etch type thin film transistor manufactured in Embodiment Mode 1 in a connection structure with a first electrode layer, which is described with reference to FIG. 15.

Steps up to forming a source-drain electrode layer 113 are similar to those in Embodiment Mode 1. Next, a columnar conductive layer 144 to function as a pillar is formed. In this embodiment mode, conductive layers are laminated using a droplet discharge method to form the columnar conductive layer 144. The columnar conductive layer 144 may be formed either before or after the insulating layer 120 is formed. In the case of forming the insulating layer 120 earlier, a contact hole in which the columnar conductive layer 144 is to be formed can be formed together with an interlayer insulating film by selectively forming the insulating layer 120 with a droplet discharge method.

As another method, a material which repels the insulating layer 120 is discharged by a droplet discharge method to a lower-layer wiring in a portion where an upper-layer wiring and the lower-layer wiring are to be electrically connected. The insulating layer 120 is not formed in the region where the repellent material is formed due to repellent property of the repellent material. Thus, an opening (contact hole) is formed in the insulating layer 120. Then, the columnar conductive layer 144 can be formed by discharging a conductive material into the opening. An insulating layer 146 is formed over the insulating layer 120. When the columnar conductive layer 144 is covered with the insulating layer 146, the insulating layer 146 is etched to expose the columnar conductive layer 144. A silicon nitride film formed by plasma CVD or the like may be used as the insulating layer 146.

A first electrode layer 147 is formed to be in contact with the columnar conductive layer 144, and an insulating layer 141 to be a partition wall is formed. An electroluminescent layer 142 is formed over the first electrode layer 147, and then, a second electrode layer 143 is formed. Further, a sealant is formed and sealing is performed using a sealing substrate. Thereafter, the gate wiring layer may be connected to a flexible wiring board. According to the above-described steps, an EL display panel having a display function can be manufactured.

EMBODIMENT MODE 4

A thin film transistor can be formed by applying the present invention, and a display device (light emitting display device) can be formed by using the thin film transistor. In the case of using a light emitting element and using an N type transistor as a transistor for driving the light emitting element, light emission from the light emitting element is any one of bottom emission, top emission, and dual emission. Here, a laminated structure of a light emitting element for any case is described with reference to FIGS. 10A to 10C.

A transistor 481 that is the channel protective thin film transistor formed in Embodiment Mode 2 by applying the present invention is used in this embodiment mode.

First, the case of emitting light to a substrate 480 side, that is, the case of bottom emission is described with reference to FIG. 10A. In this case, source-drain wirings 482 and 483, a transparent first electrode 484, an electroluminescent layer 485, and a second electrode 486, which are to be electrically connected to a transistor 481, are sequentially laminated. Next, the case of emitting light to an opposite side of a substrate 480, that is, the case of top emission is described with reference to FIG. 10B. Source-drain wirings 461 and 462, a first electrode 463, an electroluminescent layer 464, and a transparent second electrode 465, which are to be electrically connected to a transistor 481, are sequentially laminated. Even if the first electrode 463 transmits light, the light is reflected by the source-drain wiring 462 and emitted to the opposite side of the substrate 480 according to the above structure. Note that a light-transmitting material need not be used for the first electrode 463 in this structure. Lastly, the case of emitting light to a substrate 480 side and to an opposite side thereof, that is, the case of dual emission is described with reference to FIG. 10C. Source-drain wirings 470 and 471, a first electrode 472, an electroluminescent layer 473, and a second electrode 474, which are to be electrically connected to a transistor 481, are sequentially laminated. At this time, dual emission is accomplished when both the first electrode 472 and the second electrode 474 are made of a light-transmitting material or are formed to have a thickness that can transmit light.

The light emitting element has a structure in which the electroluminescent layer is sandwiched between the first electrode and the second electrode. It is necessary to select materials of the first electrode and the second electrode in consideration of a work function. Both the first electrode and the second electrode can be an anode or a cathode depending on a pixel structure. Since polarity of a driving TFT is an N channel type in this embodiment mode, the first electrode is preferably a cathode and the second electrode is preferably an anode. When polarity of the driving TFT is a P channel type, the first electrode is preferably an anode and the second electrode is preferably a cathode.

When the first electrode is an anode, the electroluminescent layer is preferably formed by sequentially laminating an HIL (hole injection layer), an HTL (hole transport layer), an EML (emission layer), an ETL (electron transport layer), and an EIL (electron injection layer) from the first electrode side. When the first electrode is a cathode, a structure of the electroluminescent layer becomes the reverse. It is preferable to sequentially laminate an EIL (electron injection layer), an ETL (electron transport layer), an EML (emission layer), an HTL (hole transport layer), an HIL (hole injection layer), and an anode that is the second electrode from the first electrode side. Note that the electroluminescent layer can have a single layer structure or a combined structure as well as a laminated structure.

Materials showing luminescence of red (R), green (G), and blue (B) may be selectively formed as the electroluminescent layer by a vapor deposition method using respective vapor deposition masks or the like. The materials showing luminescence of red (R), green (G), and blue (B) (such as a low molecular weight or high molecular weight material) can be formed by a droplet discharge method using a vapor deposition mask, which is preferable since coloring of RGB can be separately performed in this case without using a mask similarly to a color filter.

Specifically, CuPc or PEDOT is used as the HIL; α-NPD, as the HTL; BCP or $Alq_3$, as the ETL; BCP:Li or $CaF_2$, as the EIL, respectively. When light-transmitting ITO or ITSO is used for the second electrode in the case of top emission, BzOS—Li in which Li is added to a benzoxazole derivative (BzOS) or the like can be used. In addition, Alq$_3$ doped with a dopant corresponding to respective luminescence colors of R, G, and B (DCM or the like in the case of R, and DMQD or the like in the case of G) may be used as the EML, for example.

Note that the electroluminescent layer is not limited to the above materials. For example, a hole injection property can be enhanced by co-evaporating oxide such as molybdenum oxide (MoO$_x$: X=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer.

Figure 10A:
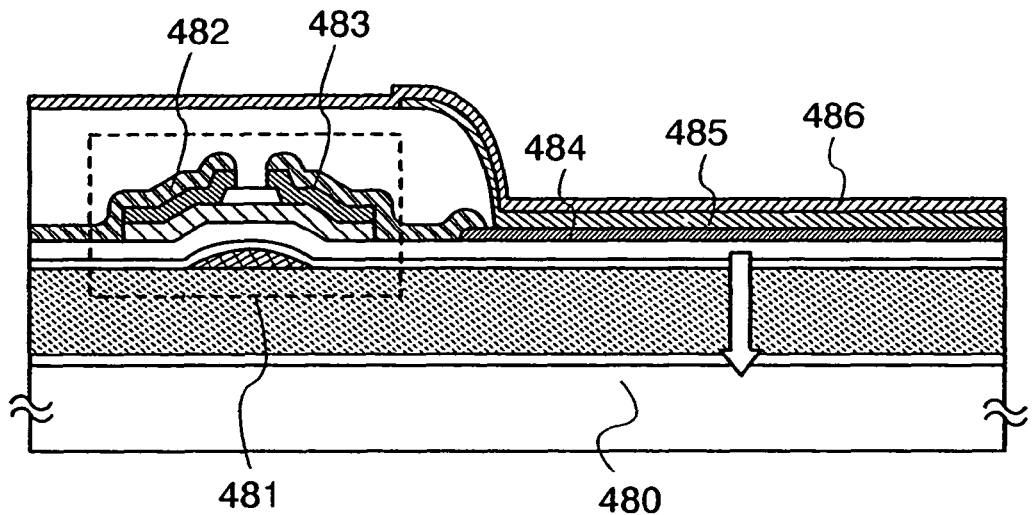
FIGS. 10A to 10C show a display device of the present invention.
Figure 10B:
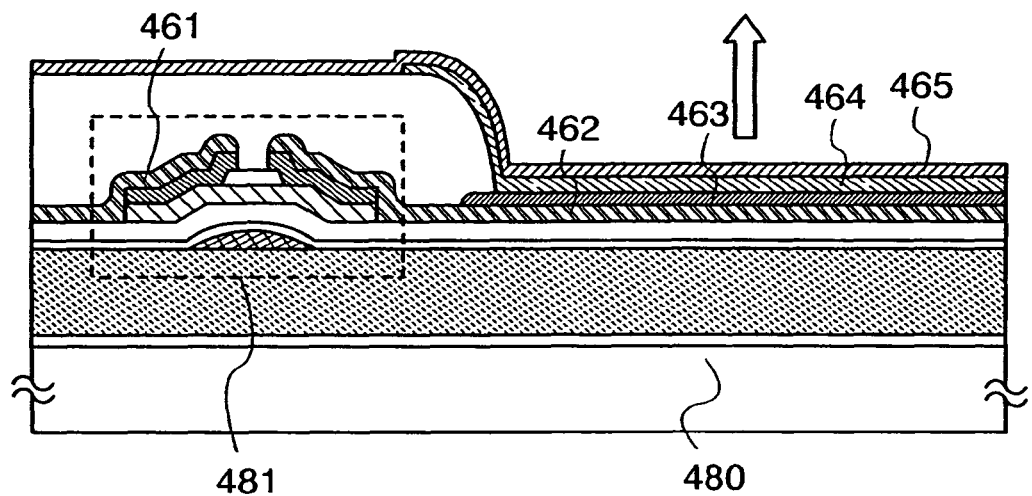
Figure 10C:
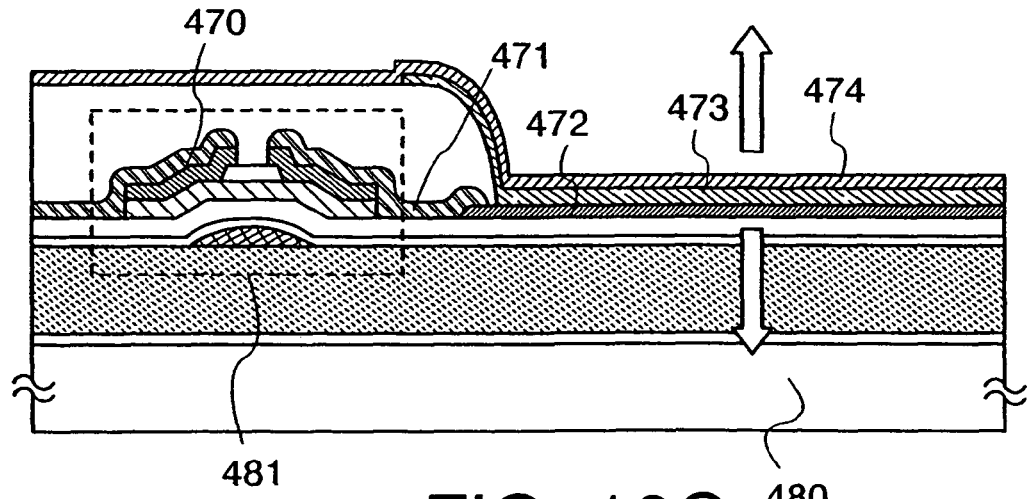

In addition, a color filter may be formed over an opposing substrate of the substrate 480, although not shown in FIGS. 10A to 10C. The color filter can be formed by a droplet discharge method; in that case, photoplasma treatment can be performed as the above-described base pretreatment. The color filter can be formed in a desired pattern with favorable adhesion due to a base film of the present invention. High-definition display can be performed by using the color filter. This is because the color filter can adjust a broad peak to sharp one in each emission spectrum of RGB.

The case of forming materials showing each luminescence of RGB is described hereinbefore; however, full color display can be performed also by forming a material showing luminescence of single color and combining the material with a color filter or a color conversion layer. For example, in the case of forming an electroluminescent layer showing white or orange luminescence, full color display can be performed by separately providing a color filter, a color conversion layer, or a combination of a color filter and a color conversion layer. For example, the color filter or the color conversion layer may be formed over a second substrate (sealing substrate), and then, be attached to the substrate. As described above, the material showing luminescence of single color, the color filter, and the color conversion layer can all be formed by a droplet discharge method.

Naturally, display of single color luminescence may be performed. For example, an area color type display device may be formed by using single color luminescence. A passive matrix display portion is suitable for the area color type and can display mainly characters and symbols.

A material having a low work function can be used for the cathode in the above structure; for example, Ca, Al, CaF, MgAg, AlLi, or the like is preferable. The electroluminescent layer may be any of a single layer type, a laminated type, and a mixed type having no interface between layers. Any of the following materials can be used: a singlet material, a triplet material, a combined material thereof, an organic material including a low molecular weight material, a high molecular weight material, and an intermediate molecular weight material, an inorganic material typified by molybdenum oxide which is superior in an electron injection property, and a composite material of an organic material and an inorganic material. The first electrodes 484, 463, and 472 are formed by using a transparent conductive film which transmits light; for example, a transparent conductive film in which indium oxide is mixed with zinc oxide (ZnO) of from 2% to 20% as well as ITO or ITSO is used. Note that plasma treatment in an oxygen atmosphere or heat treatment in a vacuum atmosphere is preferably performed before forming the first electrodes 484, 463, and 472. A partition wall (also referred to as a bank) is formed by using a material containing silicon, an organic material, or a compound material. In addition, a porous film may be used. However, it is preferable to form the partition wall by using a photosensitive or non-photosensitive material such as acrylic or polyimide, since a side face thereof becomes a shape in which a radius of curvature continuously changes and an upper-layer thin film is formed without break. This embodiment mode can be freely combined with the above embodiment mode.

EMBODIMENT MODE 5

An embodiment mode of the present invention is described with reference to FIGS. 40A to 46C, 48A and 48B. Specifically, a method for manufacturing a liquid crystal display device to which the present invention is applied is described. First, a method for manufacturing a liquid crystal display device having a channel etch thin film transistor to which the present invention is applied is described. In FIGS. 40 to 45, FIGS. 40A, 41A, 42A, 43A, 44A, and 45A are top views of a pixel portion of a liquid crystal display device. FIGS. 40B, 41B, 42B, 43B, 44B, and 45B are cross-sectional views taken along a line A-A' in FIGS. 40A, 41A, 42A, 43A, 44A, and 45A, and FIGS. 40C, 41C, 42C, 43C, 44C, and 45C are cross-sectional views taken along a line B-B'.

Figure 40A:
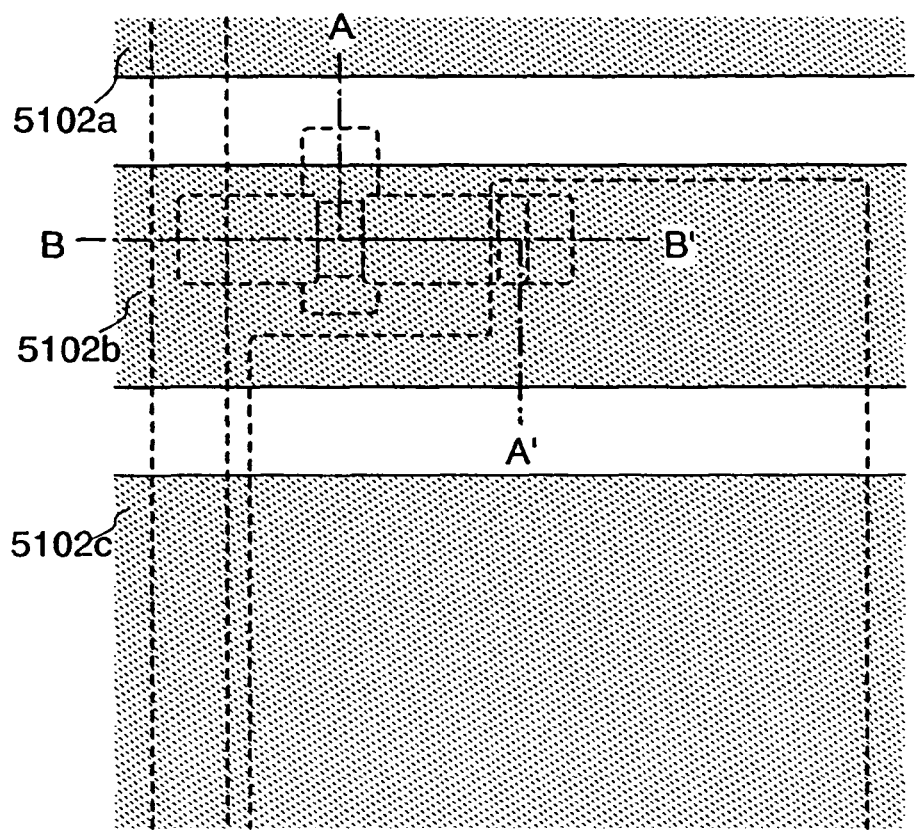
FIGS. 40A to 40C show a method for manufacturing a liquid crystal display device of the present invention.
Figure 40B:
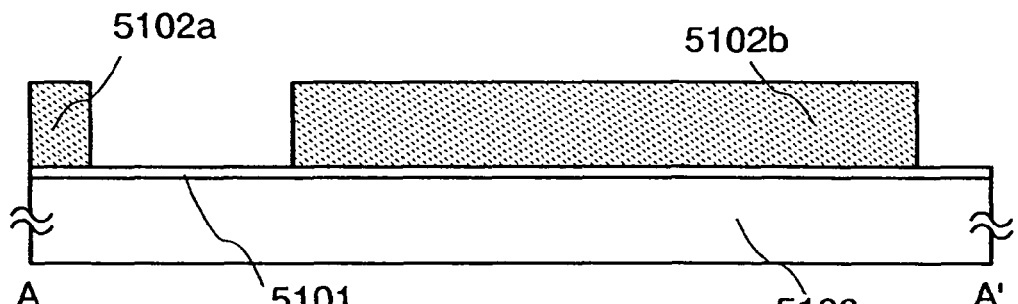
Figure 40C:
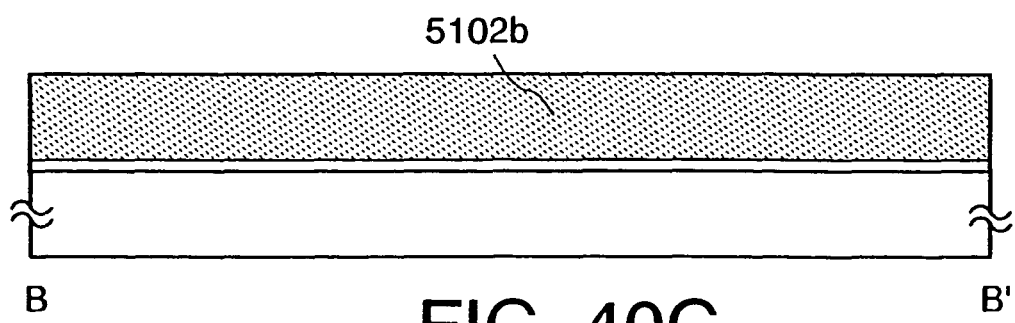

A base film 5101 for improving adhesion is formed over a substrate 5100 as base pretreatment. Then, insulating layers 5102a, 5102b, and 5102c are selectively formed as shown in FIGS. 40A, 40B, and 40C. A glass substrate made of barium borosilicate glass, alumino borosilicate glass, or the like, a quartz substrate, a silicon substrate, a metal substrate, a stainless steel substrate, or a heat-resistant plastic substrate which can withstand a processing temperature in this manufacturing step can be used as the substrate 5100. In addition, a surface of the substrate 5100 may be polished by a CMP method or the like so that it is planarized. Note that an insulating layer may be formed over the substrate 5100. The insulating layer is formed by using an oxide or nitride material containing silicon by a known method such as a CVD method, a plasma CVD method, a sputtering method, or a spin coating method to be a single layer or a laminated layer. The insulating layer may not be formed, but it is effective in blocking a contaminant from the substrate 5100 and the like. In the case of forming the insulating layer to prevent contamination from a glass substrate, the base film 5101 is formed as base pretreatment for a conductive layer to be formed thereover by a droplet discharge method.

The base film 5101 formed as base pretreatment in this embodiment mode can be formed by a dip coating method of a sol-gel method, a spin coating method, a droplet discharge method, an ion plating method, an ion beam method, a CVD method, a sputtering method, an RF magnetron sputtering method, a plasma spray method, or an anodic oxidation method. In addition, the substance does not need to have continuity as a film depending on its formation method. A solvent may be baked or dried when it is necessary to be removed in the case of forming the substance by an application method such as a dip coating method or a spin coating method.

This embodiment mode describes the case of forming TiO$_x$ (typically, TiO$_2$) crystal having a predetermined crystal structure by a sputtering method as the base film 5101. Sputtering is performed using a metal titanium tube as a target and using an argon gas and oxygen. Further, a He gas may be introduced. TiO$_x$ may be formed while heating a film formation chamber or a substrate provided with an object to be treated.

Further, the base film 5101 made of a metal material such as Ti (titanium), W (tungsten), Cr (chromium), Ta (tantalum), Ni (nickel), or Mo (molybdenum), or oxide thereof may be formed by a sputtering method, a vapor deposition method, or the like.

The base film 5101 may be formed to be from 0.01 nm to 10 nm in thickness. It may be formed to be very thin and need not necessarily have a layer structure. When a refractory metal material or a 3d transition element is used as the base film and the base film is conductive, it is preferable to perform either of the following two methods on the base film except a conductive layer formation region.

As a first method, the base film 5101 which is not overlapped with a gate wiring layer 5103 and a capacitor wiring layer 5104 is insulated to form an insulating layer. In other words, the base film 5101 which is not overlapped with the gate wiring layer 5103 and the capacitor wiring layer 5104 is oxidized and insulated. When the base film 5101 is oxidized and insulated in this way, it is preferable to form the base film 5101 to be from 0.01 nm to 10 nm in thickness; thus, the base film can be easily oxidized. Note that oxidization may be performed by exposing to an oxygen atmosphere or by heat-treating.

As a second method, the base film 5101 is selectively formed in a formation region of the gate wiring layer 5103 and the capacitor wiring layer 5104 (a discharge region of a composition including a conductive material). The base film 5101 may be selectively formed over the substrate or may be selectively etched and removed after being formed entirely, by employing a droplet discharge method or by using the insulating layers 5102a, 5102b, and 5103c as a mask. When this step is employed, there is no limitation on a thickness of the base film 5101.

Alternatively, a method of performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1 \times 10^{10}$ m$^{-3}$ to $1 \times 10^{14}$ m$^{-3}$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion of a pattern to be formed by a droplet discharge method with a formation region thereof. An organic material (organic resin material) (polyimide or acrylic) or a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

The insulating layers 5102a, 5102b, and 5102c are formed. The insulating layers 5102a, 5102b, and 5103c are formed by patterning as shown in FIGS. 40A, 40B, and 40C through an etching process after the insulating layer is entirely formed by a spin coating method or a dipping method. Dry etching such as a plasma CVD method may be employed or a wet etching may be used as the etching. The etching process is not necessarily required when the insulating layers 5102a, 5102b, and 5102c are formed by a droplet discharge method. When the insulating layer or the like is formed over wide area by a droplet discharge method, it is formed by using a discharge opening with a large diameter of a nozzle in a droplet discharge apparatus or by discharging a composition from a plurality of discharging openings of nozzles and drawing so that a plurality of lines is overlapped with each other. Consequently, a throughput is improved.

The insulating layers 5102a, 5102b, and 5102c can be formed by using an inorganic insulating material such as silicon oxide, silicon nitride, silicon oxynitride, aluminum oxide, aluminum nitride, or aluminum oxynitride; acrylic acid; methacrylic acid; a derivative of acrylic acid or methacrylic acid; a heat-resistant high molecular weight material such as polyimide, aromatic polyamide, or polybenzimidazole; or inorganic siloxane or an organosiloxane-based insulating material in which hydrogen bonded with silicon is substituted by an organic group such as metyl or phenyl, including a Si—O—Si bond among compounds that contain silicon, oxygen, and hydrogen and that are formed by using a siloxane material as a starting material. They may be formed by using a photosensitive or non-photosensitive material such as acrylic or polyimide. When a photosensitive material is used, patterning can be performed without using a mask of a resist. In this embodiment mode, a photosensitive organic resin material is used.

After the insulating layers 5102a, 5102b, and 5102c are formed, the gate wiring layer 5103 and the capacitor wiring layer 5104 are formed by a droplet discharge method to fill in an opening between the insulating layers 5102a, 5102b, and 5102c. It may be formed after the previously formed insulating layers 5102a, 5102b, and 5102c are baked. Temporary baking is performed on the insulating layers, and the gate wiring layer 103 and the capacitor wiring layer 5104 are formed, and then, they may be completely baked together. The present invention make it possible to separately form a gate wiring layer or a capacitor wiring layer which straddles pixels and which is formed to have relatively broad line width and an electrode layer such as a gate electrode layer which is formed in each pixel to have a relatively narrow line width. A highly reliable and low resistant gate wiring layer or capacitor wiring layer without disconnection or the like can be formed by forming a conductive layer having a broad line width, such as a gate wiring layer or a capacitor layer earlier to fill in an opening between insulating layers.

Figure 41A:
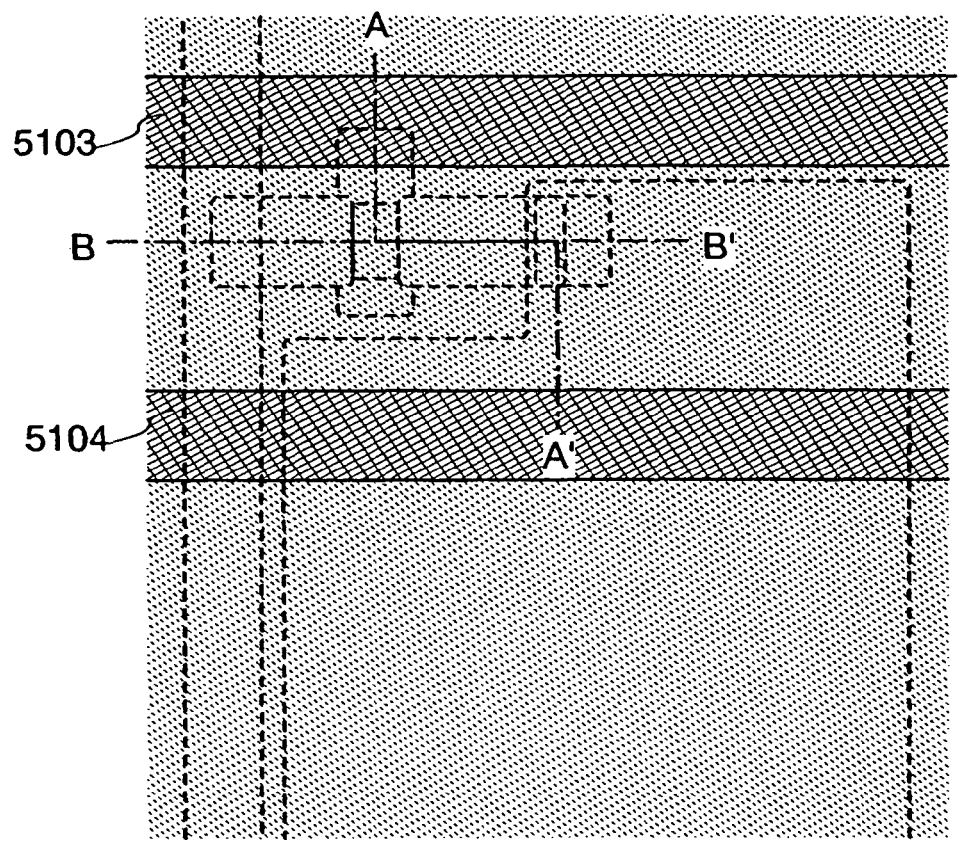
FIGS. 41A to 41C show a method for manufacturing a liquid crystal display device of the present invention.
Figure 41B:
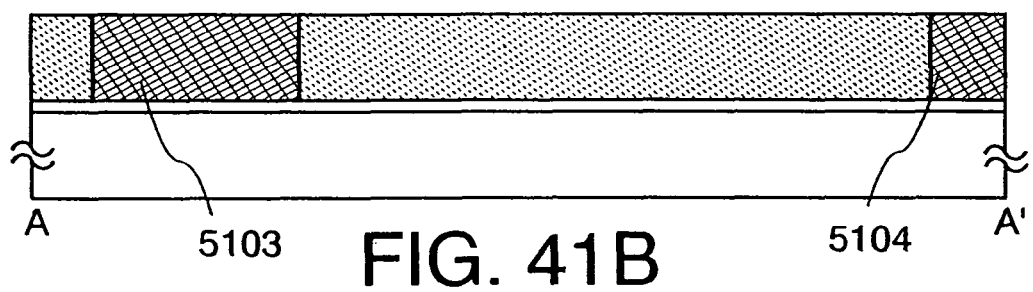
Figure 41C:
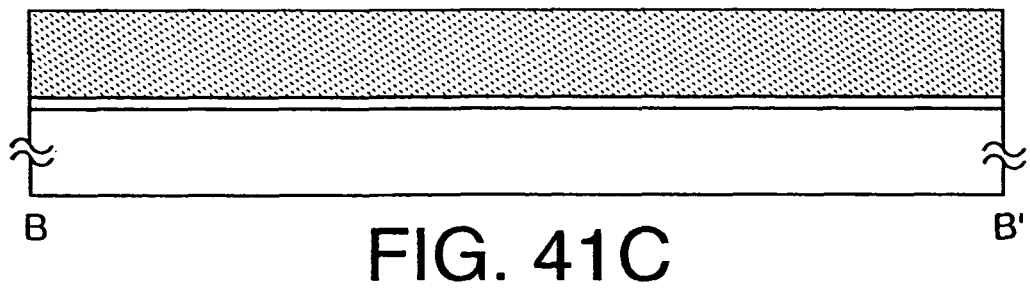
Figure 50A:
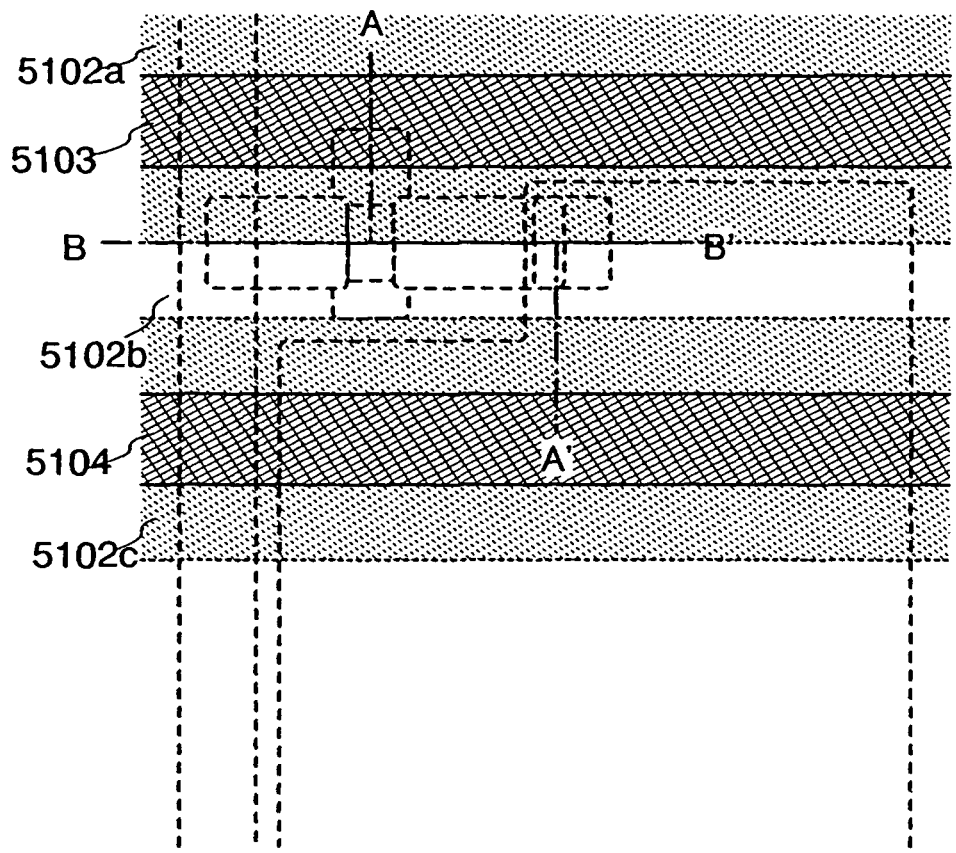
FIGS. 50A and 50B show a method for manufacturing a liquid crystal display device of the present invention.
Figure 50B:
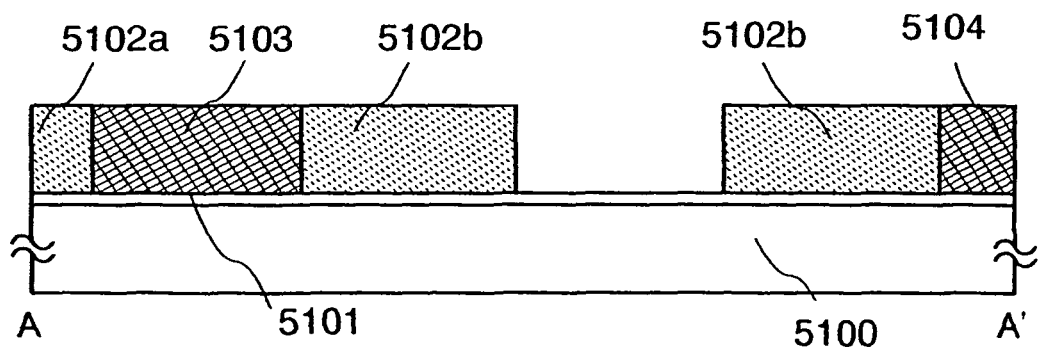
Figure 51A:
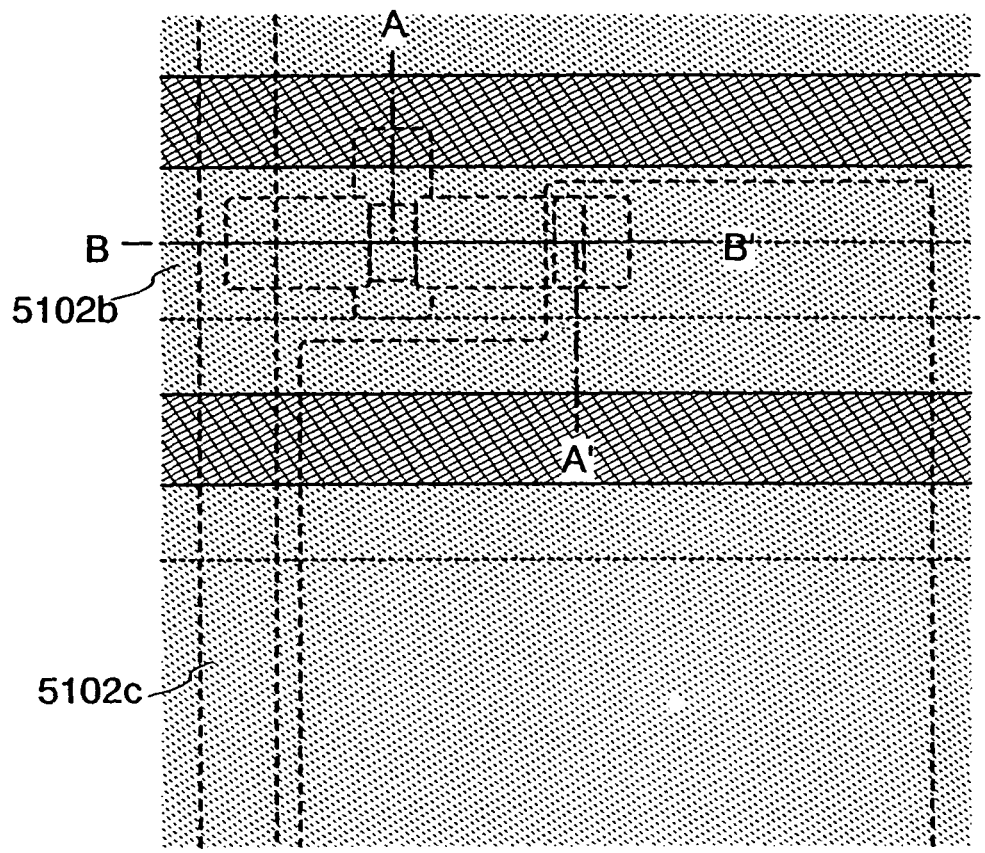
FIGS. 51A and 51B show a method for manufacturing a liquid crystal display device of the present invention.
Figure 51B:
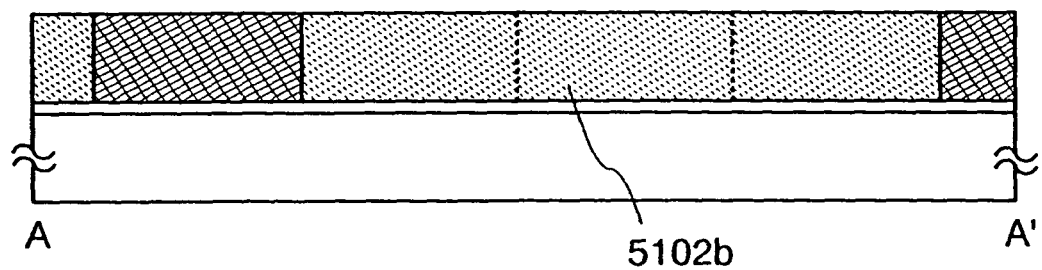

As shown in FIGS. 40A, 40B, and 40C and 41A, 41B, and 41C, insulating layers may be selectively formed earlier and a conductive layer may be formed therebetween. In the case of employing a droplet discharge method, a composition having an insulating material for forming the insulating layer and a composition including a conductive material for forming a conductive layer may be simultaneously discharged. Since compositions function as partition walls for each other by simultaneously discharging them, a pattern can be formed with good controllability without spreading laterally. In that case, each discharge opening may be selected depending on its formation region. For example, when the insulating layer is formed in a broader region than that of the conductive layer as shown in FIGS. 41A, 41B, and 41C, it is preferable to use a larger discharge opening of a nozzle for discharging the insulating layer than a discharge opening of a nozzle for discharging the conductive layer. When a formation region of the insulating layer is relatively broad, the insulating layer is simultaneously drawn in the periphery of the conductive layer to rim it; thereafter, the insulating layer can be discharged to the rest of the region as shown in FIGS. 50A and 50B. In FIGS. 50A and 50B, a part of the insulating layers 5102a, 5102b, and 5102c is simultaneously formed to rim the gate wiring layer 5103 and the capacitor wiring layer 5104. Subsequently, the rest of the insulating layers 5102b and 5102c is formed by a droplet discharge method as shown in FIGS. 51A and 51B. The rest of the insulating layer in FIGS. 51A and 51B is relatively broader than a pattern of the conductive layer. Therefore, throughput can be improved by using a discharge opening of a nozzle with a large diameter. Thus, throughput can be improved by determining a size of a discharge opening or the number of times of drawing depending on a pattern structure of a predetermined substance.

The gate wiring layer 5103 and the capacitor wiring layer 5104 are formed by using a droplet discharge means.

The above-described step of forming the base film 5101 is carried out as base pretreatment for a conductive layer to be formed by using a droplet discharge method; however, this treatment step may be carried out after forming the gate wiring layer 5103 and the capacitor wiring layer 5104.

After the insulating layers 5102a, 5102b, and 5102c, the gate wiring layer 5103, and the capacitor wiring layer 5104 are formed by discharging a composition with a droplet discharge method, a surface thereof may be pressed with pressure to be planarized in order to improve its planarity. As a method for pressing, unevenness may be reduced to smooth the surface by sweeping the surface with a roller, or the surface may be perpendicularly pressed with a flat plate. In pressing, a heating step may be performed. Alternatively, the surface may be softened or melted with a solvent or the like and an uneven portion on the surface may be removed with an air knife. Further, it may be polished by using a CMP method. The steps can be applied in planarizing the surface when unevenness is generated due to a droplet discharge method.

Figure 42A:
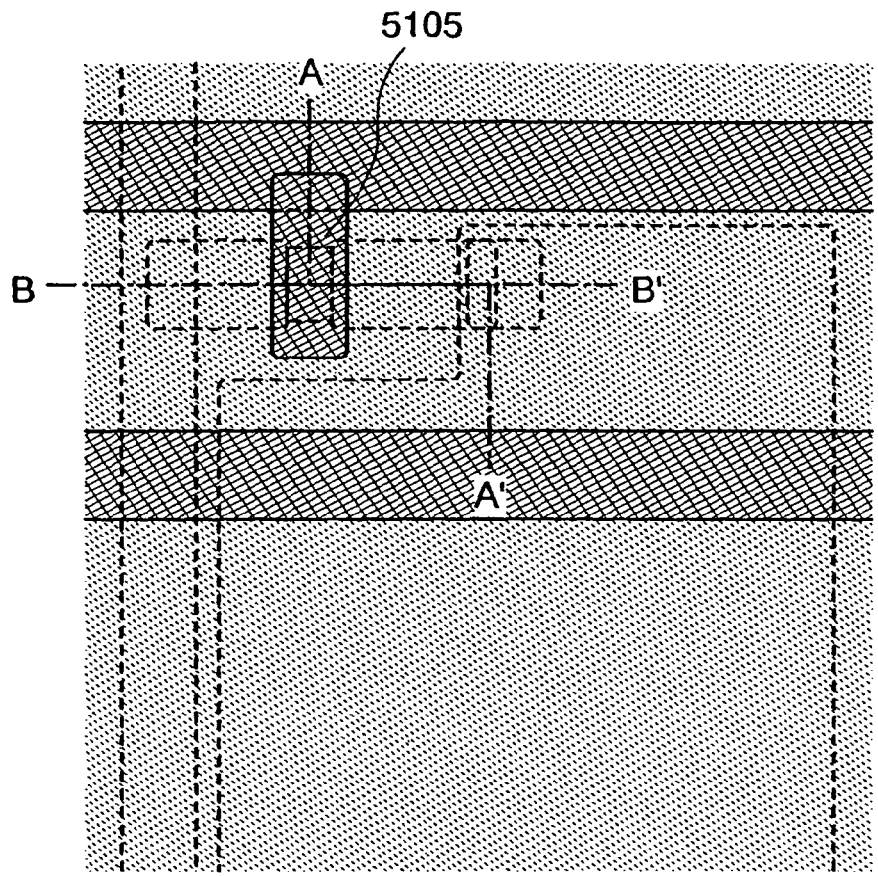
FIGS. 42A to 42C show a method for manufacturing a liquid crystal display device of the present invention.
Figure 42B:
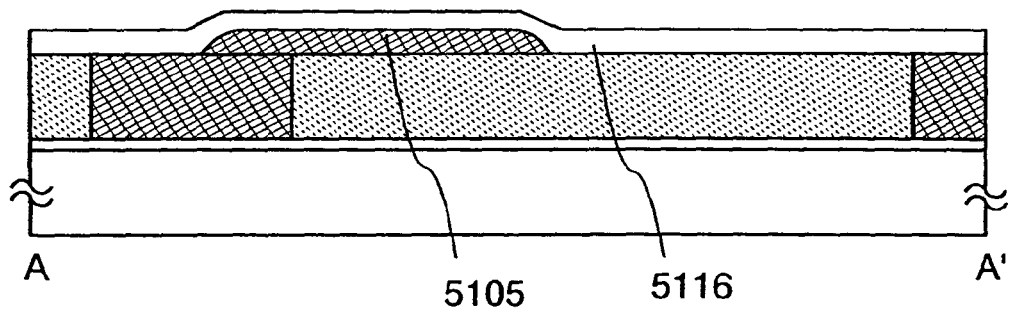
Figure 42C:
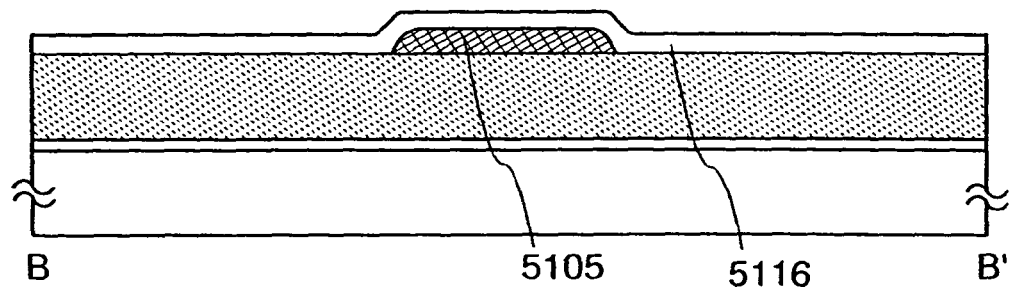

Subsequently, a gate electrode layer 5105 is formed, to be in contact with the gate wiring layer 5103 (ref. FIGS. 42A, 42B, and 42C). After the gate wiring layer 5103 is formed, the gate electrode layer 5105 can be formed minutely using a nozzle having a discharge opening with a small diameter by a droplet discharge method. Similar treatment to that performed in forming the base film 5101 may be performed as base pretreatment on a region on the gate wiring layer 5103 to be in contact with the gate electrode layer 5105. In this embodiment mode, ultraviolet ray irradiation treatment is carried out as treatment to improve adhesion. After the ultraviolet ray irradiation treatment, the gate electrode layer 5105 is formed. According to the present invention, a line width of a gate wiring ranges from 10 μm to 40 μm, a line width of a gate electrode ranges from 5 μm to 20 μm, and a wiring in which the line width of the gate electrode is about twice that of the gate electrode can be formed.

In addition, the gate wiring layer 5103 and the gate electrode layer 105 may be simultaneously formed. In that case, heads of a droplet discharge apparatus are provided with nozzles having different diameter size, and the gate wiring layer 5103 and the gate electrode layer 5105 are simultaneously by moving once. For example, a head provided with a nozzle having a discharge opening with a relatively large diameter is moved over the region where the gate wiring layer 5103 is to be formed, and a head provided with a nozzle having a discharge opening with a relatively small diameter is moved over the region where the gate electrode layer 5105 are to be formed. A discharge opening for forming the gate wiring layer 5103 continuously discharges a conductive material, and a discharge opening for forming the gate electrode layer 5105 discharges a conductive material when the head is moved over a formation region thereof. In this way, patterns having different line width can be formed, and throughput can be improved.

Subsequently, a gate insulating layer 5116 is formed over the gate electrode layer 5105 (ref. FIGS. 42A, 42B, and 42C). The gate insulating layer 5116 may be made of a known material such as an oxide or nitride material of silicon, and may be a laminated layer or a single layer. In this embodiment mode, a laminated layer of three layers of a silicon nitride film, a silicon oxide film, and a silicon nitride film is used. Alternatively, a single layer of them or of a silicon oxynitride film, or a laminated layer of two layers may be used. A silicon nitride film having minute film quality may be preferably used. In the case of using silver, copper, or the like for the conductive layer formed by a droplet discharge method, and then, forming a silicon nitride film or a NiB film thereover as a barrier film, the silicon nitride film or the NiB film is effective in preventing an impurity from diffusing and in planarizing the surface. Note that a rare gas element such as argon is preferably included in a reactive gas and is preferably mixed in the insulating film in order to form a minute insulating film with few gate leak current at a low film-formation temperature.

Next, a semiconductor layer is formed. A semiconductor layer having one conductivity may be formed if necessary. In this embodiment mode, a semiconductor layer 5106 and an N type semiconductor layer 5107 as a semiconductor layer having one conductivity are entirely laminated. In addition, an NMOS structure of an N-channel TFT in which the N type semiconductor layer is formed, a PMOS structure of a P-channel TFT in which a P type semiconductor layer is formed, and a CMOS structure of an N-channel TFT and a P-channel TFT can be manufactured. In addition, the N-channel TFT and the P-channel TFT can be formed by adding an element which imparts conductivity with doping to impart conductivity and by forming an impurity region in the semiconductor layer.

In this embodiment mode, an amorphous semiconductor is used as the semiconductor. The semiconductor layer 5106 is formed; thereafter, the N type semiconductor layer 5107 is formed as a semiconductor layer having one conductivity by a plasma CVD method or the like.

Figure 43A:
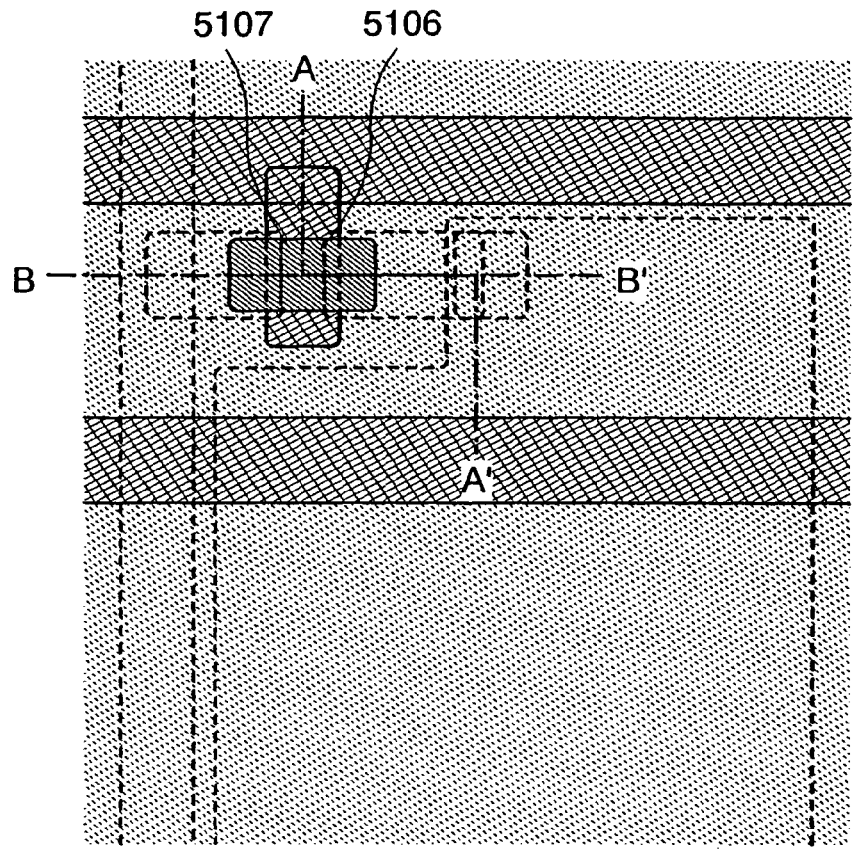
FIGS. 43A to 43C show a method for manufacturing a liquid crystal display device of the present invention.
Figure 43B:
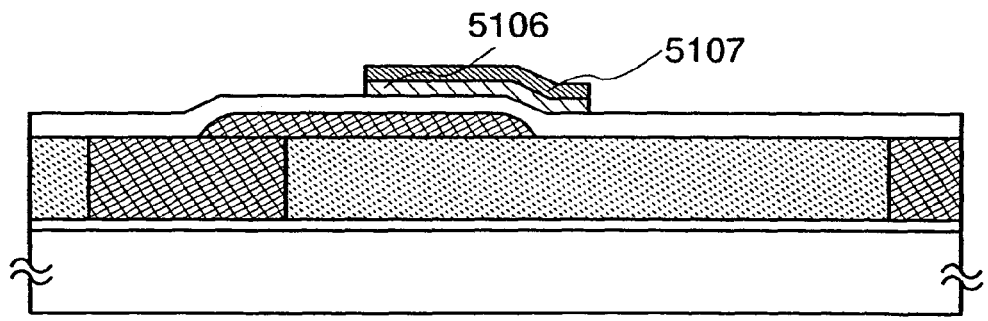
Figure 43C:
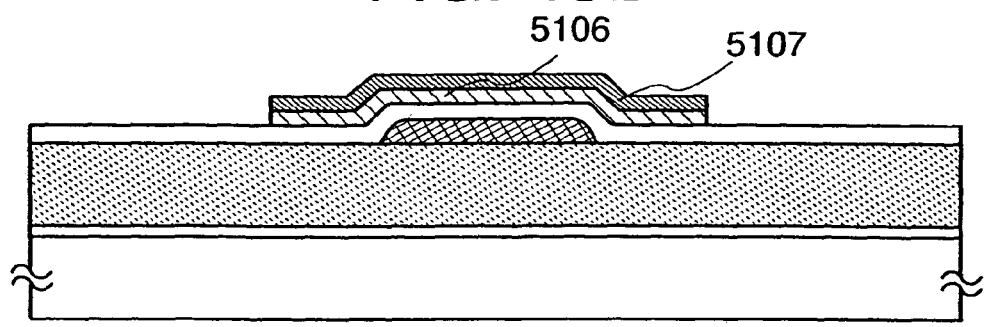

Subsequently, the semiconductor layer 5106 and the N type semiconductor layer 5107 are simultaneously patterned using a mask made of an insulating material such as a resist or polyimide (ref. FIGS. 43A, 43B, and 43C). The mask can be formed by selectively discharging a composition. A resin material such as an epoxy resin, an acrylic resin, a phenol resin, a novolac resin, a melamine resin, or a urethane resin is used for the mask. In addition, the mask is formed by a droplet discharge method using an organic material such as benzocyclobutene, parylene, flare, or light-transmitting polyimide; a compound material formed by polymerization of a siloxane-based polymer or the like; a composition material containing a water-soluble homopolymer and a water-soluble copolymer; or the like. Alternatively, a commercial resist material including a photosensitizer may be used. For example, a typical positive type resist such as a novolac resin and naphthoquinonedi azide compound that is a photosensitizer, a negative type resist such as a base resin, diphenylsilane diol, and an acid generating agent, or the like may be used. In using any one of the materials, surface tension and viscosity are appropriately adjusted by adjusting concentration of a solvent or adding a surfactant or the like.

Figure 44A:
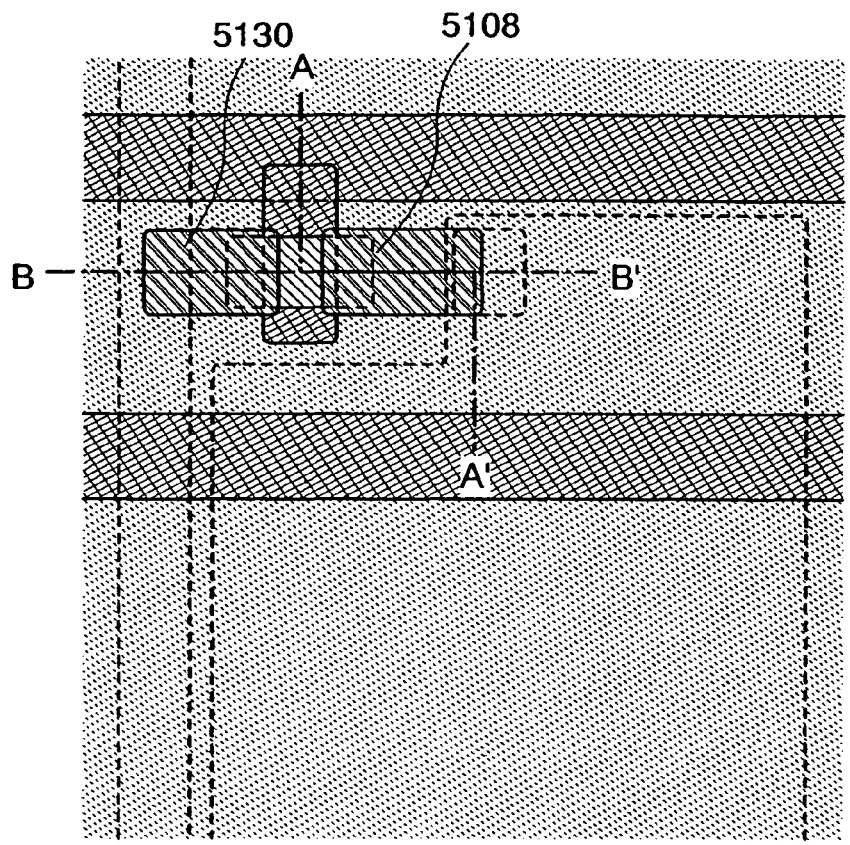
FIGS. 44A to 44C show a method for manufacturing a liquid crystal display device of the present invention.
Figure 44B:
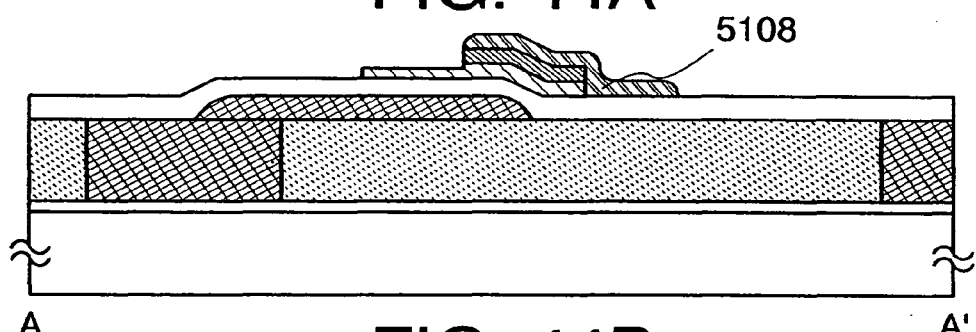
Figure 44C:
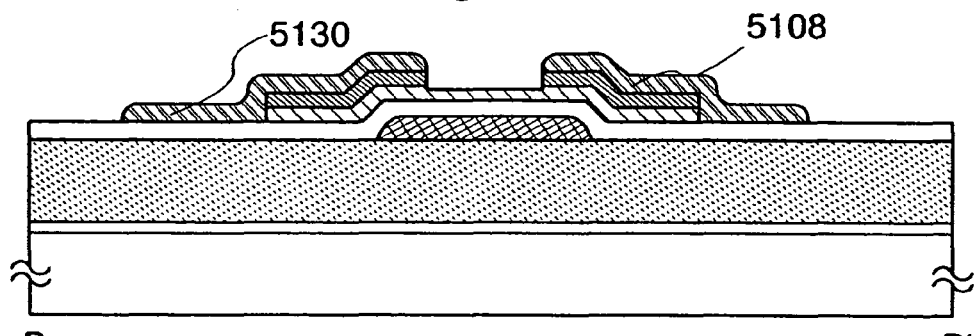

Source-drain electrode layers 5130 and 5108 are formed by discharging a composition including a conductive material. Then, the semiconductor layer 5106 and the N type semiconductor layer 5107 are patterned using the source-drain electrode layers 5130 and 5108 as a mask (ref. FIGS. 44A, 44B, and 44C). Note that the above-described base pretreatment of selectively forming a $TiO_x$ film or the like in a region where the source-drain electrode layers are to be formed may be performed before forming the source-drain electrode layer, although not shown. Accordingly, the conductive layer can be formed with favorable adhesion. The treatment step may be performed after the conductive layer is formed. Reliability of a display device can be improved since adhesion between the layers is improved according to the step.

Figure 45A:
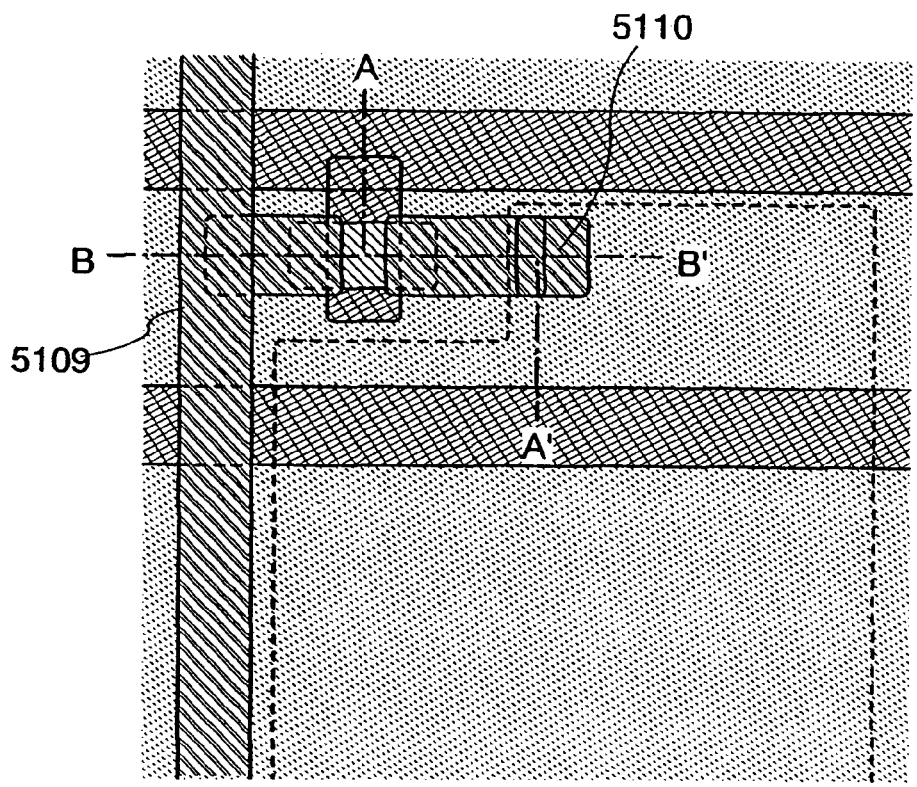
FIGS. 45A to 45C show a method for manufacturing a liquid crystal display device of the present invention.
Figure 45B:
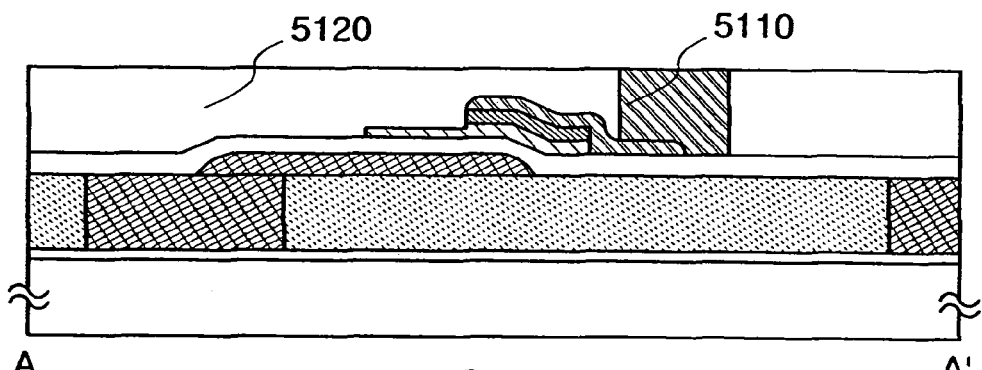
Figure 45C:
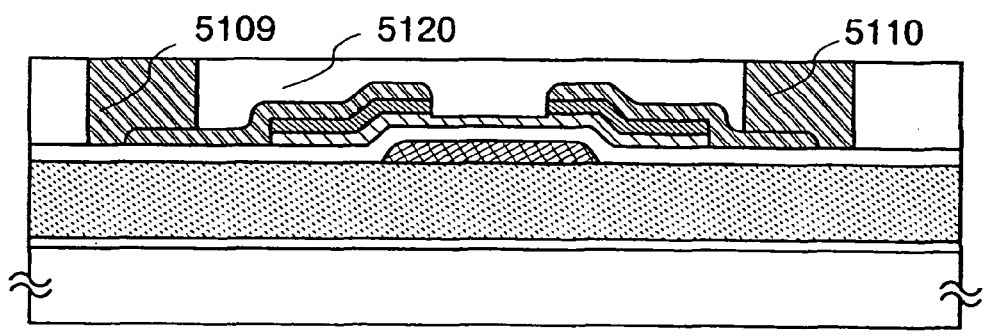

Subsequently, an insulating layer 5120 to be a second insulating layer is selectively formed, and a source wiring layer, 5109 and a conductive layer 5110 are formed by a droplet discharge method to fill in an opening in the insulating layer 5120 (ref. FIGS. 45A, 45B, and 45C). The insulating layer 5120 is formed to have an opening over the source-drain electrode layer 5108 as well as a formation region of the source wiring layer 5109 in order to form the conductive layer 5110 for connecting the source-drain electrode layer 5108 and the pixel electrode layer 5111. The insulating layer 5120, the source wiring layer 5109, and the conductive layer 5110 can be formed with a similar step to that in forming the above-described insulating layers 5102a, 5102b, and 5102c and the gate wiring layer 5103. Accordingly, the insulating layer 5120 can be selectively formed earlier and the source wiring layer 5109 and the conductive layer 5110 can be formed later, or they can be formed simultaneously. The source wiring layer 5109 and the conductive layer 5110 are formed to be in contact with the source-drain electrode layers 5130 and 5108, respectively. Therefore, base pretreatment may be performed on formation regions thereof as described above. The conductive layer 5110 is in contact with the source-drain electrode layer 5108 and the pixel electrode layer 5111 and has a function of electrically connecting them. Therefore, it is preferable to perform base pretreatment after the formation of the conductive layer 5110 and to form the pixel electrode layer 5111 thereover.

A composition including a particle of a metal such as Ag (silver), Au (gold), Cu (copper), W (tungsten), or Al (aluminum) as its main component can be used as the conductive material for forming the source-drain electrode layers 5130 and 5108, the source wiring layer 5109, and the conductive layer 5110. In addition, light-transmitting indium tin oxide (ITO), ITSO made of indium tin oxide and silicon oxide, organic indium, organic tin, zinc oxide, titanium nitride, and the like may be used in combination.

The insulating layer 5120 can be formed by using an inorganic insulating material such as silicon oxide, silicon nitride, siliconoxynitride, aluminumoxide, aluminum nitride, or aluminum oxynitride; acrylic acid; methacrylic acid; a derivative of acrylic acid or methacrylic acid; a heat-resistant high molecular weight material such as polyimide, aromatic polyamide, or polybenzimidazole; or inorganic siloxane or an organosiloxane-based insulating material in which hydrogen bonded with silicon is substituted by an organic group such as metyl or phenyl, including a Si—O—Si bond among compounds that contain silicon, oxygen, and hydrogen and that are formed by using a siloxane material as a starting material. It may be formed by using photosensitive or non-photosensitive material such as acrylic or polyimide.

After the insulating layer 5120, the source wiring layer 5109, and the conductive layer 5110 are formed by discharging a composition with a droplet discharge method, a surface thereof may be pressed with pressure to be planarized in order to improve its planarity. As a method for pressing, unevenness may be reduced to smooth the surface by sweeping the surface with a roller, or the surface may be perpendicularly pressed with a flat plate. Alternatively, the surface may be softened or melted with a solvent or the like and an uneven portion on the surface may be removed with an air knife. Further, it may be polished by using a CMP method. The steps can be applied in planarizing the surface when unevenness is generated due to a droplet discharge method. When planarity is improved according to this step, a display panel can be prevented from uneven display and high definition image can be displayed.

Figure 46A:
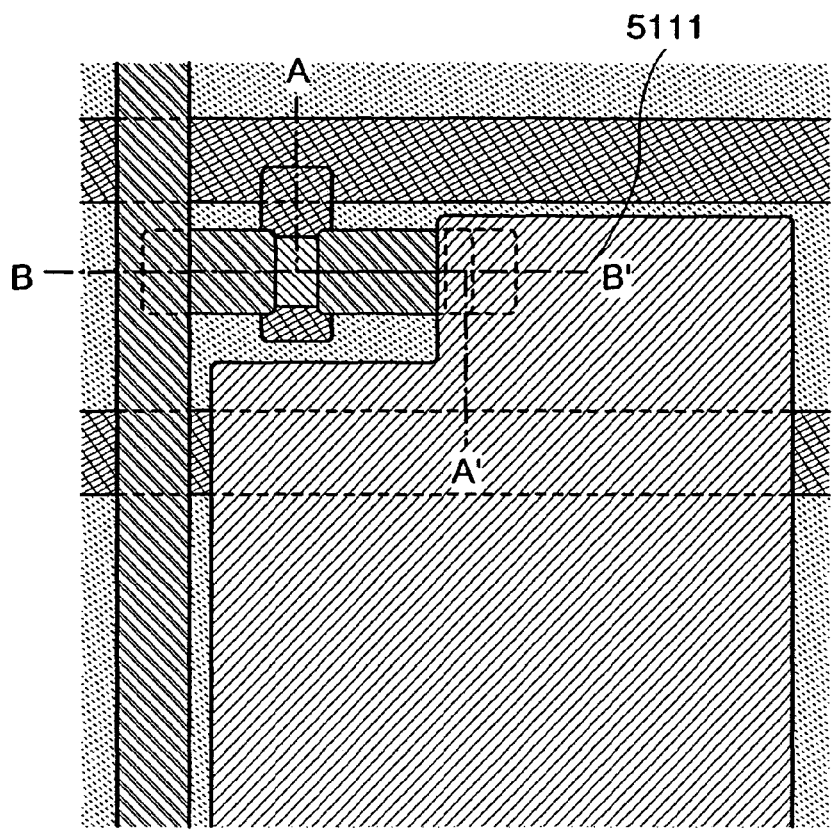
FIGS. 46A to 46C show a method for manufacturing a liquid crystal display device of the present invention.
Figure 46B:
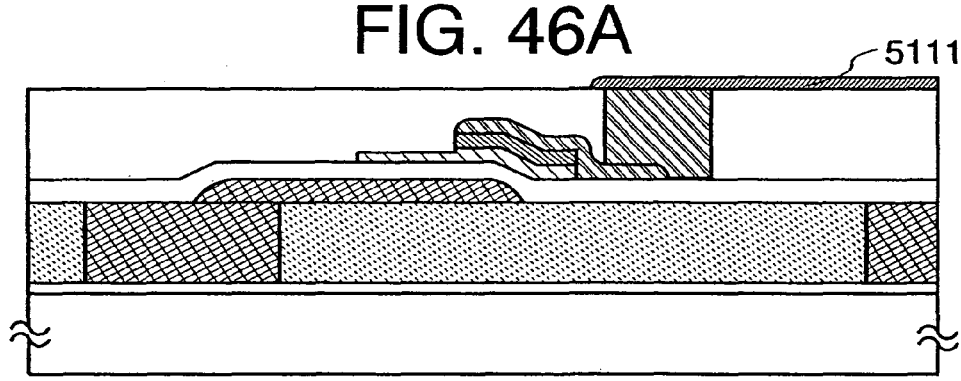
Figure 46C:
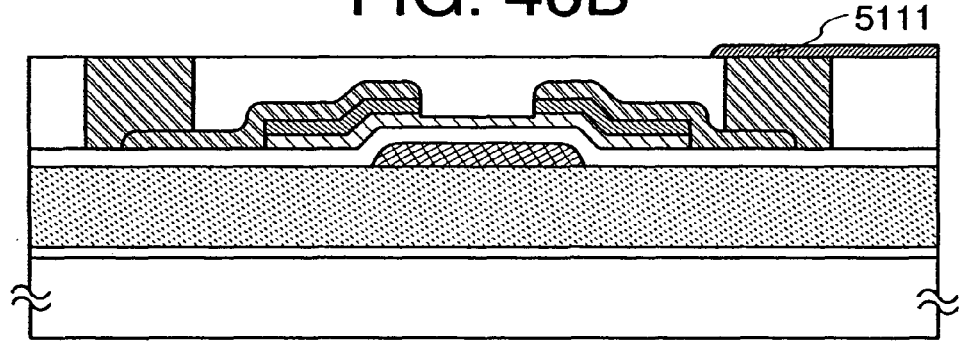

Subsequently, a pixel electrode layer 5111 is formed by selectively discharging a composition including a conductive material onto the insulating layer 5120 to be in contact with the conductive layer 5110 (ref. FIGS. 46A, 46B, and 46C). The pixel electrode layer 5111 may be formed by forming a predetermined pattern of a composition including indium tin oxide (ITO), indium tin oxide containing silicon oxide (ITSO), zinc oxide (ZnO), tin oxide ($SnO_2$), or the like and by baking it when a transmissive liquid crystal display panel is to be manufactured.

Preferably, the pixel electrode layer 5111 is made of indium tin oxide (ITO), indium tin oxide containing silicon oxide (ITSO), zinc oxide (ZnO), or the like by a sputtering method. It is more preferable to use indium tin oxide containing silicon oxide formed by a sputtering method using a target in which ITO contains silicon oxide of from 2% to 10% by weight. In addition, an oxide conductive material which contains silicon oxide and in which indium oxide is mixed with zinc oxide (ZnO) of from 2% to 20% by weight may be used. A mask layer may be formed by a droplet discharge method and be etched to have a desired pattern after forming the pixel electrode layer 5111 by a sputtering method. In this embodiment mode, the pixel electrode layer 5111 is made of a light-transmitting conductive material by a droplet discharge method. Specifically, it is formed by using indium tin oxide or ITSO made of ITO and silicon oxide.

In addition, a composition including a particle of a metal such as Ag (silver), Au (gold), Cu (copper), W (tungsten), or Al (aluminum) as its main component can be used when a reflective liquid crystal display panel is manufactured. As another method, the pixel electrode layer 5111 may be formed by forming a transparent conductive film or a light-reflective conductive film by a sputtering method, forming a mask pattern by a droplet discharge method, and additionally performing an etching process.

The pixel electrode layer 5111 may be polished by a CMP method or by cleaning with a porous body of polyvinyl alcohol so that the surface thereof is planarized. Furthermore, the surface of the pixel electrode layer 5111 may be irradiated with an ultraviolet ray or may be treated with oxygen plasma after polishing by the CMP method.

According to the above-described steps, a substrate having a TFT for a liquid crystal display panel in which a bottom gate type (also referred to as an inversely staggered type) TFT and a pixel electrode are connected over the substrate 5100 is completed. In addition, the TFT in this embodiments mode is a channel etch type.

Figure 48A:
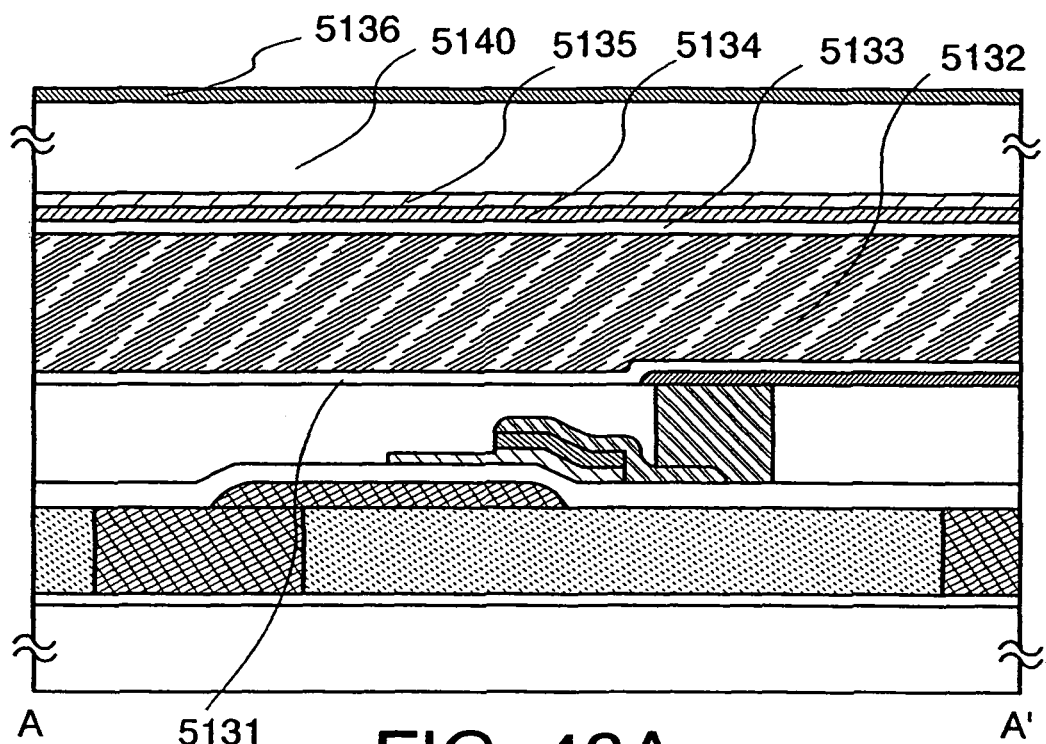
FIGS. 48A and 48B show a cross-sectional views of a liquid crystal display device of the present invention.
Figure 48B:
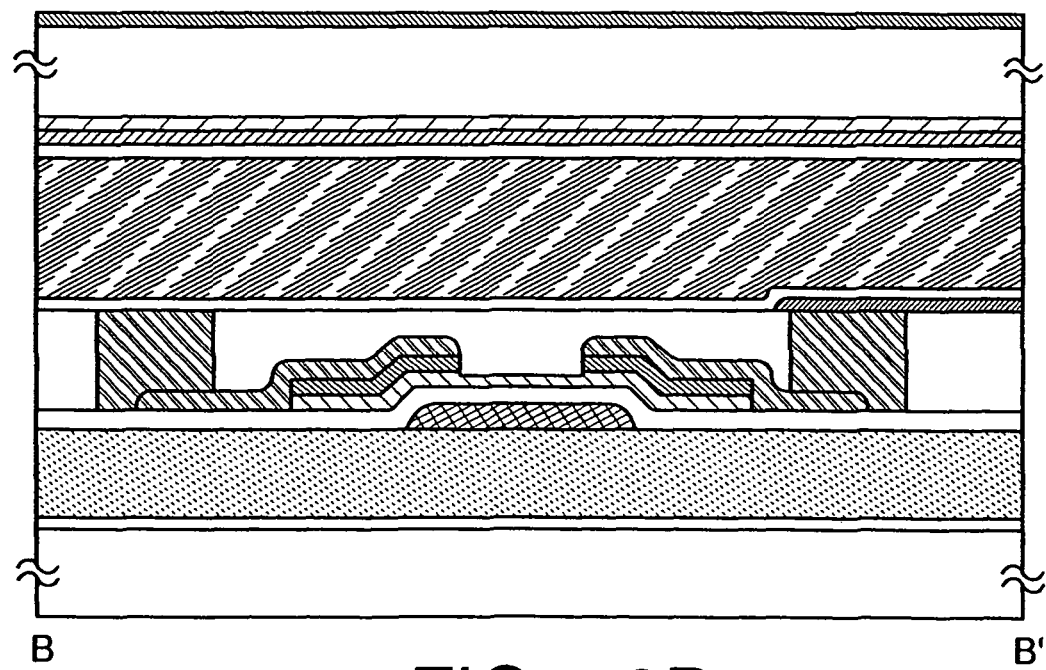

Subsequently, an insulating layer 5131 referred to as an alignment film is formed by a printing method or a spin coat method to cover the pixel electrode layer 5111 as shown in FIGS. 48A and 48B. FIG. 48A is a cross-sectional view taken along a line A-A' in a top view shown in FIGS. 40 to 46, and FIG. 48B is a cross sectional view taken along a line B-B' and is a completion diagram of a liquid crystal display panel. Note that the insulating layer 5131 can be selectively formed by a screen printing method or an offset printing method. Thereafter, rubbing is performed. Subsequently, a sealant is formed in the periphery of a region where a pixel is formed by a droplet discharge method (not shown).

Thereafter, a liquid crystal display panel can be manufactured by attaching an opposing substrate 5140 provided with an insulating layer 5133 functioning as an alignment film, a colored layer 5134 functioning as a color filter, a conductive layer 5135 functioning as an opposite electrode, and a polarizing plate 5136 to the substrate 5100 having a TFT with a spacer therebetween, and by providing the space with a liquid crystal layer (ref. FIGS. 48A and 48B). The sealant may be mixed with a filler, and further, the opposing substrate 5140 may be provided with a shielding film (black matrix) and the like. Note that a dispenser type (a dropping type) or a dip type (a pumping type) that injects liquid crystal by using a capillary phenomenon after attaching the opposing substrate 5140 can be used as a method for forming the liquid crystal layer.

Figure 52:
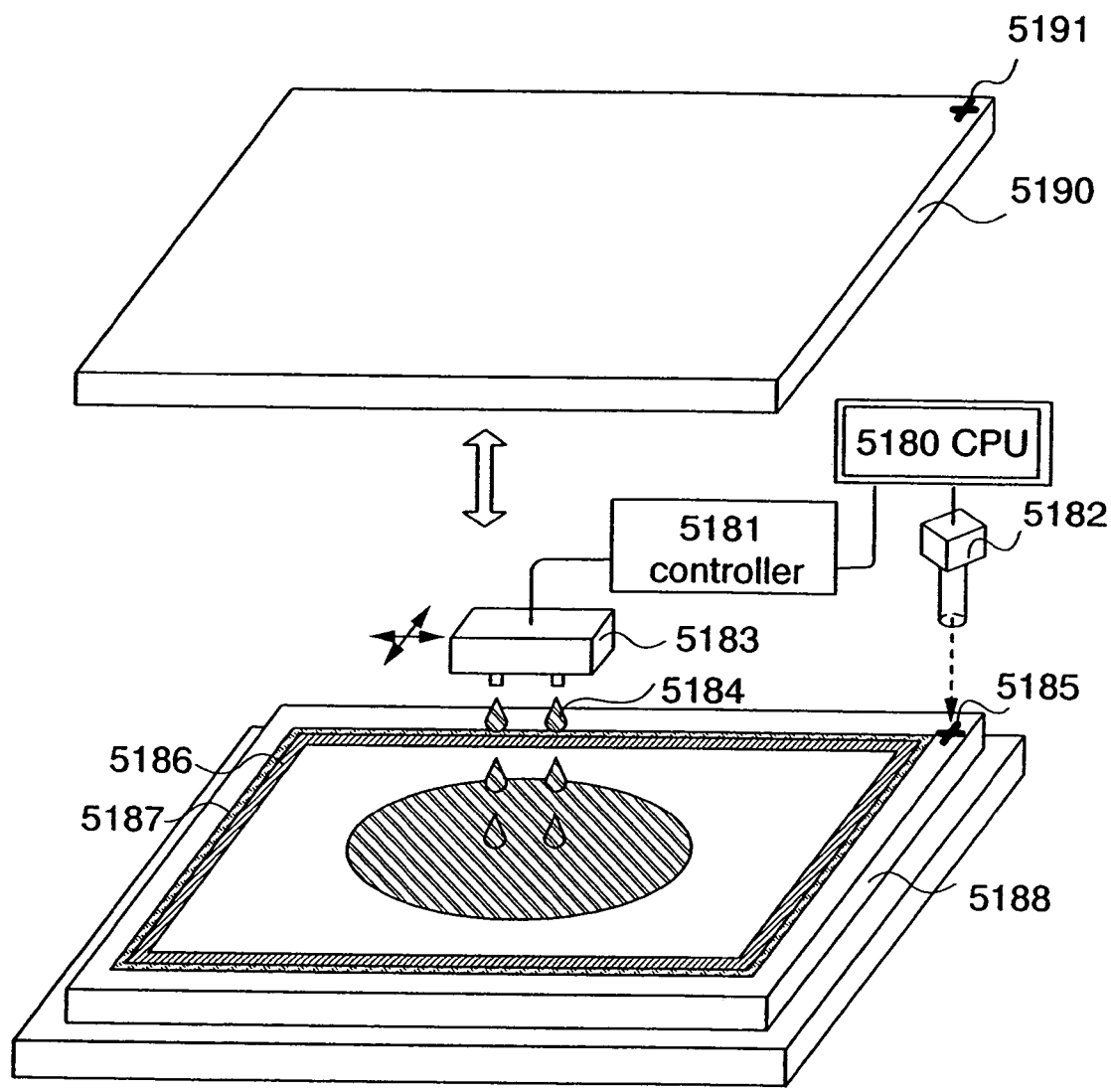
FIG. 52 shows a method for manufacturing a liquid crystal display device of the present invention.

A liquid crystal drop injection method employing a dispenser type is described with reference to FIG. 52. In FIG. 52, reference numeral 5180 denotes a CPU; 5181, a controller; 5182, an imaging means; 5183, a head; 5184, liquid crystal; 5185 and 5191, markers; 5186, a barrier layer; 5187, a sealant; 5188, a TFT substrate; and 5190, an opposing substrate. A closed loop is formed with the sealant 5187, and the liquid crystal 5184 is dropped once or plural times therein from the head 5183. At this time, the barrier layer 5186 is provided to prevent the sealant 5187 and the liquid crystal 5184 from reacting with each other. Subsequently, the substrates are attached in vacuum, and then, ultraviolet curing is performed to make the space filled with liquid crystal.

A connection portion is formed to connect the pixel portion formed in the above step and an external wiring board. The insulating layer in the connection portion is removed by ashing treatment using an oxygen gas under the atmospheric pressure or pressure in proximity of the atmospheric pressure. This treatment is performed by using an oxygen gas and one or more gases of hydrogen, $CF_4$, $NF_3$, $H_2O$, and $CHF_3$. In this step, ashing treatment is performed after sealing by using the opposing substrate to prevent damage or destruction due to static; however, ashing treatment may be performed at any timing when there are few effects of static.

A connection wiring board is provided to electrically connect to the gate wiring layer 5103 with an anisotropic conductive layer therebetween. The wiring board has a function of transmitting a signal and electric potential from external. Through the above steps, a liquid crystal display panel including a channel etch switching TFT and a capacitor element. The capacitor element includes the capacitor wiring layer 5104, the gate insulating layer 5116, the insulating layer 5120, and the pixel electrode layer 5111.

Figure 49:
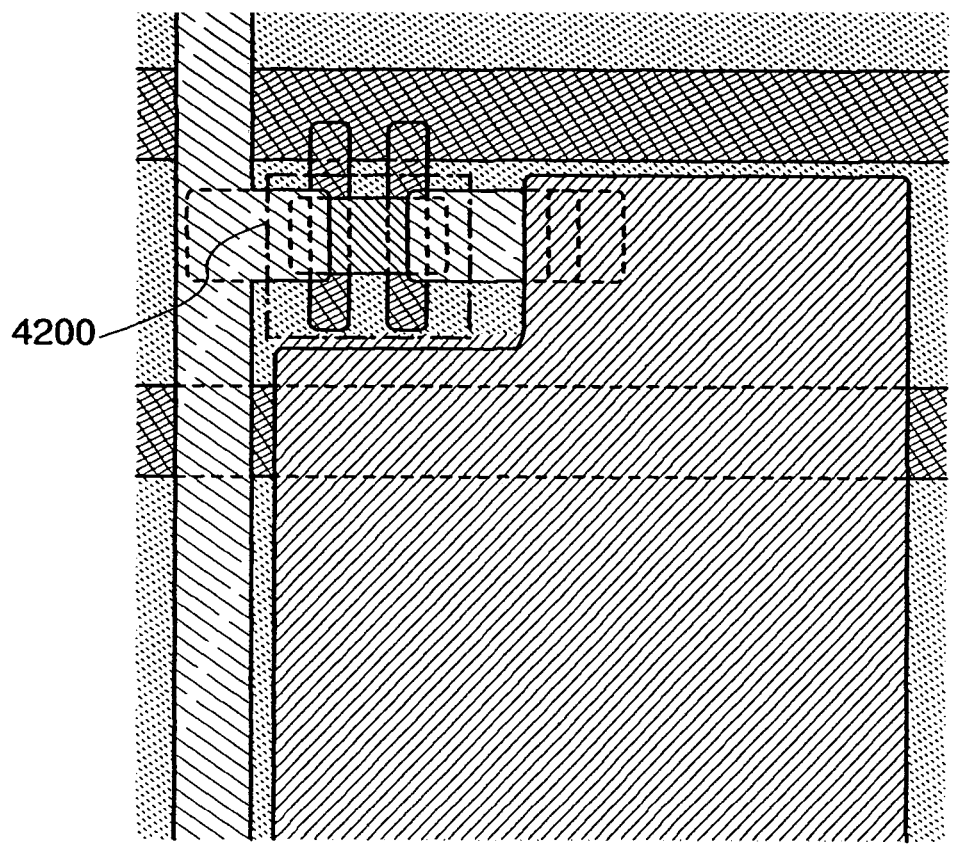
FIG. 49 is a top view of a liquid crystal display device of the present invention.

In this embodiment mode, a switching TFT having a single gate structure is described; however, a multi gate structure such as a double gate structure may be employed. FIG. 49 is a top view of a liquid crystal display device having a double gate structure switching TFT 4200.

As described above, the steps can be omitted in this embodiment mode by not applying a light exposure step utilizing a photomask. In addition, a liquid crystal display panel can be easily manufactured by directly forming various patterns over a substrate with a droplet discharge method even when a glass substrate of the fifth or the following generation having a side of more than 1000 mm is used.

In addition, a highly reliable liquid crystal display panel in which adhesion is improved can be manufactured.

EMBODIMENT MODE 6

Figure 47:
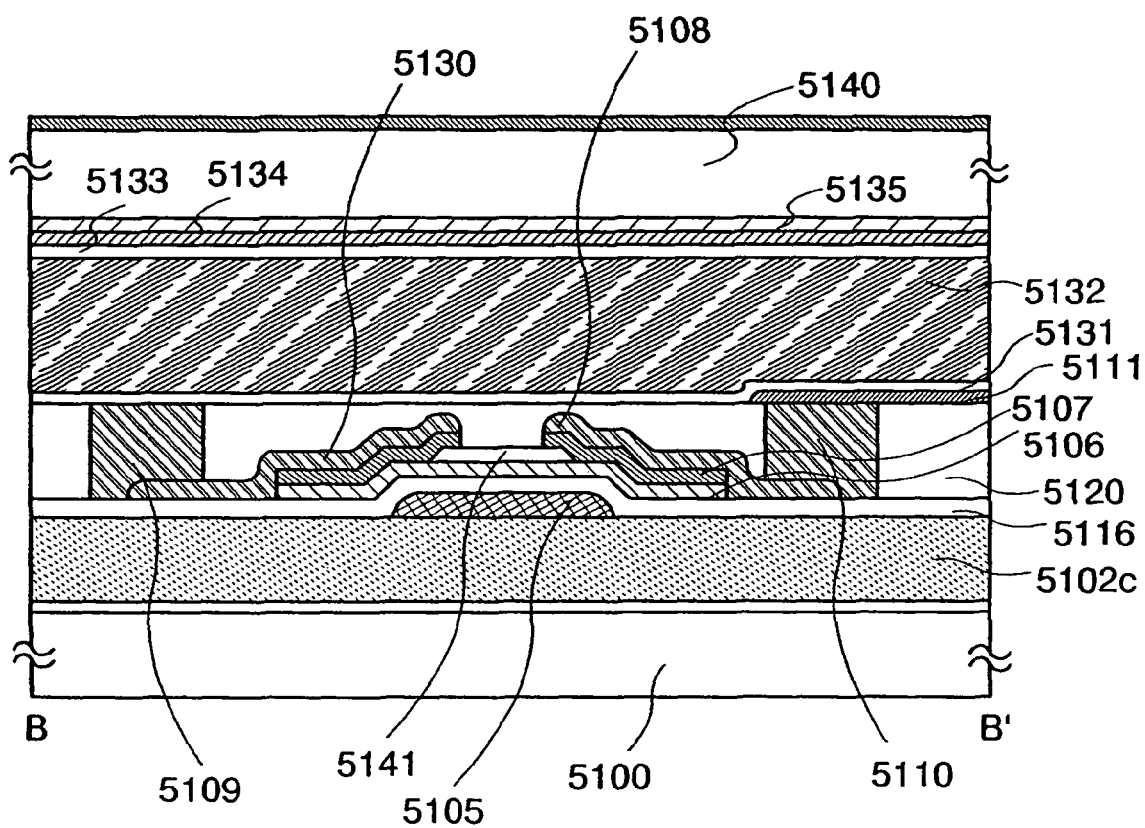
FIG. 47 is a cross-sectional view of a liquid crystal display device of the present invention.

An embodiment mode of the present invention is described with reference to FIG. 47. This embodiment mode describes the case of using a channel protective thin film transistor as a thin film transistor in Embodiment Mode 5. Therefore, repetitive description of the same portion or a portion having a similar function is omitted. Note that FIG. 47 corresponds to a cross-sectional view of a channel etch thin film transistor in FIG. 48B.

An insulating layer 5102c is formed over the substrate 5100, and a gate wiring layer and a capacitor wiring layer 5104 are formed by discharging a composition including a conductive material with a droplet discharge method. A gate electrode layer 5105 is formed by droplet discharge method to be in contact with the gate wiring layer. Subsequently, a gate insulating layer 5116 is formed by using a plasma CVD method or a sputtering method to be a single layer or to have a laminated structure. A specifically preferable mode of the gate insulating layer corresponds to a lamination body of three layers of an insulating layer made of silicon nitride, an insulating layer made of silicon oxide, and an insulating layer made of silicon nitride. Furthermore, up to a semiconductor layer 5106 functioning as an active layer is formed. The above-described steps are similar to those in Embodiment Mode 5.

The semiconductor layer 5106 is formed, and an insulating film is formed by, for example, a plasma CVD method and is patterned to have a desired shape in a desired region in order to form a channel protective film 5141. At this time, the channel protective film 5141 can be formed by exposing a back of the substrate to light using the gate electrode as a mask. In addition, polyimide, polyvinyl alcohol, or the like may be dropped as the channel protective film by a droplet discharge method. Consequently, the light-exposure step can be omitted.

A film made of one or a plurality of inorganic materials (silicon oxide, silicon nitride, silicon oxynitride, silicon nitride oxide, and the like), photosensitive or non-photosensitive organic materials (organic resin materials) (polyimide, acrylic, polyamide, polyimide amide, a resist, benzocyclobutene, and the like), a Low k material having a low dielectric constant, and the like, or a laminated layer of them can be used as the channel protective film. In addition, a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used. A vapor phase growth method such as a plasma CVD method or a thermal CVD method or a sputtering method can be employed as a manufacturing method. In addition, a droplet discharge method or a printing method (a method for forming a pattern, such as screen printing or offset printing) can be employed. A TOF film, an SOG film, or the like obtained by an application method can be used.

An N type semiconductor layer 5107 is formed over the semiconductor layer 5106 and the channel protective film 5141. Next, a mask is formed over the semiconductor layer 5106 and the N type semiconductor layer 5107 by selectively discharging a composition. Subsequently, the semiconductor layer 5106 and the N type semiconductor layer 5107 are simultaneously etched utilizing the mask to form a semiconductor layer and an N type semiconductor layer. Thereafter, a composition including a conductive material is discharged onto the semiconductor layer. 5106 to form source-drain electrode layers 5130 and 5108.

Next, the N type semiconductor layer 5107 is etched using the source-drain electrode layers 5130 and 5108 as a mask. Then, an insulating layer 5120 is selectively formed, and a source wiring layer 5109 and a conductive layer 5110 are formed by a droplet discharge method to fill an opening in the insulating layer 5120. Similarly to Embodiment Mode 5, the insulating layer 5120, the source wiring layer 5109, and the conductive layer 5110 may be simultaneously formed, and the above-described base pretreatment may be performed before and after the formation. A pixel electrode layer 5111 is formed to be in contact with the conductive layer 5110 by discharging a composition including a conductive material in order to electrically connect them with the source-drain electrode layer 5108 and the conductive layer 5110 therebetween. Thereafter, a press step may be carried out to planarize the surface.

Subsequently, an insulating layer 5131 functioning as an alignment film is formed. Thereafter, a sealant is formed, and the substrate 5100 is attached to an opposing substrate 5140 provided with a color filter (colored layer) 5134, a conductive layer 5135, and an insulating layer 5133 by using the sealant. Then, a liquid crystal layer 5132 is formed between the substrate 5100 and the opposing substrate 5140. A liquid crystal display panel having a display function can be manufactured by exposing a region to which a connection terminal is to be attached by etching under the atmospheric pressure or pressure in proximity of the atmospheric pressure (ref. FIG. 47).

Hereinbefore, an example of an inversely staggered thin film transistor is described in Embodiment Modes 5 and 6. However, the present invention can be applied to a staggered thin film transistor. In the case of a staggered thin film transistor, a source wiring layer is formed first to fill in an opening in an insulating layer, and then, a minute source-drain electrode layer in a pixel portion is formed by a droplet discharge method to be in contact with the source wiring layer. Accordingly, both a lower resistant source wiring layer and a minuter electrode layer can be realized similarly to the case of an inversely staggered thin film transistor.

EMBODIMENT MODE 7

A scanning line side driver circuit can be formed over a substrate 3700 as shown in FIG. 11 by forming a semiconductor layer of a SAS in the display panel (EL display panel, liquid crystal display panel) manufactured in Embodiment Modes 1 to 6.

Figure 29:
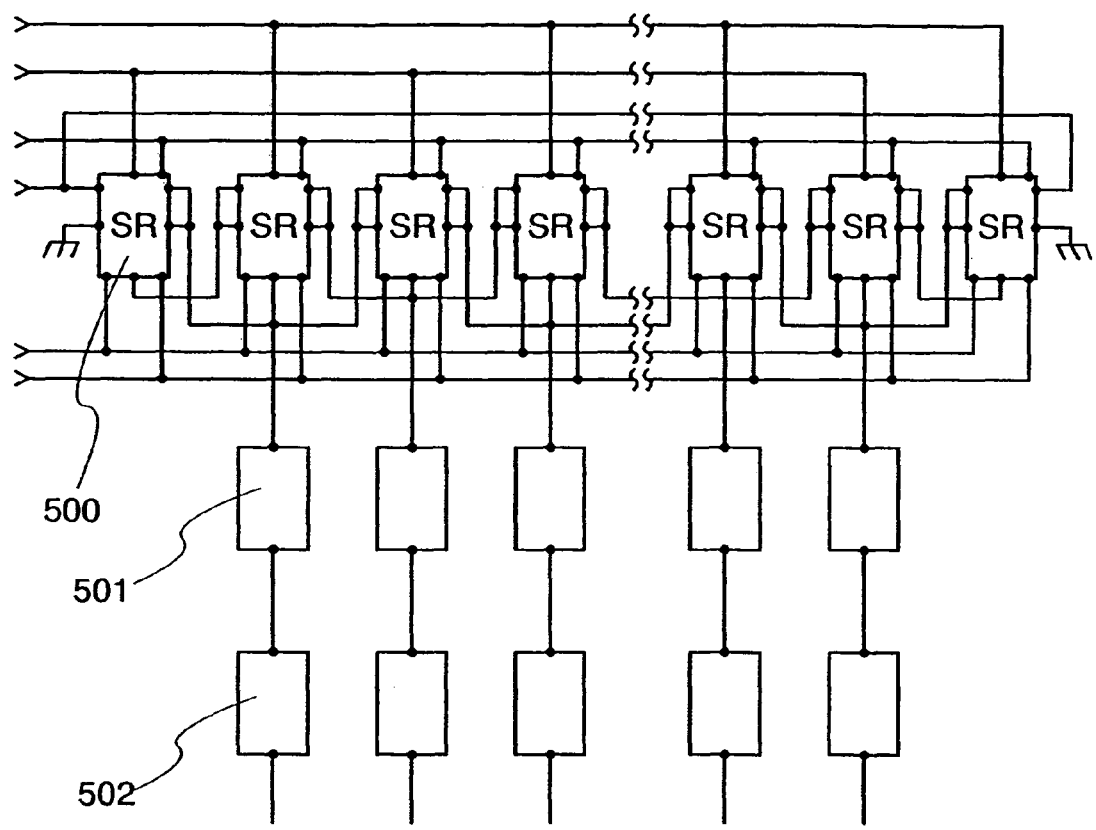
FIG. 29 shows a circuit structure in the case of forming a scanning line side driver circuit with TFTs in a display panel of the present invention.

FIG. 29 is a block diagram of a scanning line side driver circuit including an N-channel type TFT using a SAS in which field effect mobility of from 1 $cm^2$/V·sec to 15 $cm^2$/V·sec is obtained.

A block denoted by reference numeral 500 in FIG. 29 corresponds to a pulse output circuit for outputting a sampling pulse for one stage, and a shift register includes n pulse output circuits. Reference numeral 501 denotes a buffer circuit, and a pixel 502 is connected at the end thereof.

Figure 30:
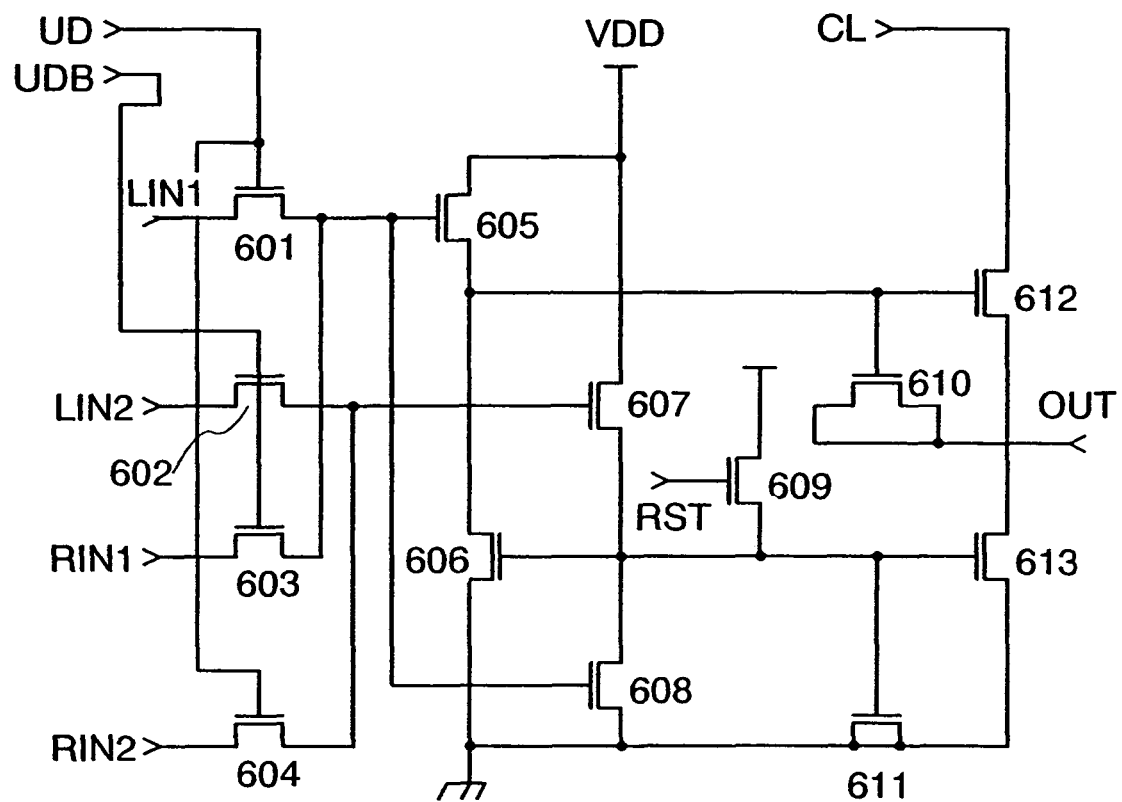
FIG. 30 shows a circuit structure in the case of forming a scanning line side driver circuit with TFTs in a display panel of the present invention (pulse output circuit).

FIG. 30 shows a specific structure of the pulse output circuit 500, and the circuit includes N-channel type TFTs 601 to 612. The size of the TFT may be determined in consideration of operating characteristics of the N-channel type TFTs using a SAS. When a channel length is set to be 8 μm, for example, a channel width can be set in the range of from 10 μm to 80 μm.

Figure 31:
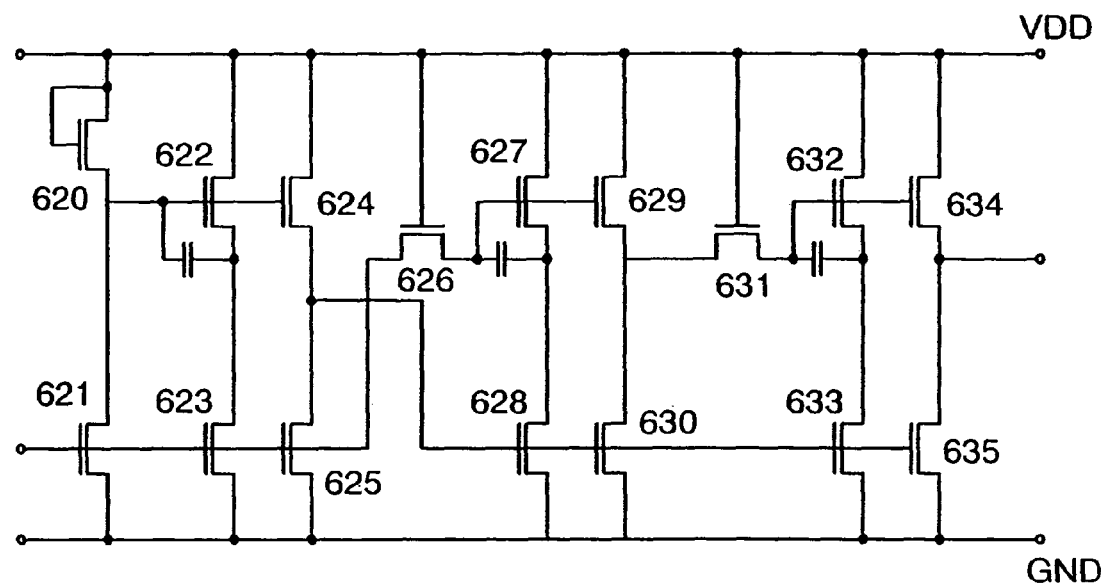
FIG. 31 shows a circuit structure in the case of forming a scanning line side driver circuit with TFTs in a display panel of the present invention (a buffer circuit).

FIG. 31 shows a specific structure of the buffer circuit 501. The buffer circuit includes N-channel type TFTs 620 to 635 in the same manner. The size of the TFT may be determined in consideration of operating characteristics of the N-channel type TFTs using a SAS. When a channel length is set to be 10 μm, for example, a channel width can be set in the range of from 10 μm to 1800 μm.

Figure 32:
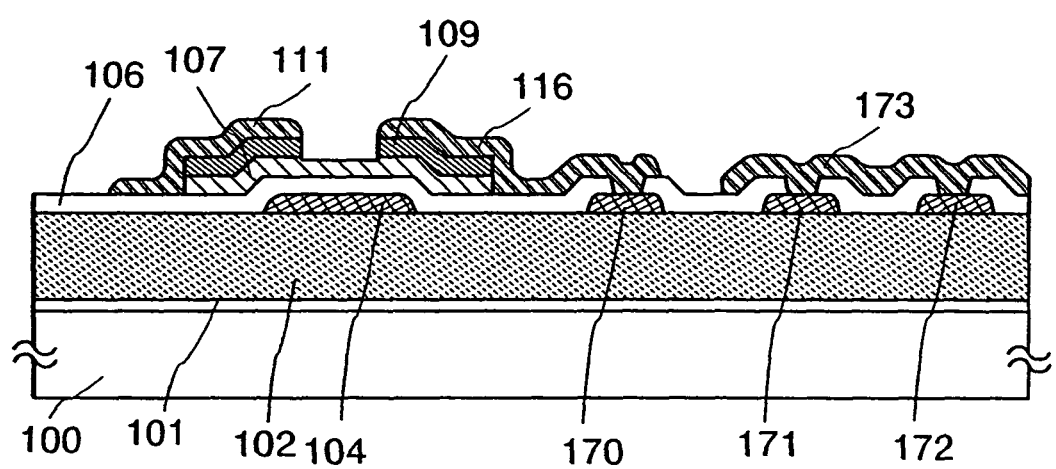
FIG. 32 shows a cross-sectional view of a display device of the present invention.

It is necessary to connect the TFTs with each other by wirings to realize such a circuit, and FIG. 32 shows a structural example of wirings in that case. FIG. 32 shows a state in which a gate electrode layer 104, a gate insulating layer 106 (lamination body of three layers of an insulating layer 106*a* made of silicon nitride, an insulating layer 106*b* made of silicon oxide, and an insulating layer 106*c* made of silicon nitride), a semiconductor layer 107 made of a SAS, an N-type semiconductor layer 109 for forming a source and a drain, and source-drain electrode layers 111 and 116 are formed as in Embodiment Mode 1. In this case, connection wiring layers 170, 171, and 172 are formed over a substrate 100 in the same step as that of the gate electrode layer 104. Then, the gate insulating layer 106 is partly etched so that the connection wiring layers 170, 171, and 172 are exposed. Various circuits can be realized by appropriately connecting the TFTs by the source-drain electrode layers 111 and 116 and a connection wiring layer 173 formed in the same step.

EMBODIMENT MODE 8

A mode of mounting a driver circuit on a display panel, such as an EL display panel or a liquid crystal display panel, manufactured in Embodiment Modes 1 to 7 is described.

First, a display device employing a COG method is described with reference to FIG. 11. A pixel portion 3701 for displaying information such as characters and images and a scanning line side driver circuit 3702 are provided over a substrate 3700. A substrate provided with a plurality of driver circuits is divided into rectangles, and the divided driver circuits (hereinafter referred to as a driver IC) 3705*a* and 3705*b* are mounted on the substrate 3700. FIG. 11 shows a mode of mounting a plurality of driver ICs 3705*a* and 3705*b* and a tape 3704*a* and 3704*b* on the end of the driver ICs 3705*a* and 3705*b*. In addition, a divided size may be made almost the same as a length of a side of a pixel portion on a signal line side, and a tape may be mounted on the end of a singular driver IC.

A TAB method may be adopted; in that case, a plurality of tapes may be attached and a driver IC may be mounted on the tape. Similarly to the case of a COG method, a singular driver IC may be mounted on a singular tape; in that case, a metal piece or the like for fixing the driver IC may be attached together in terms of a problem of intensity.

A plurality of the driver ICs to be mounted on a display panel is preferably formed over the rectangular substrate having a side of from 300 mm to 1000 mm or more in terms of improving productivity.

In other words, a plurality of circuit patterns including a driver circuit portion and an input-output terminal as a unit is formed over the substrate, and may be lastly divided and taken out. In consideration of a side length of the pixel portion and the pixel pitch, the driver IC may be formed to be a rectangle having a long side of from 15 mm to 80 mm and a short side of from 1 mm to 6 mm. Alternatively, the driver IC may be formed to have a long side length of adding a side length of the pixel portion to a side length of each driver circuit.

An advantage of an external dimension over an IC chip of a driver IC is a length of a long side. When a driver IC having a long side of from 15 mm to 80 mm is used, the number necessary for mounting in accordance with the pixel portion is less than that in the case of using an IC chip. Therefore, a yield in manufacturing can be improved. When a driver IC is formed over a glass substrate, productivity is not harmed, without limitation due to a shape of a substrate used as a mother body. This is a great advantage as compared with the case of taking IC chips out of a circular silicon wafer.

In FIG. 11, the driver ICs 3705*a* and 3705*b* provided with a driver circuit is mounted on a region outside the pixel portion 3701. The driver ICs 3705*a* and 3705*b* are signal line side driver circuits. In order to form a pixel portion corresponding to RGB full color, 3072 signal lines are required for an XGA class and 4800 signal lines are required for a UXGA class. The signal lines formed in such a number are divided into several blocks on an edge portion of the pixel portion 3701 and are provided with a lead line. The signal lines are gathered in relation to pitches of output terminals of the driver ICs 3705a and 3705b.

The driver IC is preferably made of a crystalline semiconductor formed over a substrate. The crystalline semiconductor is preferably formed by being irradiated with continuous wave laser light. Therefore, a continuous wave solid laser or gas laser is used as an oscillator for generating the laser light. There are few crystal defects when a continuous wave laser is used, and as a result, a transistor can be formed by using a polycrystalline semiconductor layer with a large grain size. In addition, high-speed driving is possible since mobility or response speed is favorable, and it is possible to further improve an operating frequency of an element than that of the conventional element. Therefore, high reliability can be obtained since there are few characteristics variations. Note that a channel-length direction of a transistor and a scanning direction of laser light may be directed in the same direction to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous wave laser. The channel length direction coincides with a flowing direction of a current, in other words, a direction in which an electric charge moves in a channel formation region. The thus manufactured transistor has an active layer including a polycrystalline semiconductor layer in which a crystal grain is extended in a channel direction, and this means that a crystal grain boundary is formed almost along a channel direction.

In order to perform laser crystallization, it is preferable to largely narrow down the laser light, and a beam spot thereof preferably has the same width as that of a short side of the driver ICs, approximately from 1 mm to 3 mm. In addition, in order to secure an enough and effective energy density for an object to be irradiated, an irradiation region of the laser light is preferably in a linear shape. As used herein, the term "linear" refers to not a line in a strict sense but a rectangle or an oblong with a large aspect ratio. For example, the linear shape refers to a rectangle or an oblong with an aspect ratio of 2 or more (preferably from 10 to 10000). Thus, it is possible to provide a method for manufacturing a display device in which productivity is improved by making a beam spot width of the laser light and that of a short side of the driver ICs the same length.

FIG. 11 shows a mode in which the scanning line side driver circuit is integrally formed with the pixel portion and the driver IC is mounted as the signal line side driver circuit. However, the present invention is not limited to this mode, and the driver ICs may be mounted as both the scanning line side driver circuit and the signal line side driver circuit. In that case, it is preferable to differentiate specifications of the driver ICs to be used on the scanning line side and on the signal line side.

In the pixel portion 3701, the signal line and the scanning line intersect to form a matrix and a transistor is arranged in accordance with each intersection. A TFT having an amorphous semiconductor or a semi-amorphous semiconductor as a channel portion is used as the transistor arranged in the pixel portion 3701 in the present invention. The amorphous semiconductor is formed by a method such as a plasma CVD method or a sputtering method. It is possible to form the semi-amorphous semiconductor at a temperature of 300° C. or less by a plasma CVD method. A film thickness necessary to form a transistor is formed in a short time even in the case of a non-alkaline glass substrate of an external size of, for example, 550 mm×650 mm. The feature of such a manufacturing technique is effective in manufacturing a large-area display device. In addition, a semi-amorphous TFT can obtain field effect mobility of from 2 $cm^2$/V·sec to 10 $cm^2$/V·sec by forming a channel formation region of a SAS. Therefore, this TFT can be used as a switching element of pixels and as an element constituting the scanning line side driver circuit. Thus, a display panel in which system-on-panel is realized can be manufactured.

Note that FIG. 11 is on the premise that the scanning line side driver circuit is also integrally formed over the substrate by using a TFT having a semiconductor layer formed of a semi-amorphous semiconductor (SAS). In the case of using a TFT having a semiconductor layer formed of an amorphous semiconductor (AS), a driver IC may be mounted as both the scanning line side driver circuit and the signal line side driver circuit.

In that case, it is preferable to differentiate specifications of the driver ICs to be used on the scanning line side and on the signal line side. For example, a transistor constituting the scanning line side driver ICs is required to withstand a voltage of approximately 30 V; however, a drive frequency is 100 kHz or less and high-speed operation is not comparatively required. Therefore, it is preferable to set sufficiently long a channel-length (L) of the transistor included in the scanning line side driver. On the other hand, a transistor of the signal line side driver ICs is required to withstand a voltage of only approximately 12 V; however, a drive frequency is around 65 MHz at 3 V and high-speed operation is required. Therefore, it is preferable to set a channel-length or the like of the transistor included in a driver with a micron rule.

A method for mounting a driver IC is not particular limited and a know method such as a COG method, a wire bonding method, or a TAB method can be employed.

Height between the driver IC and the opposing substrate can be made almost the same by forming the driver IC to have the same thickness as that of the opposing substrate, which contributes to thinning of a display device as a whole. When both substrates are made of one material, thermal stress is not generated and characteristics of a circuit including a TFT are not harmed even when temperature change is caused in the display device. Furthermore, the number of driver ICs to be mounted on one pixel portion can be reduced by mounting a longer driver IC than an IC chip as a driver circuit as described in this embodiment mode.

As described above, a driver circuit can be incorporated in a display panel.

EMBODIMENT MODE 9

A structure of a pixel in an EL display panel to be described in this embodiment mode is described with reference to equivalent circuit diagrams shown in FIGS. 33A to 33F.

Figure 33A:
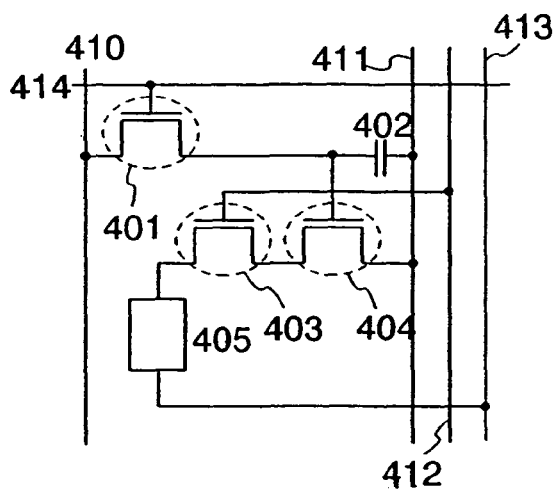
FIGS. 33A to 33F are circuit diagrams showing pixel structures applicable to EL display panels of the present invention.

In a pixel shown in FIG. 33A, a signal line 410 and power supply lines 411 to 413 are arranged in a column direction and a scanning line 414 is arranged in a row direction. In addition, the pixel includes a TFT 401 that is a switching TFT, a TFT 403 that is a driving TFT, a TFT 404 that is a current control TFT, a capacitor element 402, and a light emitting element 405.

Figure 33B:
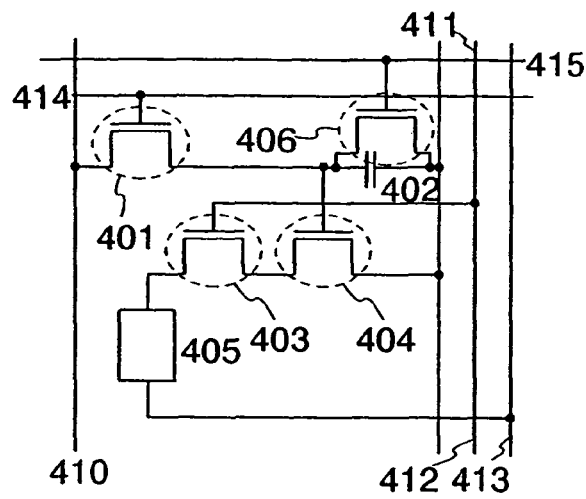
Figure 33C:
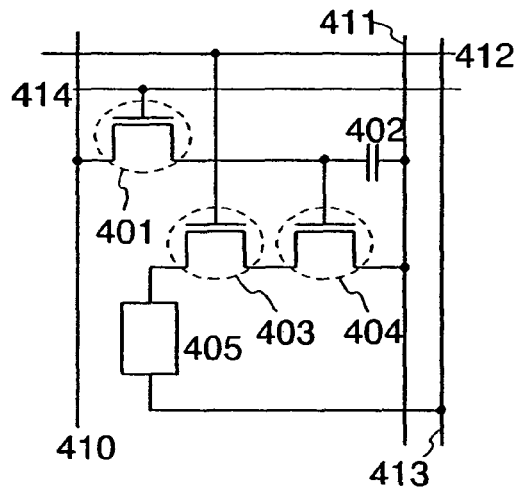

A pixel shown in FIG. 33C is different in the way that a gate electrode of a TFT 403 is connected to a power supply line 415 arranged in a column direction, but other than that, the pixel has a similar structure to the pixel shown in FIG. 33A. In other words, equivalent circuit diagrams of both of the pixels shown in FIGS. 33A and 33C are the same. However, each power supply line is formed using a conductive layer in a different layer when the power supply line 415 is arranged in a row direction (FIG. 33A) and when the power supply line 415 is arranged in a column direction (FIG. 33C). Here, a wiring connected to the gate electrode of the TFT 403 that is a driving TFT is focused and the figures are separately shown in FIGS. 33A and 33C to show that the wirings are formed in different layers.

In the pixels shown in FIG. 33A and FIG. 33C, TFTs 403 and 404 are connected in series in the pixel. A channel length $L_3$ and a channel width $W_3$ of the TFT 403 and a channel length $L_4$ and a channel width $W_4$ of the TFT 404 are set to satisfy $L_3/W_3:L_4/W_4=5$ to 6000:1. As an example of the case satisfying 5 to 6000:1, it is a case where $L_3$ is 500 µm, $W_3$ is 3 µm, $L_4$ is 3 µm, and $W_4$ is 100 µm.

Note that the TFT 403 operates in a saturation region and has a role of controlling the amount of electric current flowing through a light emitting element 405, and the TFT 404 operates in a linear region and has a role of controlling supply of electric current to a light emitting element 405. It is also preferable from the viewpoint of the manufacturing steps that both of the TFTs have the same conductivity type. Further, the TFT 403 may be a depletion mode TFT as well as an enhancement mode TFT. In the present invention having the above structure, the TFT 404 operates in a linear region, so that slight variation in a gate-source voltage ($V_{GS}$) of the TFT 404 does not adversely affect the amount of electric current of the light emitting element 405. In other words, the amount of electric current of the light emitting element 405 is determined by the TFT 403 which operates in a saturation region. According to the present invention having the above-described structure, luminance variation of the light emitting element, which is caused by variation in characteristics of the TFT, can be improved. Accordingly, a display device in which the image quality is improved can be provided.

Figure 33D:
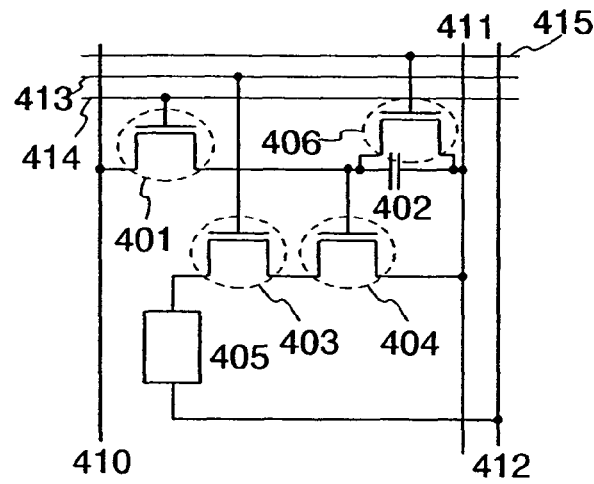

In the pixels shown in FIGS. 33A to 33D, the TFT 401 is a TFT for controlling input of a video signal to the pixel. When the TFT 801 is turned ON and the video signal is input to the pixel, the video signal is stored in the capacitor element 402. FIGS. 33A and 33D each show a structure in which the capacitor element 402 is provided; however, the invention is not limited thereto. When a gate capacitor or the like can be used as the capacitor that can hold a video signal, the capacitor element 402 may not be provided explicitly.

The light emitting element 405 has a structure in which an electroluminescent layer is sandwiched between two electrodes, and potential difference between a first electrode and a second electrode (between an anode and a cathode) is provided so that a forward bias voltage is applied. The electroluminescent layer is formed from a wide variety of materials such as an organic material and an inorganic material. Luminescence (fluorescence) in returning from a singlet excited state to a ground state and luminescence (phosphorescence) in returning from a triplet excited state to a ground state are included in luminescence of this electroluminescent layer.

The pixel shown in FIG. 33B has the same structure as the pixel shown in FIG. 33A except that a TFT 406 and a scanning line 415 are added. In the same manner, a pixel shown in FIG. 33D has the same structure as the pixel shown in FIG. 33C except that a TFT 406 and a scanning line 415 are added.

In the TFT 406, ON or OFF is controlled by the scanning line 415 that is newly arranged. When the TFT 406 is turned ON, an electric charge held in the capacitor element 402 is discharged, and the TFT 406 is turned OFF. In other words, it is possible to make a state in which current is forced not to flow through the light emitting element 405 by disposing the TFT 406. Accordingly, in the structures in FIGS. 33B and 33D, a lighting period can be started simultaneously with or immediately after a start of a writing period without waiting for writing of signals in all pixels. Consequently, a duty ratio can be improved.

Figure 33E:
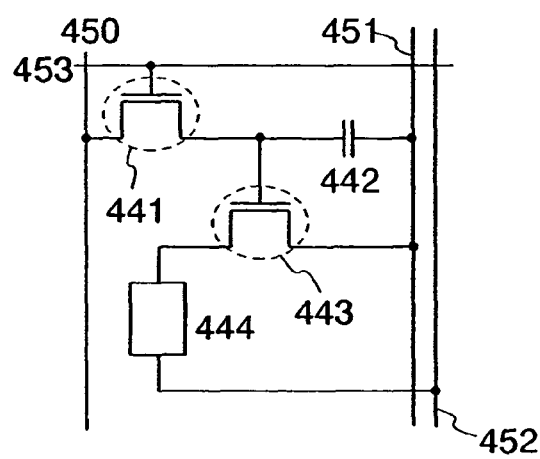
Figure 33F:
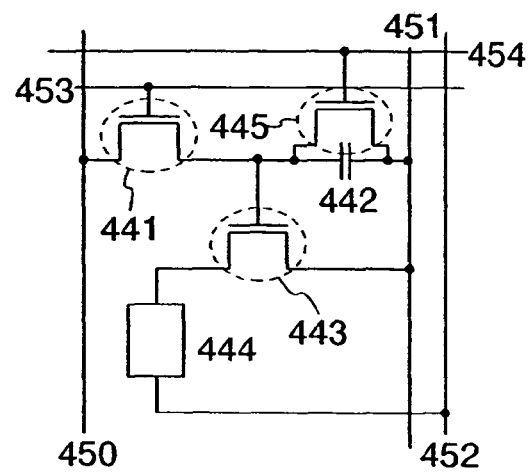

In a pixel shown in FIG. 33E, a signal line 450 and power supply lines 451 and 452 are arranged in a column direction, and a scanning line 453 is arranged in a row direction. In addition, the pixel includes a switching TFT 441, a driving TFT 443, a capacitor element 442, and a light emitting element 444. A pixel shown in FIG. 33F has the same structure as the pixel shown in FIG. 33E except that a TFT 445 and a scanning line 454 are added. A duty ratio can be increased by disposing the TFT 445 also in the structure of FIG. 33F.

EMBODIMENT MODE 10

Figure 34:
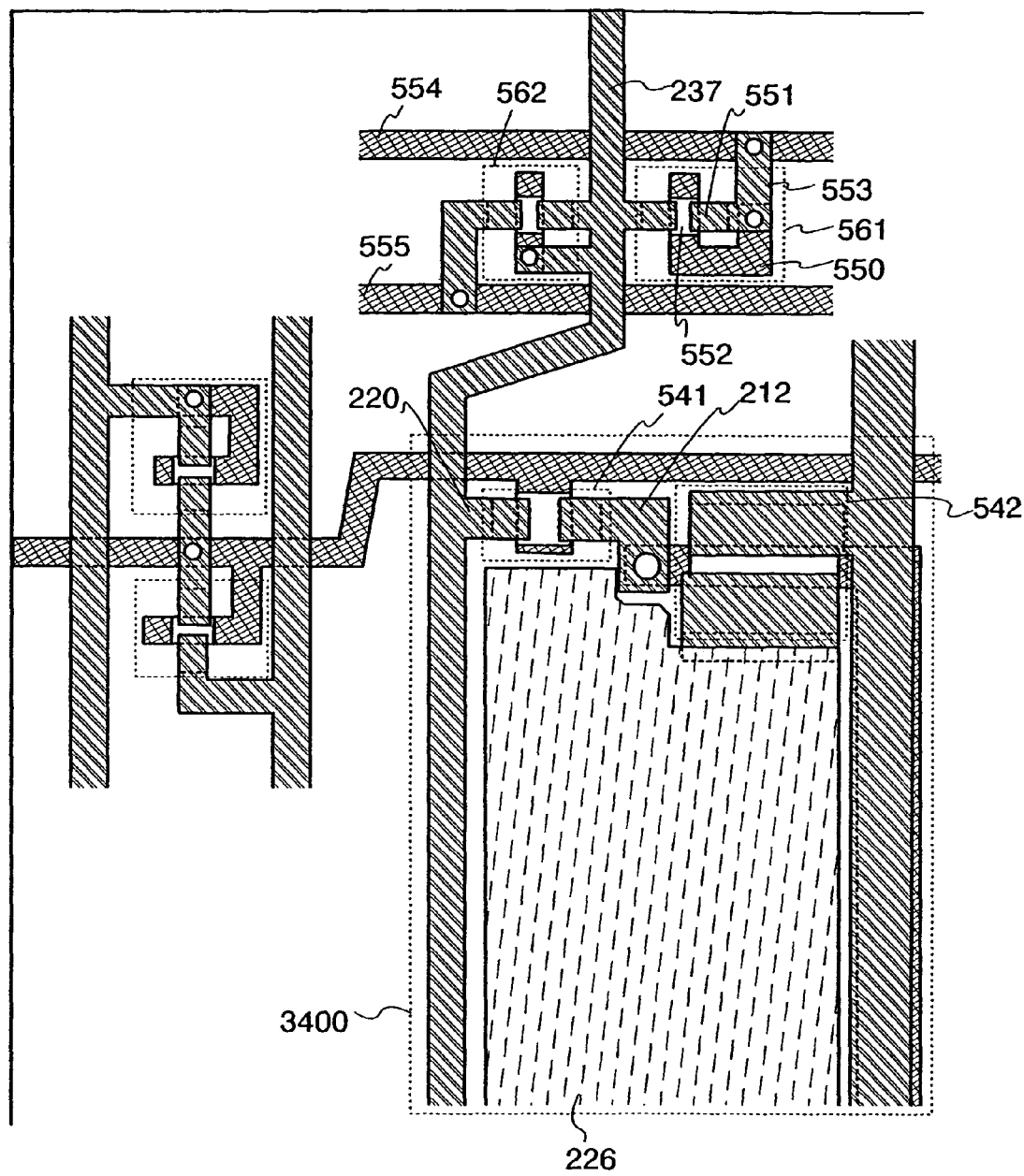
FIG. 34 is a top view showing an EL display panel of the present invention.

One mode in which a scanning line side input terminal portion and a signal line side input terminal portion are provided with a protection diode is described with reference to FIG. 34. A pixel 3400 is provided with TFTs 541 and 542 in FIG. 34. This TFT has a similar structure to that in Embodiment Mode 1.

Figure 39:
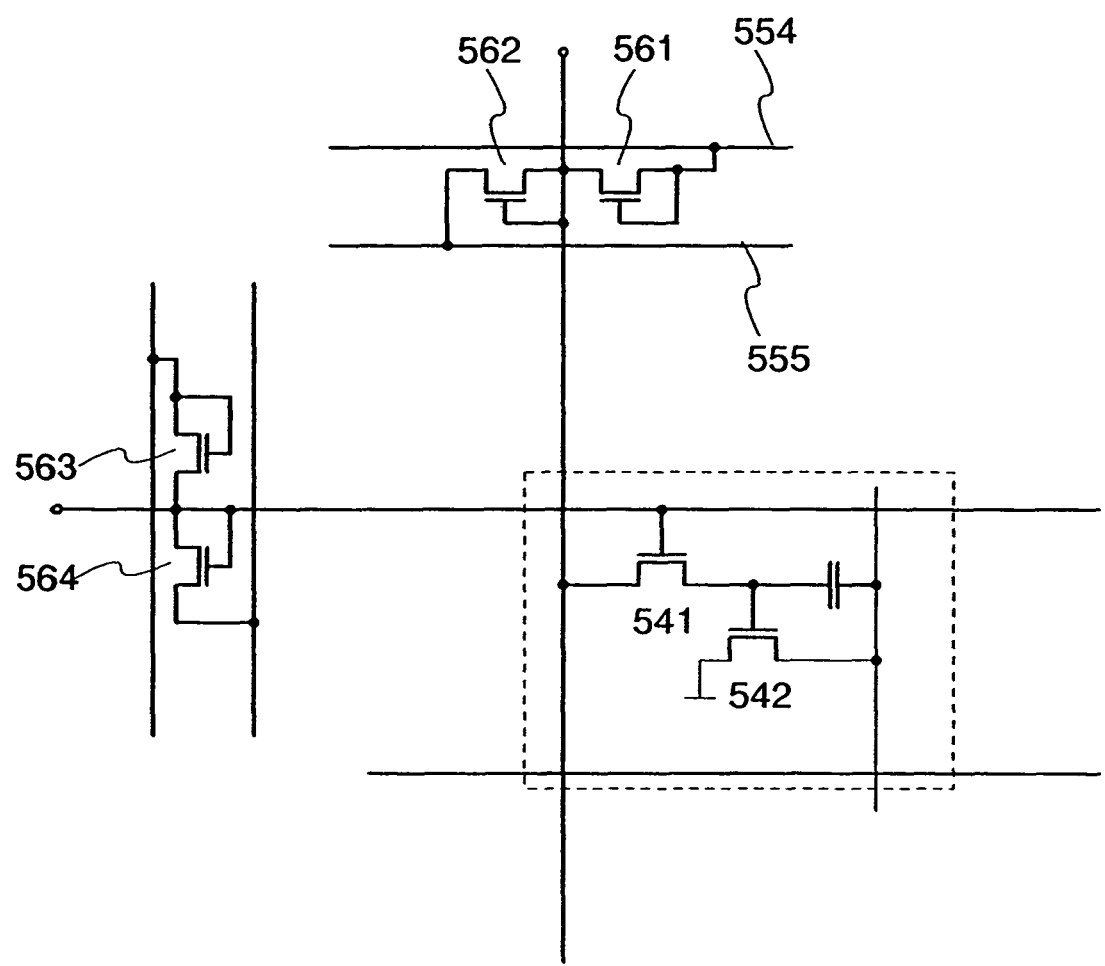
FIG. 39 is an equivalent circuit diagram of an EL display panel shown in FIG. 34.

The signal line side input terminal portion is provided with protection diodes 561 and 562. These protection diodes are manufactured in a similar step to that of the TFT 541 or 542 and operate as diodes by connecting a gate with either a drain or a source. An equivalent circuit diagram of the top view shown in FIG. 34 is shown in FIG. 39.

The protection diode 561 includes a gate electrode layer 550, a semiconductor layer 551, a channel protection insulating layer 552, and a wiring layer 553. The protection diode 562 also has the same structure. Common potential lines 554 and 555 connected to the protection diodes 561 and 562 are formed in the same layer as the gate electrode layer 550. Therefore, it is necessary to form a contact hole in the gate insulating layer to electrically connect to the wiring layer 553.

A mask layer may be formed by a droplet discharge method and an etching process may be performed to form a contact hole in the gate insulating layer. In this case, when an etching process by atmospheric pressure discharge is applied, a local discharge process is also possible, and it is unnecessary to form a mask layer over an entire surface of a substrate.

A signal wiring layer 237 is formed in the same layer as a source-drain wiring layer 212 and 220 in the TFT 541 and has a structure in which the signal wiring layer 237 connected thereto is connected to a source or drain side.

The scanning line side input terminal portion also has the same structure. According to the present invention, the protection diode provided in an input stage can be formed at the same time. Note that the position of disposing a protection diode is not limited to this embodiment mode and can be provided between a driver circuit and a pixel.

EMBODIMENT MODE 11

Figure 53:
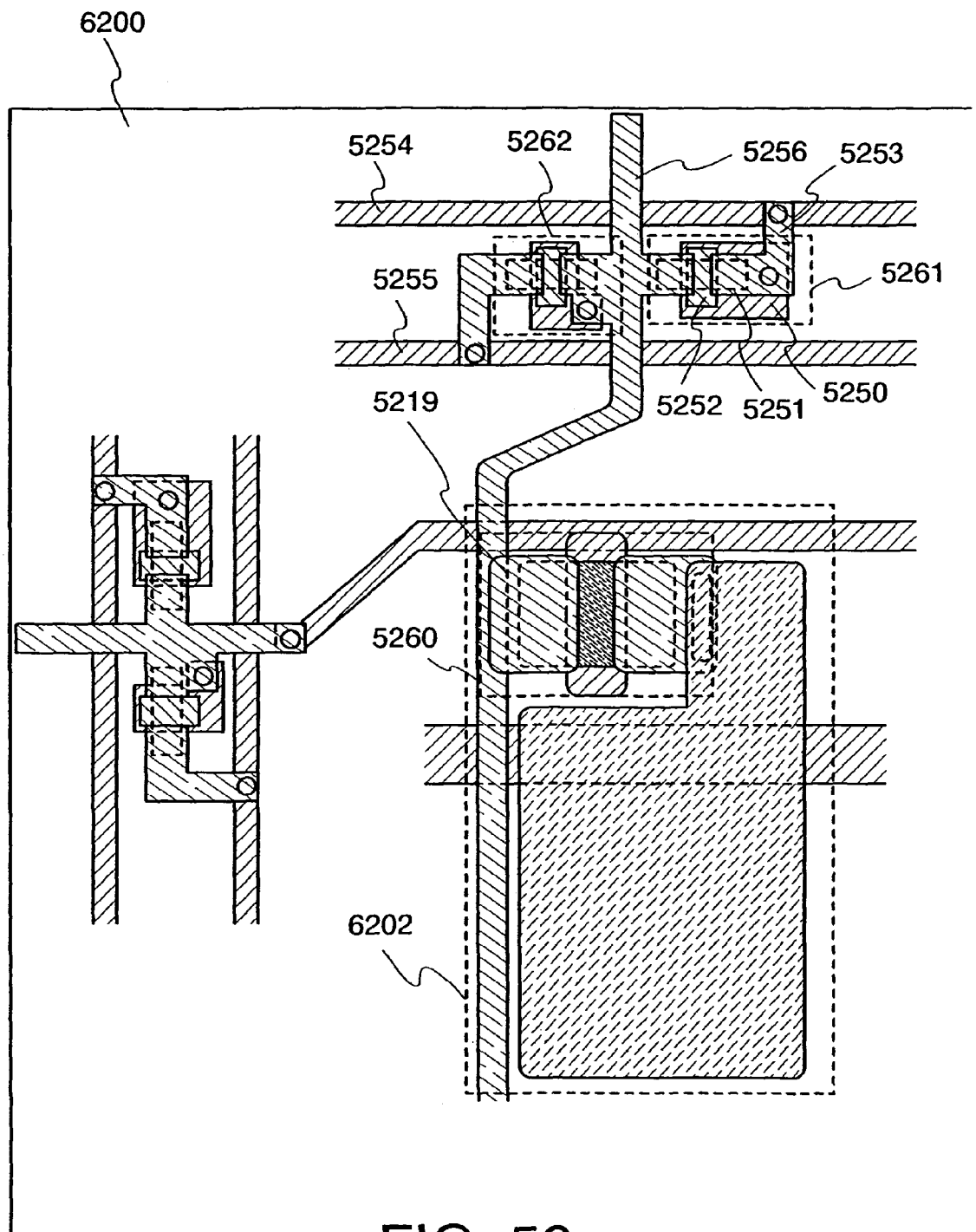
FIG. 53 is a top view showing a liquid crystal display panel of the present invention.
Figure 54:
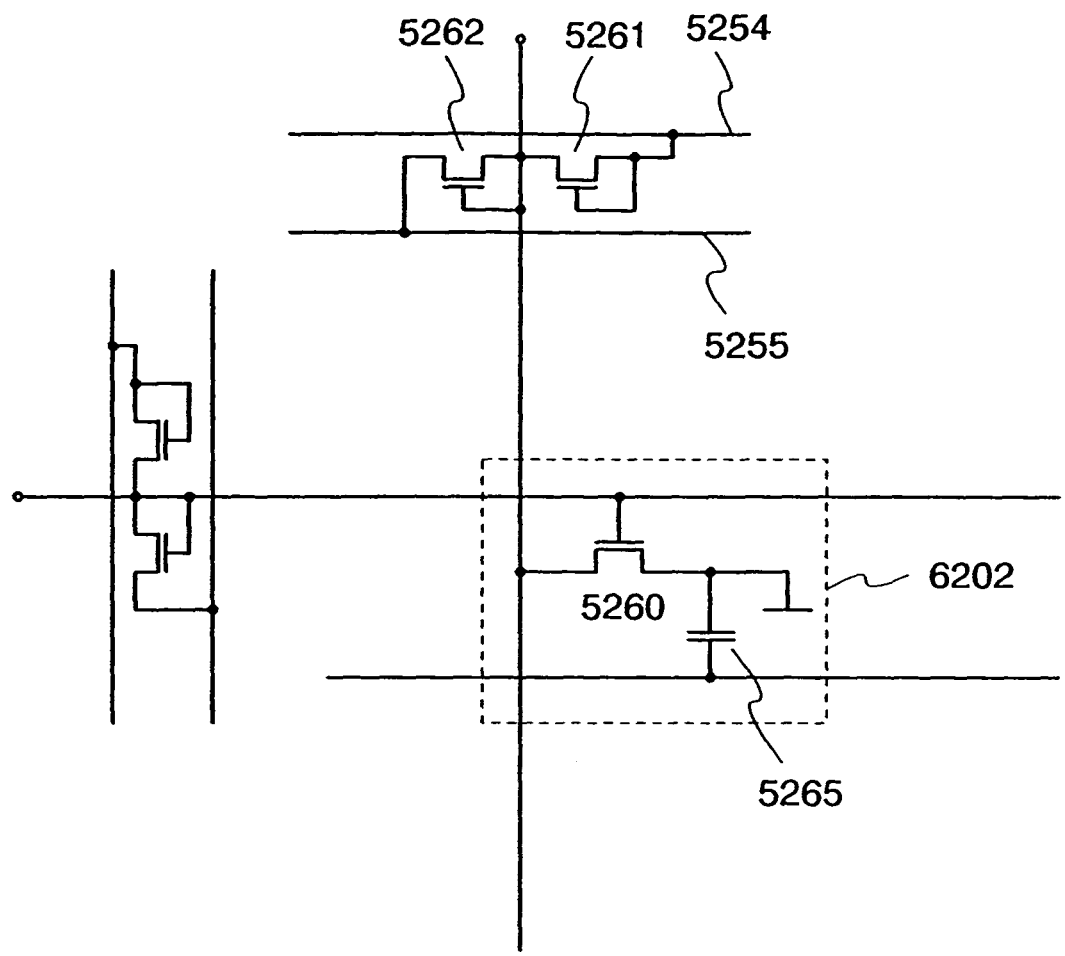
FIG. 54 is an equivalent circuit diagram of a liquid crystal display panel shown in FIG. 53.

One mode in which a scanning line side input terminal portion and a signal line side input terminal portion are provided with a protection diode is described with reference to FIG. 53 and FIG. 54. A pixel 6202 is provided with a TFT 5260 in FIGS. 53 and 54. This TFT has a similar structure to that in Embodiment Mode 5.

The signal line side input terminal portion is provided with protection diodes 5261 and 5262. These protection diodes are manufactured in a similar step to that of the TFT 5260 and operate as diodes by connecting a gate with either a drain or a source. An equivalent circuit diagram of the top view shown in FIG. 53 is shown in FIG. 54.

The protection diode 5261 over a substrate 6200 includes a gate electrode layer 5250, a semiconductor layer 5251, a channel protection insulating layer 5252, and a wiring layer 5253. The protection diode 5262 also has the same structure. Common potential lines 5254 and 5255 connected to this protection diode are formed in the same layer as the gate electrode layer 5250. Therefore, it is necessary to form a contact hole in the gate insulating layer to electrically connect to the wiring layer 5253.

A mask layer may be formed by a droplet discharge method and an etching process may be performed to form a contact hole in the gate insulating layer. In this case, when an etching process by atmospheric pressure discharge is applied, a local discharge process is also possible, and it is unnecessary to form a mask layer over an entire surface of a substrate.

The protection diode 5261 or 5262 is formed in the same layer as a source-drain wiring layer 5219 in the TFT 5260 and has a structure in which a signal wiring layer 5256 connected thereto is connected to a source or drain side.

The scanning line side input terminal portion also has the same structure. According to the present invention, the protection diode provided in an input stage can be formed at the same time. Note that the position of disposing a protection diode is not limited to this embodiment mode and can be provided between a driver circuit and a pixel.

EMBODIMENT MODE 12

Figure 28:
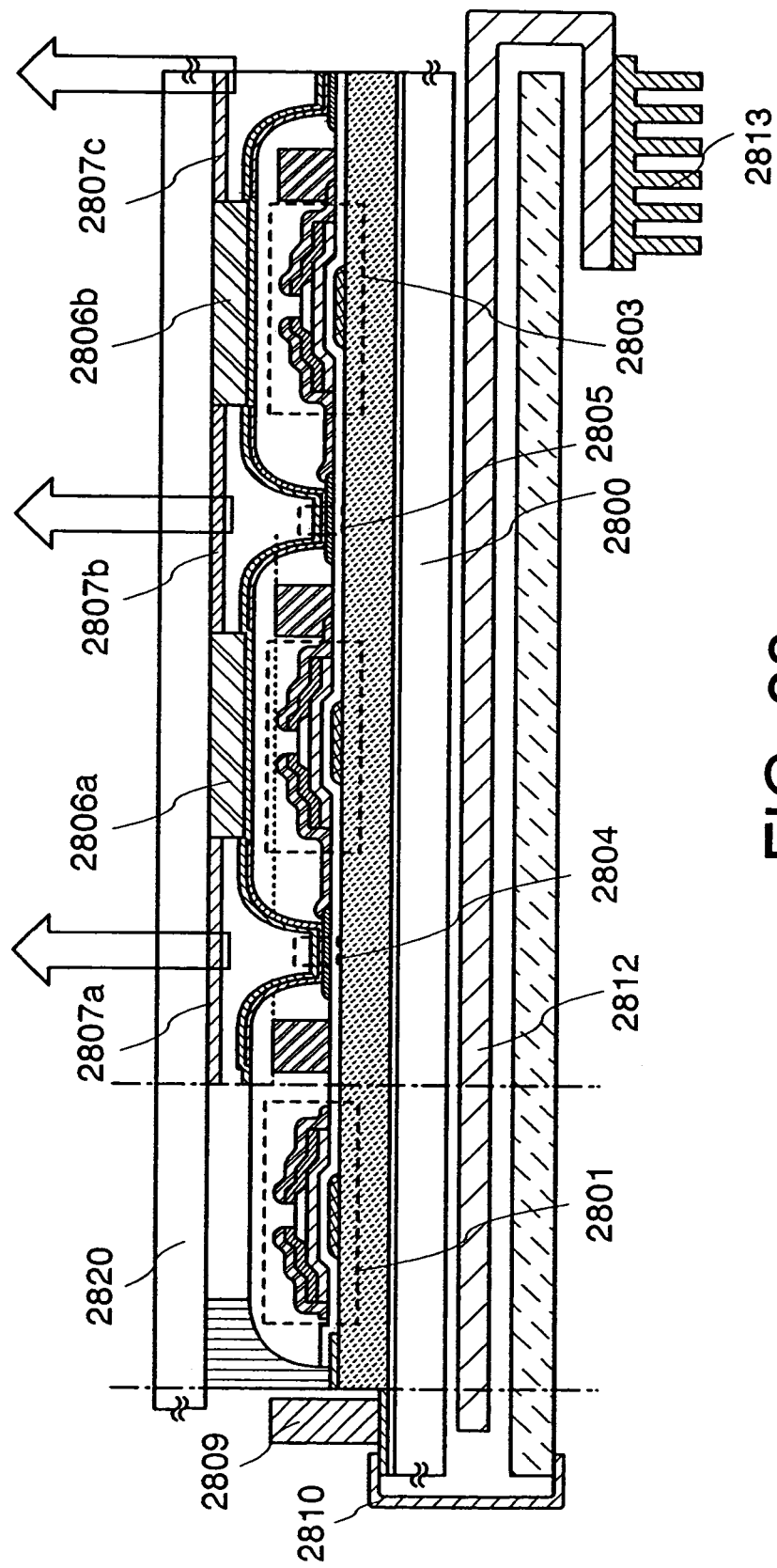
FIG. 28 is a cross-sectional view showing a structure example of an EL display module of the present invention.
Figure 35:
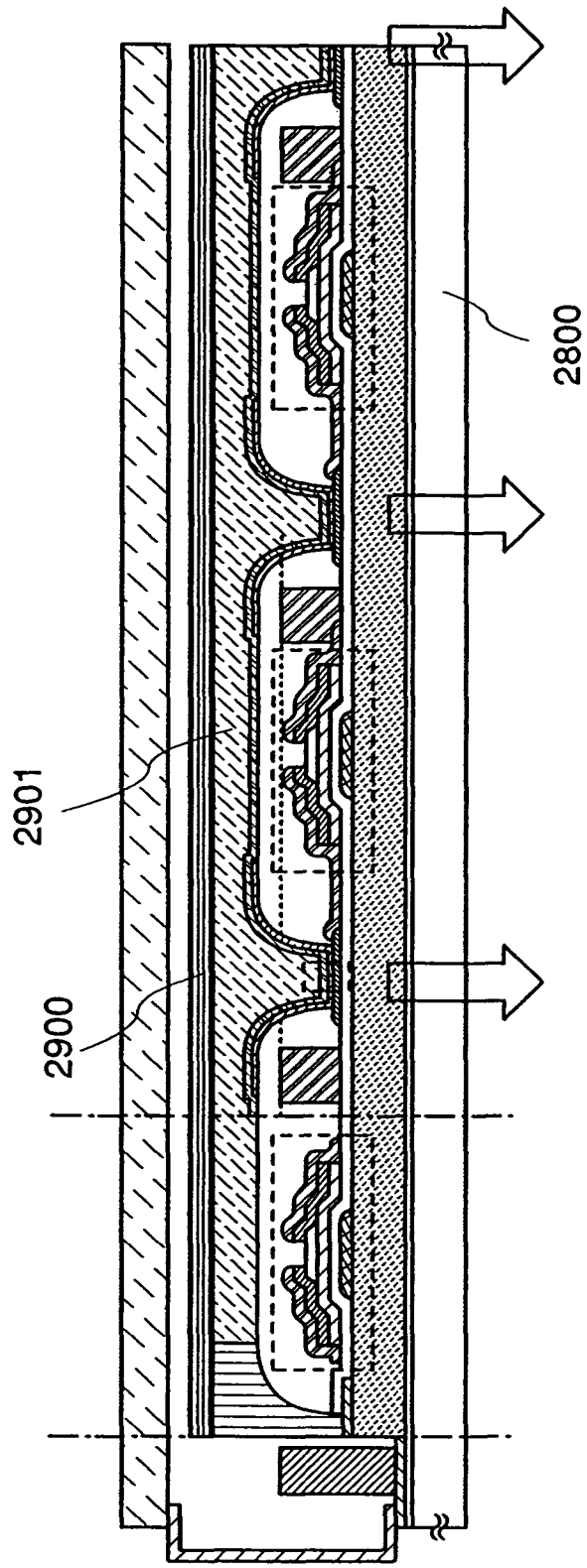
FIG. 35 is a cross-sectional view showing a structure example of an EL display module of the present invention.

FIGS. 28 and 35 each show an example of constituting an EL display module by using a TFT substrate 2800 manufactured by a droplet discharge method. In FIGS. 28 and 35, a pixel portion including a pixel is formed over the TFT substrate 2800.

In FIG. 28, a similar TFT to that formed in a pixel or a protection circuit portion 2801 operating in the same manner as a diode by connecting a gate with either of a source or a drain of the TFT is provided between a driver circuit and the pixel outside the pixel portion. A driver IC made of a single crystal semiconductor, a stick driver IC made of a polycrystalline semiconductor film over a glass substrate, a driver circuit made of a SAS, or the like is applied to a driver circuit 2809.

The TFT substrate 2800 is fixed to a sealing substrate 2820 with spacers 2806a and 2806b formed by a droplet discharge method therebetween. Even when the substrate has thin thickness and an area of the pixel portion is enlarged, the spacer is preferably provided to keep a distance between the two substrates constant. A light-transmitting resin material may be filled in the gap between the TFT substrate 2800 and the sealing substrate 2820 over light emitting elements 2804 and 2805 and may be solidified, or anhydrous nitrogen or an inert gas may be filled therein.

FIG. 28 shows the case where the light-emitting elements 2804 and 2805 have a top emission type structure, in which light is radiated in a direction indicated by an arrow shown in the drawing. Each pixel can perform multicolor display, by differentiating light-emitting colors by using the pixel for red, the pixel for green, and the pixel for blue. At this time, color purity of the luminescence emitted outside can be improved by forming colored layers 2807a, 2807b, and 2807c corresponding to each color on the side of the sealing substrate 2820. In addition, the pixels may each be used as the white light-emitting element and be combined with the colored layers 2807a, 2807b, and 2807c.

A driver circuit 2809 is connected to a scanning line or signal line connection terminal provided on one end of the TFT substrate 2800 with a wiring board 2810. In addition, a heat pipe 2813 and a heat sink 2812 may be provided to be in contact with the TFT substrate 2800 or in the vicinity thereof to have a structure in which a heat dissipation effect is improved.

FIG. 28 shows a top emission type EL module; however, a bottom emission structure may be employed by changing the structure of the light-emitting element or the arrangement of the external circuit substrate.

FIG. 35 shows an example in which a resin film 2900 is attached by using a sealant and an adhesive resin 2901 onto the side where a pixel portion is formed over a TFT substrate 2800 to form a sealing structure. A gas barrier film for preventing penetration of water vapor may be provided on the surface of the resin film 2900. FIG. 35 shows a bottom emission structure in which light of a light-emitting element is emitted through the substrate; however, a top emission structure is also acceptable by giving light-transmitting properties to the resin film 2900 or the adhesive resin 2901. In either case, much more thin and lighter display device can be obtained by adopting a film sealing structure.

EMBODIMENT MODE 13

Figure 26:
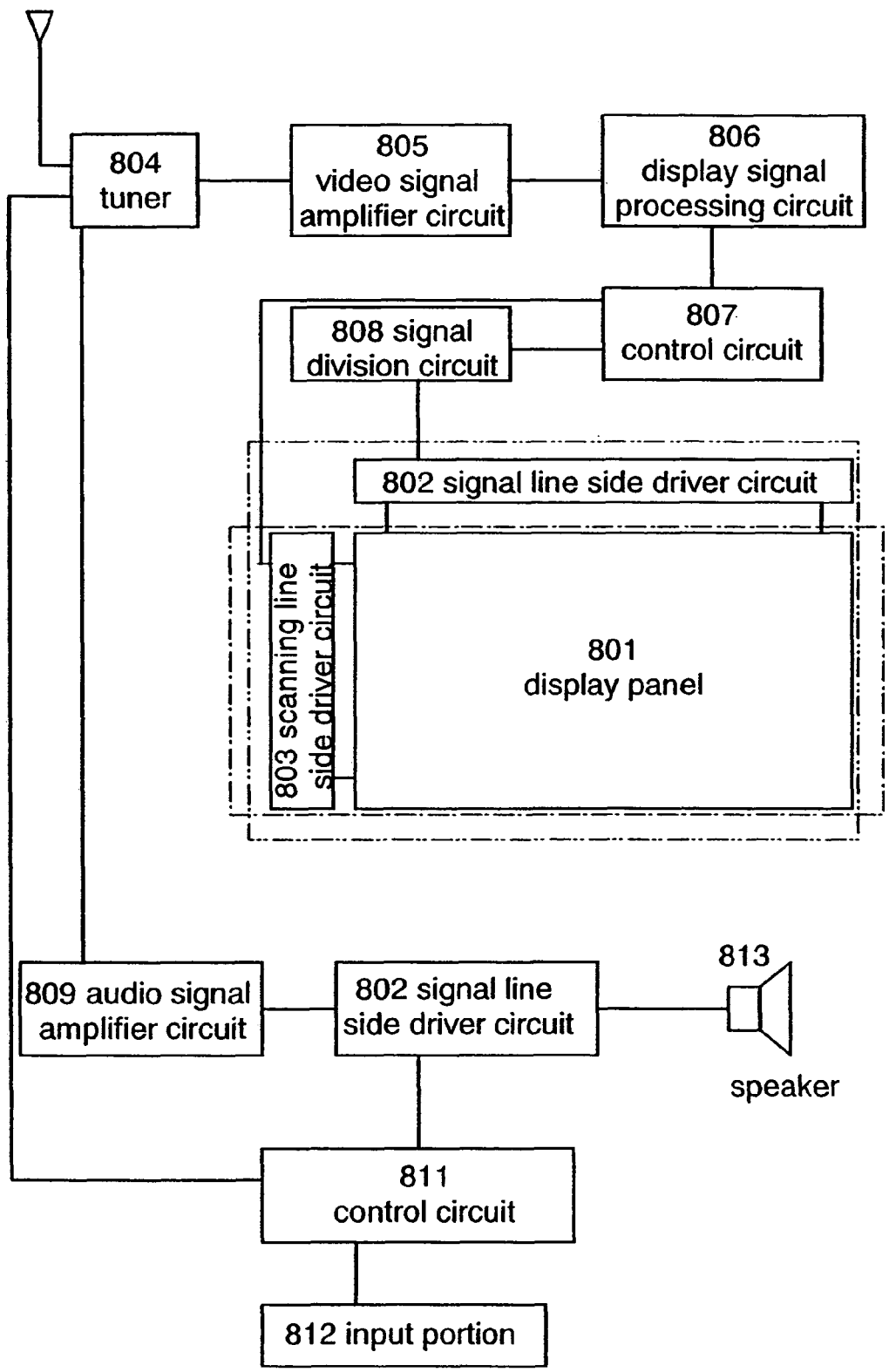
FIG. 26 is a block diagram showing a main structure of an electronic device of the present invention.

A television apparatus can be completed by using a display device formed according to the present invention. FIG. 26 is a block diagram showing a main structure of the television apparatus. A display panel includes, as a structure as shown in FIG. 38, the case that only a pixel portion 801 is formed and a scanning line side driver circuit 803 and a signal line side driver circuit 802 are mounted by a TAB method, that a scanning line side driver circuit 803 and a signal line side driver circuit 802 are mounted on a pixel portion 801 and a periphery thereof by a COG method, and that a TFT is formed using a SAS, a pixel portion 801 and a scanning line side driver circuit 803 are integrally formed over a substrate, and a signal line side driver circuit 802 is separately mounted as a driver IC. Any mode may be employed.

Another external circuit may be composed of a video signal amplifier circuit 805 which amplifies a video signal among signals received by a tuner 804, a video signal processing circuit which converts a signal to be outputted therefrom into a chrominance signal corresponding to each color of red, green, and blue, a control circuit 807 which converts the video signal into an input specification of a driver IC, and the like on an input side of a video signal. The control circuit 807 outputs a signal to both a scanning line side and a signal line side. In the case of digital driving, a signal division circuit 808 may be provided on the signal line side and may have a structure in which input digital signals are divided into m signals and supplied.

An audio signal among signals received by the tuner 804 is transmitted to an audio signal amplifier circuit 809 and is supplied to a speaker 813 through an audio signal processing circuit 810 to be outputted. A control circuit 811 receives control information on a receiving station (receive frequency) or volume from an input portion 812 and transmits the signal to the tuner 804 and the audio signal processing circuit 810.

Figure 55:
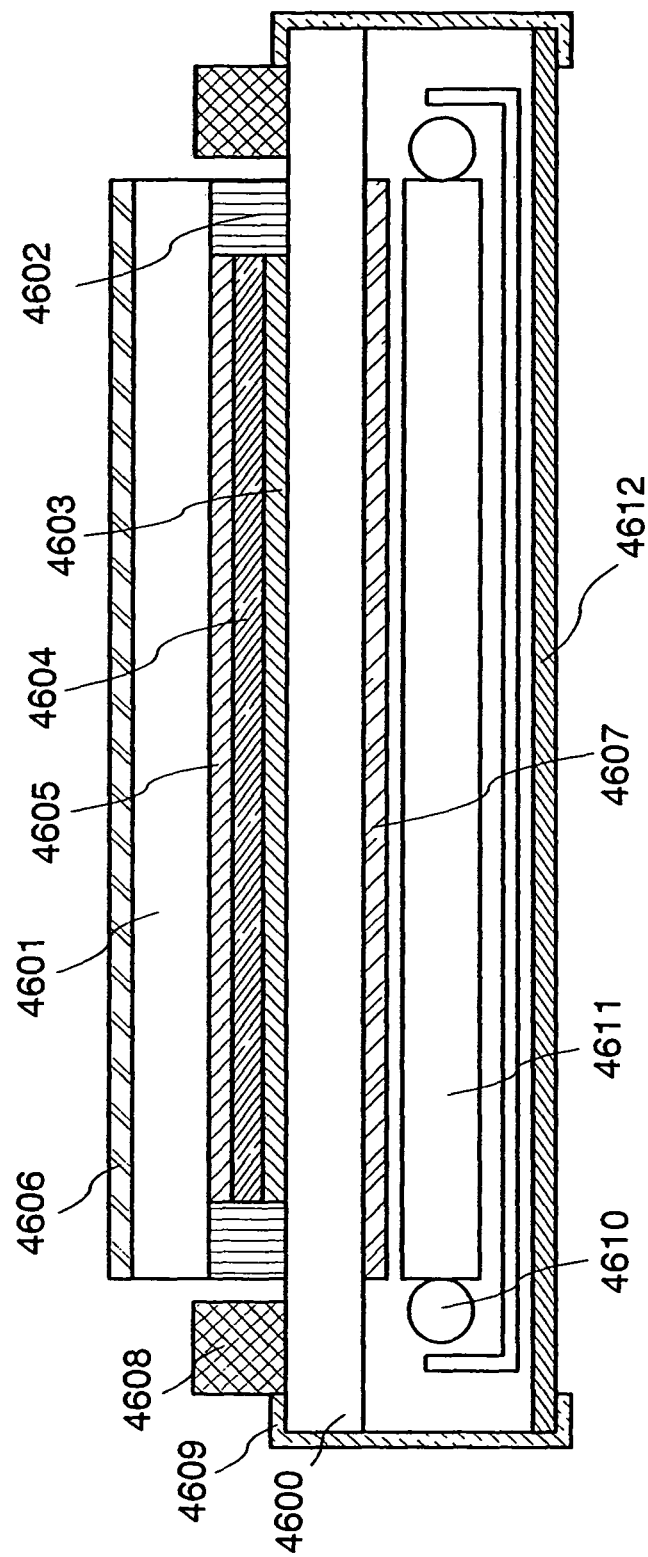
FIG. 55 shows a structure of a liquid crystal display module of the present invention.

FIG. 55 is an example of a liquid crystal display module. A TFT substrate 4600 and an opposing substrate 4601 are fixed to each other with a sealant 4602, and a pixel portion 4603 and a liquid crystal layer 4604 are provided therebetween to form a display region. A colored layer 4605 is required to perform color display. In the case of RGB system, a colored layer corresponding to each color of red, green, and blue is provided corresponding to each pixel. Polarizing plates 4606 and 4607 are provided outside the TFT substrate 4600 and the opposing substrate 4601. A light source includes a cold cathode fluorescent tube 4610 and a light guiding plate 4611; a circuit board 4612 is connected to an external circuit 4608 over the TFT substrate 4600 by a flexible wiring board 4609; and an external circuit such as a control circuit or a power supply circuit is incorporated.

Figure 24:
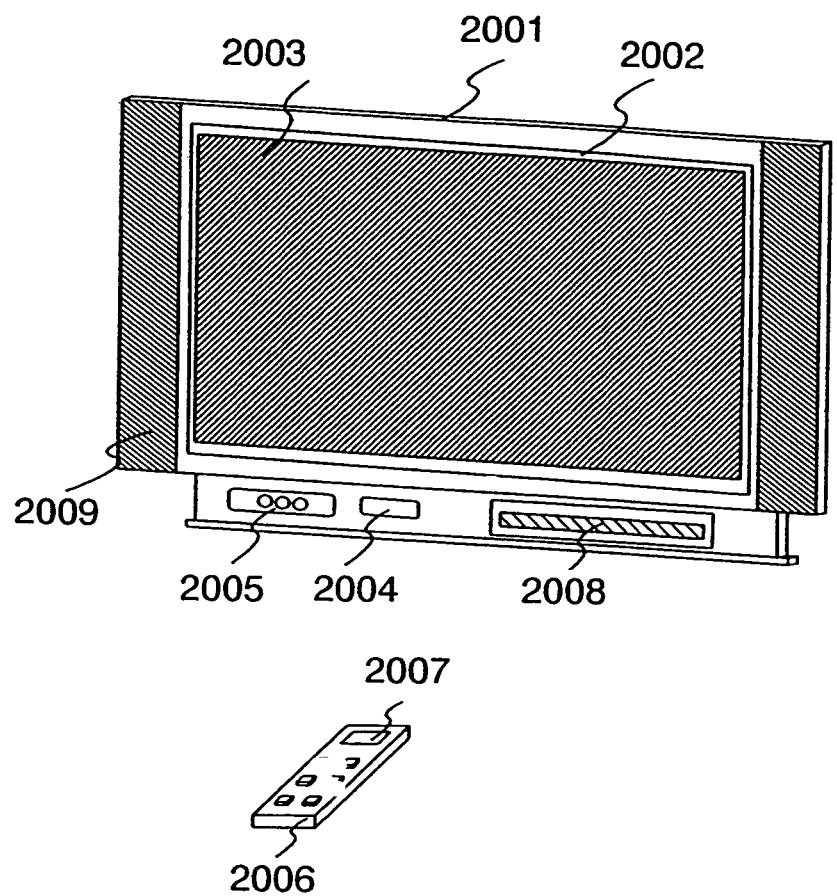
FIG. 24 shows an electronic device to which the present invention is applied.

A television apparatus can be completed by incorporating a display module such as an EL module or a liquid crystal display module into a chassis 2001 as shown in FIG. 24. A main screen 2003 is formed by using a display module, and a speaker portion 2009, an operation switch, and the like may be provided as an attachment. Thus, a television apparatus can be completed according to the present invention.

Figure 36:
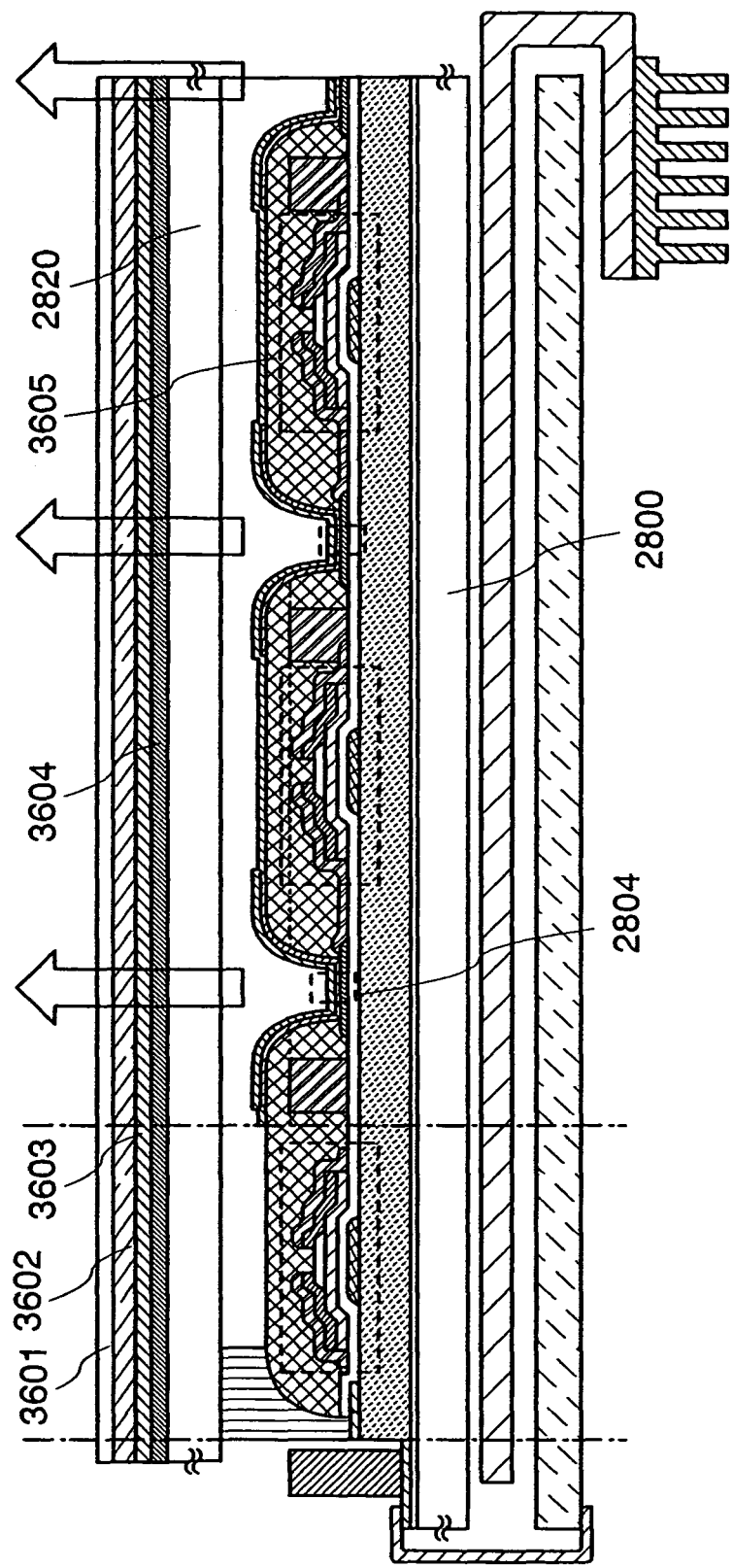
FIG. 36 is a cross-sectional view showing a structure example of an EL display module of the present invention.

In addition, reflected light of light entering from outside may be blocked by using wave plates 3603 and 3604 and a polarizing plate 3602 as shown in FIG. 36. FIG. 36 shows a top emission structure, in which an insulating layer 3605 to be a partition wall is colored to use as a black matrix. The partition wall can be formed by a droplet discharge method, and a carbon black or the like may be mixed in a resin material such as polyimide, or a laminate thereof may be used. The partition wall may be formed by discharging different materials to the same region plural times with a droplet discharge method. A quarter-wave plate, a half-wave plate are used as wave plates 3603 and 3604, and may be designed to be able to control light. A module has a laminated structure of a TFT substrate 2800, a light emitting element 2804, a sealing substrate (sealant) 2820, wave plates 3603 and 3604 (a quarter-wave plate\a half-wave plate), and a polarizing plate 3602, and light emitted from a light emitting element passes therethrought and is emitted outside on a polarizing plate side. The wave plate and the polarizing plate may be provided on an emitted side of light. In the case of a dual emission light emitting display device which emits light on both sides, the wave plate and the polarizing plate can be provided on both sides. In addition, an anti-reflective film 3601 may be provided outside the polarizing plate. This makes it possible to display a high-definition precise image.

A display panel 2002 utilizing an EL element is incorporated in the chassis 2001. Not only can ordinary TV broadcasting be received by a receiver 2005, but also one-way information communication (from a transmitter to a receiver) or two-way information communication (between a transmitter and a receiver or between receivers) can be achieved by connecting to a communication network with or without a wire through a modem 2004. The television apparatus can be operated by a switch incorporated in the chassis or a separately-provided remote control unit 2006, and a display portion 2007 showing information to be outputted may be included for the remote control unit.

Further, also the television apparatus may be made to have a structure which displays channels or volume by forming a sub screen 2008 using a second display panel as well as a main screen 2003. The main screen 2003 may be formed by using a liquid crystal display panel capable of displaying at low power consumption, and the sub screen may be formed by using an EL display panel having an excellent viewing angle and can be turned on and off. A highly reliable display device can be formed by applying the present invention even when such a large-sized substrate is used, and thus, a large number of TFT or electronic parts are used.

Naturally, the present invention is not limited to a television apparatus and can be applied to various uses particularly as a large-area display medium such as an information display board in a train station, an airport, or the like, or an advertisement display board in the street as well as a monitor of a personal computer.

EMBODIMENT MODE 14

Various display devices can be manufactured by applying the present invention. That is to say, the present invention can be applied to various electronic devices in which the display devices are incorporated in a display portion.

Such electronic devices can be given as follows: a video camera; a digital camera; a projector; a head mounted display (a goggle type display); a car navigation system; a car stereo; a personal computer; a gaming machine; a personal digital assistance (a mobile computer, a cellular phone, an electronic book, or the like); an image reproducing device including a recording medium (specifically, a device capable of processing data in a recording medium such as a Digital Versatile Disc (DVD) and having a display that can display the image of the data); and the like. Examples thereof are shown in FIGS. 25A to 25D.

Figure 25A:
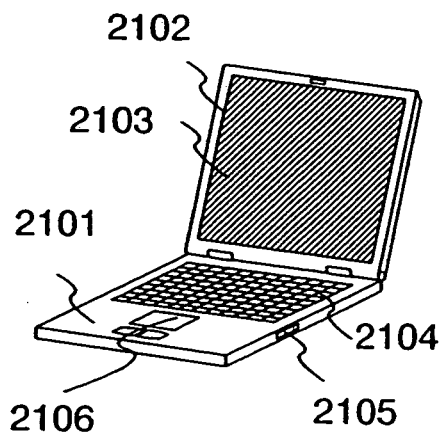
FIGS. 25A to 25D show electronic devices to which the present invention is applied.

FIG. 25A shows a laptop personal computer, which includes a main body 2101, a chassis 2102, a display portion 2103, a keyboard 2104, an external connection port 2105, a pointing mouse 2106, and the like. The present invention is applied to manufacturing of the display portion 2103. When the present invention is applied, a highly reliable high-quality image can be displayed even if the laptop personal computer is miniaturized and a wiring or the like becomes precise.

Figure 25B:
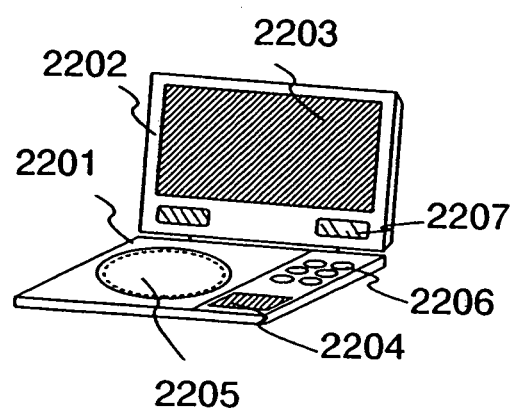

FIG. 25B shows an image reproducing device including a recording medium (specifically, a DVD reproducing device), which includes a main body 2201, a chassis 2202, a display portion A 2203, a display portion B 2204, a recording medium (a DVD or the like) reading portion 2205, an operation key 2206, a speaker portion 2207, and the like. The display portion A 2203 mainly displays image information, and the display portion B 2204 mainly displays character information. The present invention is applied to manufacturing of the display portion A 2203 and the display portion B 2204. When the present invention is applied, a highly reliable high-quality image can be displayed even if the image reproducing device is miniaturized and a wiring or the like becomes precise.

Figure 25C:
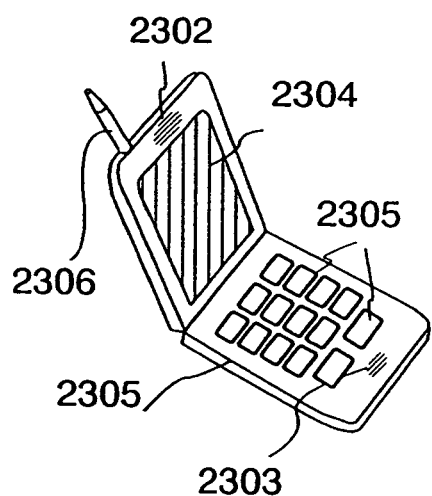

FIG. 25C shows a cellular phone, which includes a main body 2301, an audio output portion 2302, an audio input portion 2303, a display portion 2304, an operation switch 2305, an antenna 2306, and the like. A highly reliable high-quality image can be displayed by applying the display device manufactured according to the present invention to the display portion 2304 even in a cellular phone which is miniaturized and in which a wiring or the like becomes precise.

Figure 25D:
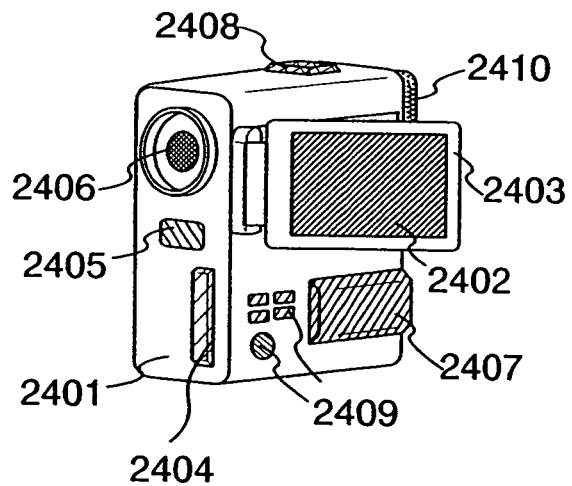

FIG. 25D shows a video camera, which includes a main body 2401, a display portion 2402, a chassis 2403, an external connection port 2404, a remote control receiving portion 2405, an image receiving portion 2406, a battery 2407, an audio input portion 2408, an operation key 2409, an eye piece, and the like. The present invention can be applied to the display portion 2402. A highly reliable high-quality image can be displayed by applying the display device manufactured according to the present invention to the display portion 2402 even in a video camera which is miniaturized and in which a wiring or the like becomes precise. This embodiment mode can be freely combined with the above embodiment mode.

EXPLANATION OF REFERENCE

100 Substrate, 101 Base film; 102a Insulating layer; 102b Insulating layer; 103 Gate wiring layer; 104 Gate electrode layer; 105 Gate electrode layer; 106 Gate insulating layer; 107 Semiconductor layer; 108 Semiconductor layer; 109 N type semiconductor layer; 110 N type semiconductor layer; 111 Drain electrode layer; 112 Conductive layer; 113 Drain electrode layer; 116 Drain electrode layer; 117 Electrode layer; 118 Source wiring layer; 119 Power supply line; 120 Insulating layer; 121 Insulating layer; 122 Electroluminescent layer; 123 Electrode layer; 140 Channel protective film; 141 Insulating layer 142 Electroluminescent layer; 143 Electrode layer; 144 Conductive layer; 145 Through-hole; 146 Insulating layer; 147 Electrode layer; 170 Connection wiring layer; 173 Connection wiring layer; 212 Drain wiring layer; 237 Signal wiring layer; 401 TFT; 402 Capacitor element; 403 TFT; 404 TFT; 405 Light emitting element; 406 TFT; 410 Signal line; 411 Power supply line; 412 Power supply line; 414 Scanning line; 415 Power supply line; 416 Scanning line; 441 Switching TFT; 442 Capacitor element; 443 Driving TFT; 444 Light emitting element; 445 TFT; 450 Signal line; 451 Power supply line; 453 Scanning line; 454 Scanning line; 461 Source-drain wiring; 462 Wiring; 463 Electrode; 464 Electroluminescent layer; 465 Electrode; 470 Source-drain wiring; 472 Electrode; 473 Electroluminescent layer; 474 Electrode; 480 Substrate; 481 Transistor; 482 Source-drain wiring; 484 Electrode; 485 Electroluminescent layer; 486 Electrode; 500 Pulse output circuit; 501 Buffer circuit; 502 Pixel; 541 TFT; 542 TFT; 550 Gate electrode layer; 551 Semiconductor layer; 552 Insulating layer; 553 Wiring layer; 554 Common potential line; 561 Protection diode; 562 Protection diode; 601 TFT; 620 TFT; 700 Substrate; 801 Pixel portion; 802 Signal line side driver circuit; 803 Scanning line side driver circuit; 804 Tuner; 805 Video signal amplifier circuit; 807 Control circuit; 808 Signal division circuit; 809 Audio signal amplifier circuit; 810 Audio signal processing circuit; 811 Control circuit; 812 Input portion; 813 Speaker; 1400 Substrate; 1403 Droplet discharge means; 1404 Imaging means; 1405 Head; 1407 Control means; 1408 Storage medium; 1409 Image processing means; 1410 Computer; 1411 Marker; 1412 Head; 1413 Material supply source; 1414 Material supply source; 1601 TFT; 1602 TFT; 1603 Light emitting element; 1604 Capacitor; 2001 Chassis; 2002 Display panel; 2003 Main screen; 2004 Modem; 2005 Receiver; 2006 Remote control unit; 2007 Display portion; 2008 Sub screen; 2009 Speaker portion; 2101 Main body; 2102 Chassis; 2103 Display portion; 2104 Keyboard; 2105 External connection port; 2106 Pointing mouse; 2201 Main body; 2202 Chassis; 2203 Display portion A; 2204 Display portion 8; 2206 Operation key; 2207 Speaker portion; 2301 Main body; 2302 Audio output portion; 2303 Audio input portion; 2304 Display portion; 2305 Operation switch; 2306 Antenna; 2401 Main body; 2402 Display portion; 2403 Chassis; 2404 External connection port; 2405 Remote control receiving portion; 2406 Image receiving portion; 2407 Battery; 2408 Audio input portion; 2409 Operation key; 2700 Substrate; 2701 Pixel portion; 2702 Pixel; 2703 Scanning line side input terminal; 2704 Signal line side input terminal; 2800 TFT substrate; 2801 Protection circuit portion; 2804 Light emitting element; 2806a Spacer; 2807a Colored layer; 2809 Driver circuit; 2810 Wiring board; 2812 Heat sink; 2813 Heat pipe; 2820 Sealing substrate; 2900 Resin film; 2901 Resin; 3400 Pixel; 3601 Anti-reflective film; 3602 Polarizing plate; 3603 Wave plate; 3605 Insulating layer; 3700 Substrate; 3701 Pixel portion; 3702 Driver circuit; 3704 Tape; 3704a FPC; 3705 Driver IC; 3705a Driver IC; 4200 Switching TFT 4600 TFT substrate; 4601 Opposing substrate; 4602 Sealant; 4603 Pixel portion; 4604 Liquid crystal layer; 4605 Colored layer; 4606 Polarizing plate; 4608 External circuit; 4609 Flexible wiring board; 4610 Cold cathode fluorescent tube; 4611 Light guiding plate; 4612 Circuit board; 5100 Substrate; 5101 Base film; 5102a Insulating layer; 5102b Insulating layer; 5102c Insulating layer; 5103 Gate wiring layer; 5104 Capacitor wiring layer; 5105 Gate electrode layer; 5106 Semiconductor layer; 5107 N type semiconductor layer; 5108 Drain electrode layer; 5109 Source wiring layer; 5110 Conductive layer; 5111 Pixel electrode layer; 5116 Gate insulating layer; 5120 Insulating layer; 5130 Drain electrode layer; 5131 Insulating layer; 5132 Liquid crystal layer; 5133 Insulating layer; 5135 Conductive layer; 5136 Polarizing plate; 5140 Opposing substrate; 5141 Channel protective film; 5183 Head; 5184 Liquid crystal; 5186 Barrier layer; 5187 Sealant; 5219 Drain wiring layer; 5250 Gate electrode layer; 5251 Semiconductor layer, 5252 Insulating layer; 5253 Wiring layer; 5254 Common potential line; 5256 Signal wiring layer, 5260 TFT; 5261 Protection diode; 5262 Protection diode; 6200 Substrate; 6202 Pixel

The invention claimed is:

1. A thin film transistor comprising:
an insulating layer having a first opening;
a first conductive layer including one of silver or copper fitted in the first opening; and
a second conductive layer on and in contact with the insulating layer and the first conductive layer,
wherein the first conductive layer is thicker than the second conductive layer in a vertical direction, and
wherein a surface of the insulating layer and the first conductive layer is planarized and a uniform surface.

2. A thin film transistor comprising:
an insulating layer having a first opening;
a first conductive layer including one of silver or copper fitted in the first opening; and
a second conductive layer on and in contact with the insulating layer and the first conductive layer,
wherein the first conductive layer is thicker than the second conductive layer in a vertical direction,
wherein a surface of the insulating layer and the first conductive layer is planarized and a uniform surface, and
wherein the second conductive layer is formed by a droplet discharge method using a conductive material.

3. A display device comprising:
a first insulating layer having a first opening;
a first conductive layer including one of silver or copper fitted in the first opening;
a second conductive layer on and in contact with the first insulating layer and the first conductive layer;
a semiconductor layer over the second conductive layer with a gate insulating film therebetween;
a third conductive layer over the semiconductor layer;
a second insulating layer having a second opening over the third conductive layer; and
a fourth conductive layer fitted in the second opening,
wherein the first conductive layer is thicker than the second conductive layer in a vertical direction,
wherein a surface of the first insulating layer and the first conductive layer is planarized and a uniform surface, and
wherein the fourth conductive layer is thicker than the third conductive layer.

4. A display device comprising:
a first insulating layer having a first opening;
a first conductive layer including one of silver or copper fitted in the first opening;

a second conductive layer on and in contact with the first insulating layer and the first conductive layer;
a semiconductor layer over the second conductive layer with a gate insulating film therebetween;
a third conductive layer over the semiconductor layer;
a second insulating layer having a second opening over the third conductive layer; and
a fourth conductive layer fitted in the second opening,
wherein the first conductive layer is thicker than the second conductive layer in a vertical direction,
wherein a surface of the first insulating layer and the first conductive layer is planarized and a uniform surface,
wherein the fourth conductive layer is thicker than the third conductive layer, and
wherein each of the second conductive layer and the third conductive layer is formed by a droplet discharge method using a conductive material.

5. A display device comprising:
a first insulating layer having a first opening;
a first conductive layer including one of silver or copper fitted in the first opening;
a second conductive layer on and in contact with the first insulating layer and the first conductive layer;
a semiconductor layer over the second conductive layer with a gate insulating film therebetween;
a pair of third conductive layers over the semiconductor layer;
a first electrode over one of the pair of third conductive layers;
an electroluminescent layer over the first electrode; and
a second electrode over the electroluminescent layer,
wherein the first conductive layer is thicker than the second conductive layer in a vertical direction, and
wherein a surface of the first insulating layer and the first conductive layer is planarized and a uniform surface.

6. A display device comprising
a first insulating layer having a first opening;
a first conductive layer including one of silver or copper fitted in the first opening;
a second conductive layer on and in contact with the first insulating layer and the first conductive layer;
a semiconductor layer over the second conductive layer with a gate insulating film therebetween;
a pair of third conductive layers over the semiconductor layer;
a first electrode over one of the pair of third conductive layers;
an electroluminescent layer over the first electrode; and
a second electrode over the electroluminescent layer,
wherein the first conductive layer is thicker than the second conductive layer in a vertical direction,
wherein a surface of the first insulating layer and the first conductive layer is planarized and a uniform surface, and
wherein the second conductive layer is formed by a droplet discharge method using a conductive material.

7. A display device comprising:
a first insulating layer having a first opening;
a first conductive layer including one of silver or copper fitted in the first opening;
a second conductive layer on and in contact with the first insulating layer and the first conductive layer;
a semiconductor layer over the second conductive layer with a gate insulating film therebetween;
a pair of third conductive layers over the semiconductor layer;
a first electrode over one of the pair of third conductive layers;
a second insulating layer having a second opening over the other one of the pair of third conductive layers;
a fourth conductive layer fitted in the second opening;
an electroluminescent layer over the first electrode; and
a second electrode over the electroluminescent layer,
wherein the first conductive layer is thicker than the second conductive layer in a vertical direction,
wherein a surface of the first insulating layer and the first conductive layer is planarized and a uniform surface, and
wherein the fourth conductive layer is thicker than the pair of third conductive layers.

8. A display device comprising:
a first insulating layer having a first opening;
a first conductive layer including one of silver or copper fitted in the first opening;
a second conductive layer on and in contact with the first insulating layer and the first conductive layer;
a semiconductor layer over the second conductive layer with a gate insulating film therebetween;
a pair of third conductive layers over the semiconductor layer;
a first electrode over one of the pair of third conductive layers;
a second insulating layer having a second opening over the other one of the pair of third conductive layers;
a fourth conductive layer fitted in the second opening;
an electroluminescent layer over the first electrode; and
a second electrode over the electroluminescent layer,
wherein the first conductive layer is thicker than the second conductive layer in a vertical direction,
wherein a surface of the first insulating layer and the first conductive layer is planarized and a uniform surface,
wherein the fourth conductive layer is thicker than the pair of third conductive layers, and
wherein each of the second conductive layer and the pair of third conductive layers is formed by a droplet discharge method using a conductive material.

9. The thin film transistor or the display device according to any one of claims 1 to 8, wherein the thin film transistor or the display device further comprises a titanium oxide film below the first conductive layer.

10. The thin film transistor or the display device according to any one of claims 1 to 8, wherein the thin film transistor or the display device further comprises a film comprising at least one selected from the group consisting of W (tungsten), Al (aluminum), Ta (tantalum), Zr (zirconium), Hf (hafnium), Ir (iridium), Nb (niobium), Pd (lead), Pt (platinum), Mo (molybdenum), Rh (rhodium), Sc (scandium), Ti (titanium), V (vanadium), Cr (chromium), Mn (manganese), Fe (iron), Co (cobalt), Ni (nickel), Cu (copper), and Zn (zinc) below the first conductive layer.

11. The thin film transistor or the display device according to any one of claims 1 to 8, wherein the second conductive layer includes at least one of silver, gold, copper, and indium tin oxide.

12. The display device according to any one of claims 3 to 8, wherein the third conductive layer or the pair of third conductive layers includes at least one of silver, gold, copper, and indium tin oxide.

13. The thin film transistor or the display device according to any one of claims 1 to 8, wherein a width of the first opening is from 5 μm to 100 μm.

14. The display device according to any one of claims 3 to 8, wherein the semiconductor layer is an amorphous semiconductor layer including at least one of hydrogen and halogen.

15. The display device according to any one of claims 3 to 8, wherein the semiconductor layer is a semi-amorphous semiconductor layer including at least one of hydrogen and halogen.

16. The display device according to any one of claims 3 to 8, wherein the semiconductor layer is a polycrystalline semiconductor including at least one of hydrogen and halogen.

17. The display device according to any one of claims 3 to 8, wherein a channel length of the semiconductor layer is from 5 μM to 100 μm.

18. A television apparatus including the display device according to any one of claims 3 to 8 as a display screen.

19. A television apparatus including a display device with the thin film transistor according to claim 1 or 2 as a display screen.

20. The thin film transistor according to claim 1 or 2, wherein the insulating layer comprises an inorganic insulating material, a heat-resistant high molecular weight material, inorganic siloxane or an organosiloxane-based insulating material.

21. The display device according to any one of claims 3 to 8, wherein the first insulating layer comprises an inorganic insulating material, a heat-resistant high molecular weight material, inorganic siloxane or an organosiloxane-based insulating material.

22. The display device according to any one of claims 3, 4, 7 and 8, wherein the second insulating layer comprises an inorganic insulating material, a heat-resistant high molecular weight material, inorganic siloxane or an organosiloxane-based insulating material.

23. The thin film transistor according to claim 1 or 2, wherein the thin film transistor further comprises a silicon nitride film or nickel boron in contact with the first conductive layer.

24. The display device according to any one of claims 3 to 8, wherein the display device further comprises a silicon nitride film or nickel boron in contact with the first conductive layer.

* * * * *

UNITED STATES PATENT AND TRADEMARK OFFICE
CERTIFICATE OF CORRECTION

PATENT NO. : 8,742,421 B2  
APPLICATION NO. : 10/578001  
DATED : June 3, 2014  
INVENTOR(S) : Shunpei Yamazaki et al.

It is certified that error appears in the above-identified patent and that said Letters Patent is hereby corrected as shown below:

In the Specification:

Col. 3, line 31, "polyimideamide" should read --polyimide amide--

Col. 33, line 31, "formed, to be" should read --formed to be--

Col. 35, line 8, "source wiring layer," should read --source wiring layer--

Col. 35, line 45, "siliconoxynitride, aluminumoxide" should read --silicon oxynitride, aluminum oxide--

Col. 36, line 51, "embodiments mode" should read --embodiment mode--

Col. 38, line 58, "layer. 5106" should read --layer 5106--

Col. 45, line 59, "display, by" should read --display by--

In the Claims:

Claim 17, Col. 53, line 14, "5 μM to 100 μm." should read --5 μm to 100 μm.--

Signed and Sealed this
Twenty-seventh Day of January, 2015

Michelle K. Lee
*Deputy Director of the United States Patent and Trademark Office*